United States Patent
Kim et al.

(10) Patent No.: US 11,653,517 B2
(45) Date of Patent: May 16, 2023

(54) LIGHT-EMITTING DEVICE, METHOD OF MANUFACTURING THE SAME, AND APPARATUS INCLUDING LIGHT-EMITTING DEVICE

(71) Applicant: Samsung Display Co., Ltd., Yongin-si (KR)

(72) Inventors: Dongchan Kim, Yongin-si (KR); Jiyoung Moon, Yongin-si (KR); Heechang Yoon, Yongin-si (KR); Jihye Lee, Yongin-si (KR); Hakchoong Lee, Yongin-si (KR); Haemyeong Lee, Yongin-si (KR); Yoonhyeung Cho, Yongin-si (KR); Myungsuk Han, Yongin-si (KR); Jihwan Yoon, Yongin-si (KR); Jonghyuk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 206 days.

(21) Appl. No.: 17/033,772

(22) Filed: Sep. 26, 2020

(65) Prior Publication Data
US 2021/0210711 A1 Jul. 8, 2021

(30) Foreign Application Priority Data
Jan. 8, 2020 (KR) .................. 10-2020-0002688

(51) Int. Cl.
*H01L 51/50* (2006.01)
*H01L 51/56* (2006.01)
*H01L 27/32* (2006.01)

(52) U.S. Cl.
CPC ........ *H01L 51/5056* (2013.01); *H01L 27/322* (2013.01); *H01L 27/3244* (2013.01);
(Continued)

(58) Field of Classification Search
CPC combination set(s) only.
See application file for complete search history.

(56) References Cited

U.S. PATENT DOCUMENTS 6,025,857 A * 2/2000 Obata .................. G11C 11/23
399/136
6,893,744 B2 5/2005 Kim et al.
(Continued)

FOREIGN PATENT DOCUMENTS

EP 3229289 A1 10/2017
EP 3 182 478 B1 11/2018
(Continued)

OTHER PUBLICATIONS

Dongge, Ma et al., "Organic Semiconductor Heterojunctions and Its Application in Organic Light-Emitting Diodes", *Springer Series in Materials Science*, 2017, vol. 250, Berlin, Germany, pp. 89-126, 160pp.

*Primary Examiner* — Moin M Rahman
*Assistant Examiner* — Mohammad A Rahman
(74) *Attorney, Agent, or Firm* — Lewis Roca Rothgerber Christie LLP

(57) ABSTRACT

A light-emitting device includes a first electrode; a second electrode facing the first electrode; m emission units between the first electrode and the second electrode; and m−1 charge-generating unit(s) between adjacent ones of the emission units, where m is a natural number of 2 or more. The emission units each include an emission layer. At least one of the charge-generating unit(s) includes an n-type charge-generating layer and a p-type charge-generating layer; and the n-type charge-generating layer includes a first material and a second material. The first material includes an organic electron transport compound; and the second material includes at least one selected from an alkali metal, an alkali metal alloy, an alkaline earth metal, an alkaline earth
(Continued)

metal alloy, a lanthanide metal, and a lanthanide metal alloy. The light-emitting device may have improved hole and electron balance, a decreased driving voltage, and excellent efficiency and/or lifespan characteristics.

20 Claims, 2 Drawing Sheets

(52) U.S. Cl.
CPC ...... *H01L 51/5016* (2013.01); *H01L 51/5072* (2013.01); *H01L 51/5092* (2013.01); *H01L 51/5096* (2013.01); *H01L 51/56* (2013.01)

(56) References Cited

U.S. PATENT DOCUMENTS

| | | | |
|---|---|---|---|
| 7,736,754 | B2 | 6/2010 | Kijima et al. |
| 8,563,144 | B2 | 10/2013 | Kim et al. |
| 9,455,416 | B2 | 9/2016 | Diez et al. |
| 9,831,291 | B2 | 11/2017 | Heo et al. |
| 10,290,825 | B2 | 5/2019 | Lee et al. |
| 10,396,296 | B2 | 8/2019 | Ko |
| 10,680,195 | B2 | 6/2020 | Kim et al. |
| 2005/0009223 | A1 | 1/2005 | Ishizaki |
| 2006/0087225 | A1 | 4/2006 | Liao et al. |
| 2017/0263876 | A1 | 9/2017 | Kim et al. |
| 2017/0331039 | A1 | 11/2017 | Lim et al. |
| 2018/0205028 | A1 | 7/2018 | Scharner et al. |
| 2018/0269265 | A1* | 9/2018 | Kim ............... H01L 27/3209 |
| 2018/0375048 | A1 | 12/2018 | Kim et al. |
| 2019/0006589 | A1 | 1/2019 | Senkovskyy et al. |
| 2019/0027547 | A1* | 1/2019 | Kim ............... H01L 51/5281 |
| 2019/0058132 | A1 | 2/2019 | Yoo et al. |
| 2019/0288212 | A1 | 9/2019 | Cho et al. |

FOREIGN PATENT DOCUMENTS

| | | |
|---|---|---|
| EP | 3462516 A1 | 4/2019 |
| EP | 3709379 A1 | 9/2020 |
| EP | 3800682 A1 | 4/2021 |
| JP | 2003-168821 A | 6/2003 |
| JP | 2011-249349 A | 12/2011 |
| KR | 10-2013-0077555 A | 7/2013 |
| KR | 10-2014-0086803 A | 7/2014 |
| KR | 10-2016-0059563 A | 5/2016 |
| KR | 10-2017-0013268 A | 2/2017 |
| KR | 10-2017-0063054 A | 6/2017 |
| KR | 10-2017-0106564 | 9/2017 |
| KR | 10-2017-0131022 A | 11/2017 |
| KR | 10-2018-0007735 A | 1/2018 |
| KR | 10-2018-0058032 A | 5/2018 |
| KR | 10-2019-0000019 A | 1/2019 |
| KR | 10-2019-0019251 A | 2/2019 |
| KR | 10-2019-0108217 | 9/2019 |

* cited by examiner

LIGHT-EMITTING DEVICE, METHOD OF MANUFACTURING THE SAME, AND APPARATUS INCLUDING LIGHT-EMITTING DEVICE

CROSS-REFERENCE TO RELATED APPLICATION

This application claims priority to and the benefit of Korean Patent Application No. 10-2020-0002688, filed on Jan. 8, 2020, in the Korean Intellectual Property Office, the entire content of which is incorporated herein by reference.

BACKGROUND

1. Field

One or more aspects of embodiments of the present disclosure relate to a light-emitting device, a method of manufacturing the same, and an apparatus including the same.

2. Description of Related Art

Light-emitting devices convert electrical energy into light energy. Examples of such light-emitting devices include organic light-emitting devices using organic materials for an emission layer, quantum dot light-emitting devices using quantum dots for an emission layer, and/or the like.

In a light-emitting device, a first electrode may be disposed on a substrate, and a hole transport region, an emission layer, an electron transport region, and a second electrode may be sequentially formed on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may transition from an excited state to a ground state to thereby generate light.

SUMMARY

One or more aspects of embodiments of the present disclosure are directed toward tandem type light-emitting devices containing inorganic dopants in a charge-generating unit, and apparatuses including the same.

Additional aspects will be set forth in part in the description which follows and, in part, will be apparent from the description, or may be learned by practice of the presented embodiments of the disclosure.

One or more example embodiments of the present disclosure provide a light-emitting device including a first electrode, a second electrode facing the first electrode, m emission units between the first electrode and the second electrode (where m is a variable), and m−1 charge-generating unit(s) between adjacent ones of the emission units, wherein m is a natural number of 2 or more,
the emission units each include an emission layer,
at least one of the charge-generating unit(s) is an n-type charge-generating layer and a p-type charge-generating layer,
the n-type charge-generating layer includes a first material and a second material,
the first material includes an organic electron transport compound, and
the second material includes at least one selected from an alkali metal, an alloy of an alkali metal, an alkaline earth metal, an alloy of an alkaline earth metal, a lanthanide metal, and an alloy of a lanthanide metal.

One or more example embodiments of the present disclosure provide a method of manufacturing a light-emitting device including a first electrode, a second electrode facing the first electrode, m emission units between the first electrode and the second electrode, and m−1 charge-generating unit(s) between adjacent ones of the emission units, wherein m is a natural number of 2 or more,
the emission units each include an emission layer, and
at least one of the charge-generating unit(s) is an n-type charge-generating layer and a p-type charge-generating layer,
the method including: forming the n-type charge-generating layer including a first material and a second material,
wherein the first material includes an organic electron transport compound, and
the second material includes at least one selected from an alkali metal, an alloy of an alkali metal, an alkaline earth metal, an alloy of an alkaline earth metal, a lanthanide metal, and an alloy of a lanthanide metal.

One or more example embodiments of the present disclosure provide an apparatus including a thin-film transistor including a source electrode, a drain electrode, and an activation layer, wherein the first electrode of the light-emitting device is electrically connected to one of the source electrode and the drain electrode of the thin-film transistor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
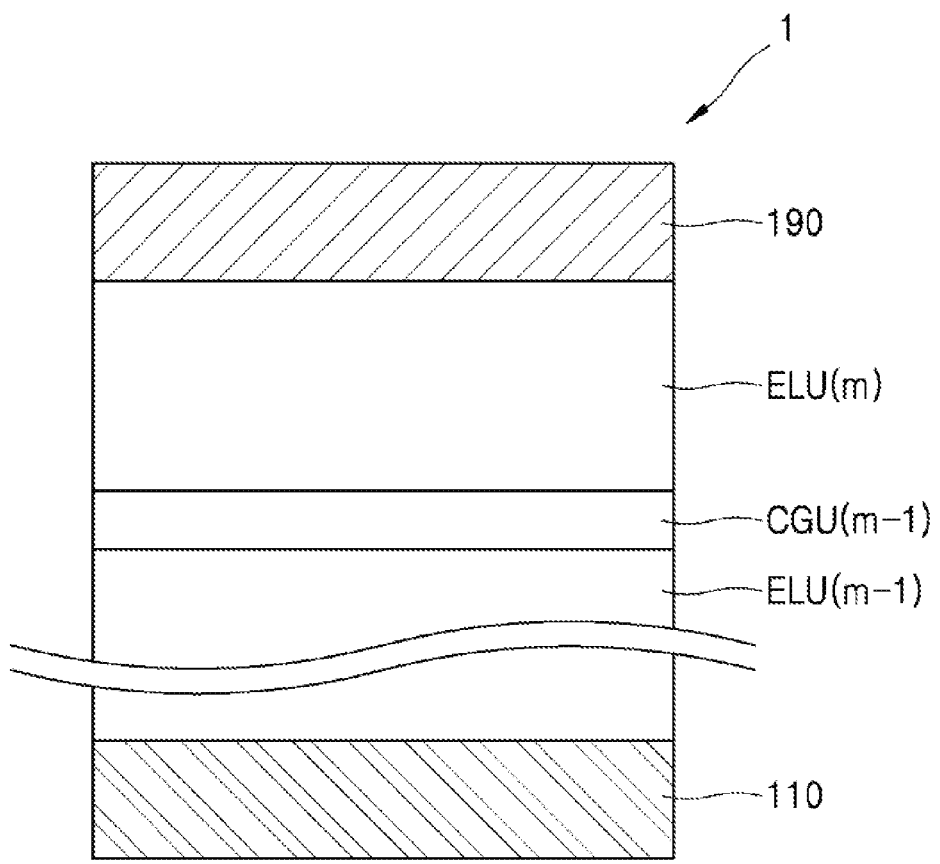
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

It will be understood that although the terms "first," "second," etc. may be used herein to describe various components, those components should not be limited by these terms. Rather, such terms are only used to distinguish one component from another.

As used herein, the singular forms "a," "an," and "the" are intended to include the plural forms as well, unless the context clearly indicates otherwise.

It will be further understood that the terms "includes," "including," "comprises," and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present. In contrast, when an element is referred to as being "directly on," "directly connected to," or "directly coupled to" another element, there are no intervening elements present.

Sizes of elements in the drawings may be exaggerated for convenience of explanation. In other words, because sizes and thicknesses of components in the drawings are arbitrarily illustrated for convenience of explanation, the following embodiments of the present disclosure are not limited thereto.

It will be understood that when a layer, region, or component is referred to as being "connected to" another layer, region, or component, the layer, region, or component may be directly connected to the another layer, region, or component, or indirectly connected to the another layer, region, or component as intervening layer, region, or component is present. For example, it will be understood that when a layer, region, or component is referred to as being "electrically connected to" another layer, region, or component, the layer, region, or component may be directly electrically connected to the another layer, region, or component, or indirectly electrically connected to the another layer, region, or component as intervening layer, region, or component is present.

As used herein, expressions such as "at least one of," "one of," and "selected from," when preceding a list of elements, modify the entire list of elements and do not modify the individual elements of the list.

The term "interlayer" as used herein may refer to a single layer and/or all (e.g., multiple) layers between a first electrode and a second electrode of a light-emitting device. A material included in the "interlayer" may be an organic material and/or an inorganic material.

The expression "(an interlayer) includes at least one compound represented by Formula 1" as used herein may include a case in which "(an interlayer) includes identical (e.g., a single) compounds represented by Formula 1" and a case in which "(an organic layer) includes two or more different compounds represented by Formula 1".

The term "Group" as used herein refers to an elemental group, as in the context of the IUPAC Periodic Table of Elements.

The term "alkali metal" as used herein refers to a Group 1 element. For example, an alkali metal may be lithium (Li), sodium (Na), potassium (K), rubidium (Rb), or cesium (Cs).

The term "alkaline earth metal" as used herein refers to a Group 2 element. For example, an alkaline earth metal may be magnesium (Mg), calcium (Ca), strontium (Sr), or barium (Ba).

The term "lanthanide metal" as used herein refers to lanthanum (La) and any element belonging to the lanthanide series in the Periodic Table of Elements. For example, a lanthanide metal may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or ruthenium (Lu).

The term "transition metal" as used herein refers to an element that belongs to Periods 4 to 7 and concurrently (e.g., simultaneously) to Groups 3 to 12 (e.g., a d-block metal). For example, a transition metal may be titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), or cadmium (Cd).

The term "post-transition metal" as used herein refers to a metal element that belongs to Periods 4 to 7 and concurrently (e.g., simultaneously) to Groups 13 to 17. For example, a post-transition metal may be aluminum (Al), gallium (Ga), indium (In), thallium (Tl), tin (Sn), lead (Pb), bismuth (Bi), or polonium (Po).

The term "halogen" as used herein refers to a Group 17 element. For example, a halogen may be fluorine (F), chlorine (Cl), bromine (Br), or iodine (I).

The term "organic semiconductor compound" as used herein refers to any organic compound having a band gap of 2.5 eV or more. In some embodiments, the organic semiconductor compound may have a lowest unoccupied molecular orbital (LUMO) energy level of about −4.5 eV to about −5.5 eV.

The term "inorganic semiconductor compound" as used herein refers to any inorganic compound having a band gap of less than about 4 eV. For example, an inorganic semiconductor compound may include a lanthanide metal halide, a transition metal halide, a post-transition metal halide, tellurium, a lanthanide metal telluride, a transition metal telluride, a post-transition metal telluride, a lanthanide metal selenide, a transition metal selenide, a post-transition metal selenide, or any combination thereof. For example, the inorganic semiconductor compound may include $EuI_2$, $YbI_2$, $SmI_2$, $TmI_2$, AgI, CuI, $NiI_2$, $CoI_2$, $BiI_3$, $BiCl_3$, $BiBr_3$, $BiF_3$, $PbI_2$, $SnI_2$, Te, EuTe, YbTe, SmTe, TmTe, EuSe, YbSe, SmSe, TmSe, ZnTe, CoTe, ZnSe, CoSe, $Bi_2Te_3$, $Bi_2Se_3$, or any combination thereof.

The term "inorganic insulation compound" as used herein refers to any inorganic compound having a band gap of 4 eV or more. For example, an inorganic insulation compound may include an alkali metal halide, an alkaline earth metal halide, a lanthanide metal halide, or any combination thereof. For example, the inorganic insulation compound may include NaI, KI, RbI, CsI, NaCl, KCl, RbCl, CsCl, NaF, KF, RbF, CsF, $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

The term "alkali metal halide" as used herein refers to a compound in which an alkali metal and a halogen are ionically bonded. For example, an alkali metal halide may include NaI, KI, RbI, CsI, NaCl, KCl, RbCl, CsCl, NaF, KF, RbF, CsF, or any combination thereof.

The term "alkaline earth metal halide" as used herein refers to a compound in which an alkali metal and halogen are ionically bonded. For example, an alkaline earth metal halide may include $MgI_2$, $CaI_2$, $SrI_2$, $BaI_2$, $MgCl_2$, $CaCl_2$, $SrCl_2$, $BaCl_2$, $MgF_2$, $CaF_2$, $SrF_2$, $BaF_2$, or any combination thereof.

The term "lanthanide metal halide" as used herein refers to a compound in which a lanthanide metal and a halogen are ionically bonded and/or covalently bonded. For example, a lanthanide metal halide may include $EuI_2$, $YbI_2$, $SmI_2$, $TmI_2$, $EuI_3$, $YbI_3$, $SmI_3$, $TmI_3$, $EuCl_3$, $YbCl_3$, $SmCl_3$, $TmCl_3$, $EuF_3$, $YbF_3$, $SmF_3$, $TmF_3$, or any combination thereof.

The term "transition metal halide" as used herein refers to a compound in which a transition metal and halogen are ionically bonded and/or covalently bonded. For example, a transition metal halide may include AgI, CuI, $NiI_2$, $CoI_2$, or any combination thereof.

The term "post-transition metal" halide as used herein refers to a compound in which a post-transition metal and a halogen are ionically bonded and/or covalently bonded. For example, a post-transition metal halide may include $BiI_3$, $BiCl_3$, $BiBr_3$, $BiF_3$, $PbI_2$, $SnI_2$, or any combination thereof.

The term "lanthanide metal telluride" as used herein refers to a compound in which a lanthanide metal and tellurium (Te) are ionically bonded, covalently bonded, and/or metallically bonded. For example, a telluride of a lanthanide metal may include EuTe, YbTe, SmTe, TmTe, or any combination thereof.

The term "transition metal telluride" as used herein refers to a compound in which a transition metal and tellurium are ionically bonded, covalently bonded, and/or metallically bonded. For example, a transition metal telluride may include ZnTe, CoTe, or any combination thereof.

The term "post-transition metal telluride" as used herein refers to a compound in which a post-transition metal and tellurium are ionically bonded, covalently bonded, and/or metallically bonded. For example, a post-transition metal telluride may include $Bi_2Te_3$.

The term "lanthanide metal selenide" as used herein refers to a compound in which a lanthanide metal and selenium (Se) are ionically bonded, covalently bonded, and/or metallically bonded. For example, a lanthanide metal selenide may include EuSe, YbSe, SmSe, TmSe, or any combination thereof.

The term "transition metal selenide" as used herein refers to a compound in which a transition metal and selenium are ionically bonded, covalently bonded, and/or metallically bonded. For example, a transition metal selenide may include ZnSe, CoSe, or any combination thereof.

The term "post-transition metal selenide" as used herein refers to a compound in which a post-transition metal and selenium are ionically bonded, covalently bonded, and/or metallically bonded. For example, a post-transition metal may include $Bi_2Se_3$.

[Description of FIG. 1]

FIG. 1 is a schematic cross-sectional view of a light-emitting device according to an embodiment.

Referring to FIG. 1, a light-emitting device 1 according to an embodiment of the present disclosure includes: a first electrode 110; a second electrode 190 facing the first electrode 110; m emission units between the first electrode 110 and the second electrode 190; and m−1 charge-generating unit(s) between adjacent ones of the emission units, wherein m is a natural number of 2 or more, the emission units each include an emission layer, and at least one of the charge-generating unit(s) may include an n-type charge-generating layer and a p-type charge-generating layer.

Hereinafter, the structure of the light-emitting device 1 according to an embodiment and a method of manufacturing the light-emitting device 1 will be described in connection with FIG. 1.

[First Electrode]

In FIG. 1, a substrate may be additionally disposed under the first electrode 110 or above the second electrode 190. The substrate may be a glass substrate and/or a plastic substrate, each having excellent mechanical strength, thermal stability, transparency, surface smoothness, ease of handling, and/or water resistance.

The first electrode 110 may be formed by depositing and/or sputtering a material for forming the first electrode 110 on the substrate. When the first electrode 110 is an anode, the material for a first electrode may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

[Emission Unit]

m emission units (where m is a variable) are located on the first electrode 110.

Among the m emission units, the emission unit closest to the first electrode 110 may be termed a first emission unit, the emission unit farthest from the first electrode 110 may be termed an $m^{th}$ emission unit, and the first emission unit through the $m^{th}$ emission unit are sequentially disposed. For example, an $m-1^{th}$ emission unit may be located between the first electrode 110 and the $m^{th}$ emission unit.

In some embodiments, the emission units may each further include an electron transport region and/or a hole transport region.

The plurality of hole transport regions may each include a hole injection layer, a hole transport layer, an electron blocking layer, or any combination thereof, and the plurality of electron transport regions may each include a hole blocking layer, an electron transport layer, an electron injection layer, or any combination thereof.

According to an embodiment, the first electrode 110 may be an anode, the second electrode 190 may be a cathode, an $m^{th}$ emission unit is between the first electrode 110 and the second electrode 190, an $m-1^{th}$ emission unit is between the first electrode 110 and the $m^{th}$ emission unit, and an $m-1^{th}$ charge-generating unit may be between the $m^{th}$ emission unit and the $m-1^{th}$ emission unit. The $m^{th}$ emission unit may include an $m^{th}$ emission layer, the $m-1^{th}$ emission unit may include an $m-1^{th}$ emission layer, an $m-1^{th}$ hole transport region may further be located between the first electrode 110 and the $m-1^{th}$ emission layer, an $m-1^{th}$ electron transport region may further be located between the $m-1^{th}$ emission layer and the $m-1^{th}$ charge-generating unit, an $m^{th}$ hole transport region may further be located between the $m-1^{th}$ charge-generating unit and the $m^{th}$ emission layer, and an $m^{th}$ electron transport region may further be located between the $m^{th}$ emission layer and the second electrode 190. The m hole transport regions may each include a hole injection layer, a hole transport layer, an electron blocking layer, or any combination thereof, and the m electron transport regions may each include a hole blocking layer, an electron transport layer, an electron injection layer, or any combination thereof.

[Hole Injection Layer in Hole Transport Region]

The light-emitting device 1 may include a hole injection layer directly contacting the first electrode 110 or the $m-1^{th}$ charge-generating unit.

The hole injection layer may include a sixth material and a seventh material, and the sixth material and the seventh material may be different from each other.

For example, the sixth material may include a lanthanide metal halide, a transition metal halide, a post-transition metal halide, tellurium, a lanthanide metal telluride, a transition metal telluride, a post-transition metal telluride, a lanthanide metal selenide, a transition metal selenide, a post-transition metal selenide, or any combination thereof.

For example, the seventh material may include an organic hole transport compound, an alkali metal halide, an alkaline earth metal halide, a lanthanide metal halide, or any combination thereof.

In some embodiments, in the hole injection layer, the seventh material may have a volume greater than or equal to that of the sixth material.

In more detail, in the hole injection layer, the sixth material may have a volume of 50% or less.

For example, the seventh material may include at least one selected from organic hole transport compounds, and a volume ratio of the sixth material to the seventh material may be about 1:99 to about 20:80.

In some embodiments, the seventh material may include an alkali metal halide, an alkaline earth metal halide, a lanthanide metal halide, or any combination thereof, and a volume ratio of the sixth material to the seventh material may be about 1:99 to about 50:50.

The term "organic hole transport compound" as used herein refers to any organic material having hole transportability. In one embodiment, the organic hole transport compound may include at least one selected from m-MTDATA, TDATA, 2-TNATA, NPB(NPD), β-NPB, TPD, spiro-TPD, spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201, and a compound represented by Formula 202:

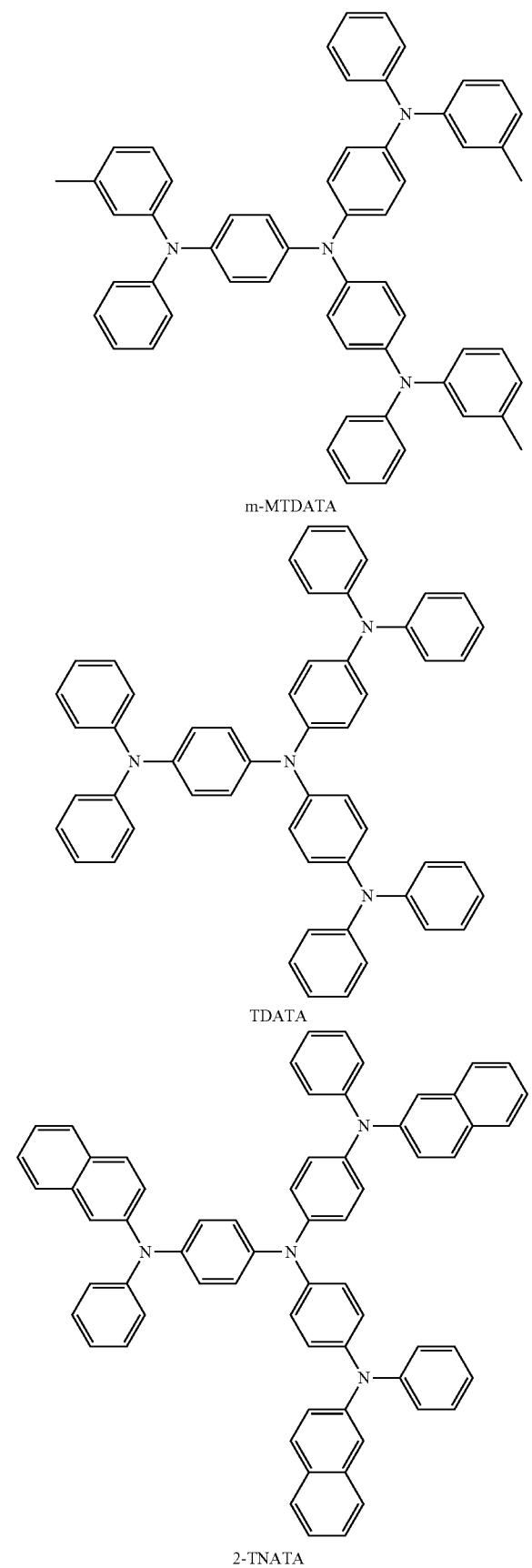

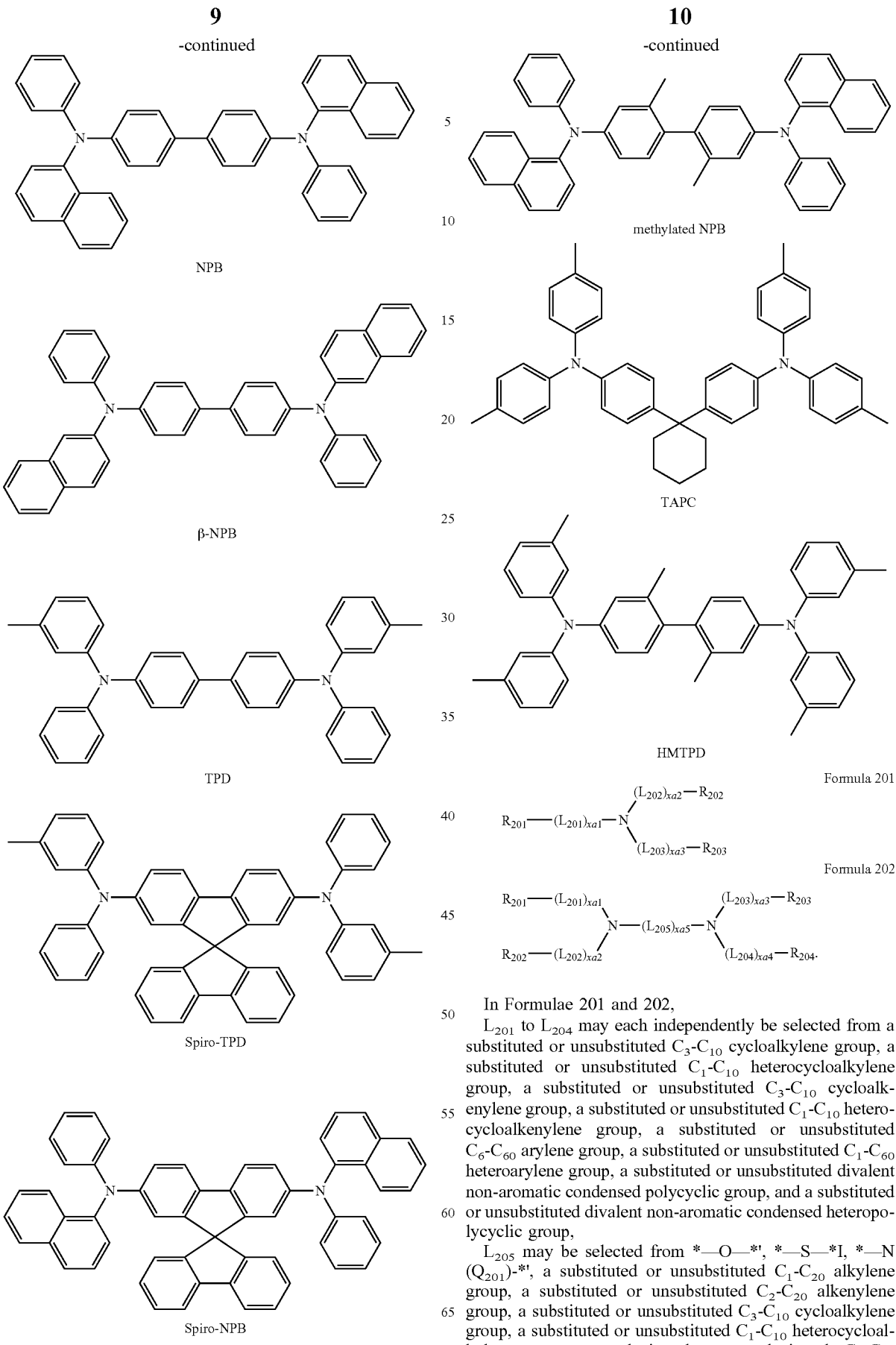

In Formulae 201 and 202,

L$_{201}$ to L$_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, L$_{205}$ may be selected from *—O—*', *—S—*', *—N (Q$_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$) and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$) and —N($Q_{31}$)($Q_{32}$), wherein $Q_{31}$ to $Q_{33}$ may each independently be the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may each independently be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, the compound represented by Formula 201 may be represented by Formula 201A:

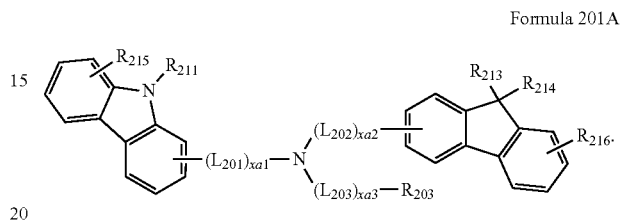

Formula 201A

In one or more embodiments, the compound represented by Formula 201 may be represented by Formula 201A(1), but embodiments of the present disclosure are not limited thereto:

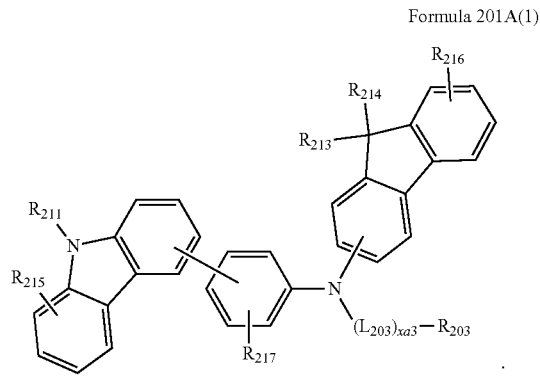

Formula 201A(1)

In one or more embodiments, the compound represented by Formula 201 may be represented by Formula 201A-1, but embodiments of the present disclosure are not limited thereto:

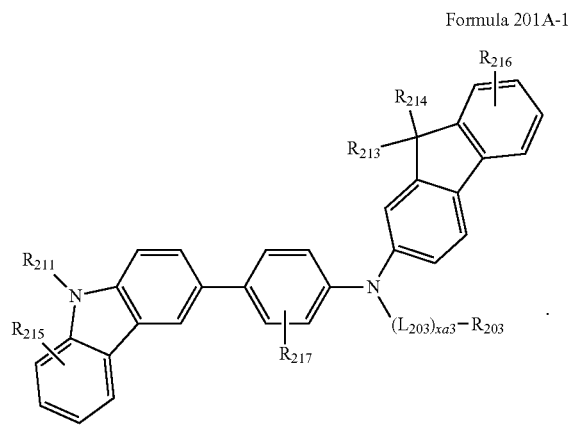

Formula 201A-1

In one or more embodiments, the compound represented by Formula 202 may be represented by Formula 202A:

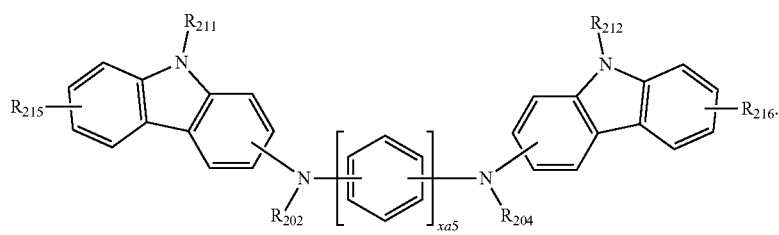

Formula 202A

In one or more embodiments, the compound represented by Formula 202 may be represented by Formula 202A-1:

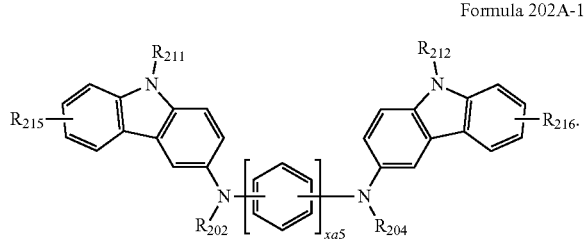

Formula 202A-1

In Formulae 201A, 201A(1), 201A-1, 202A, and 202A-1, $L_{201}$ to $L_{203}$, xa1 to xa3, xa5, and $R_{202}$ to $R_{204}$ may each independently be the same as described above, $R_{211}$ and $R_{212}$ may each independently be the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from compounds HT1 to HT39, but compounds included in the hole transport region are not limited thereto:

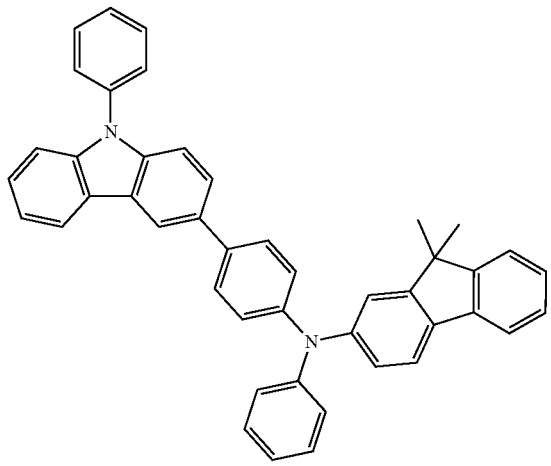

HT1

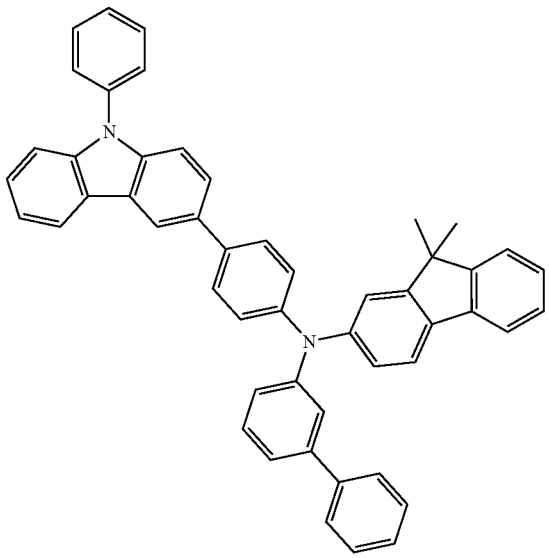

HT2

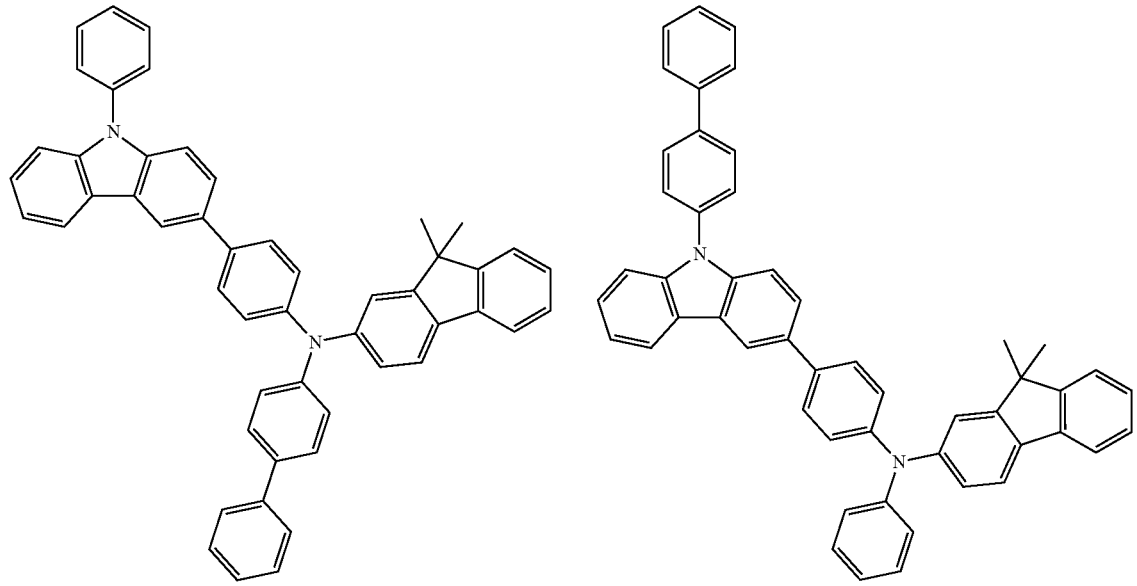
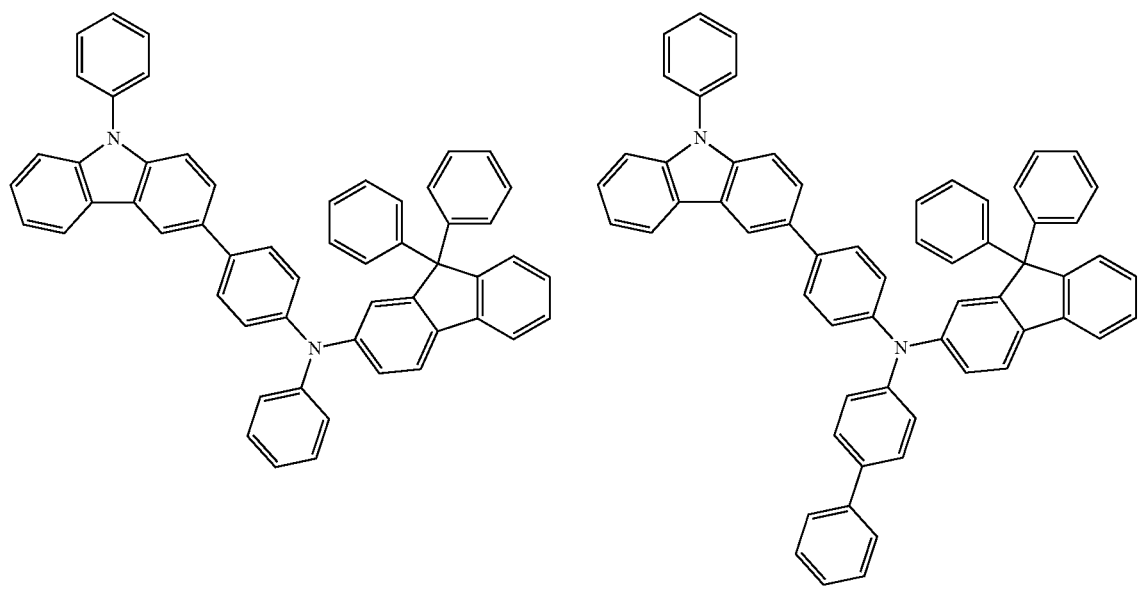

-continued
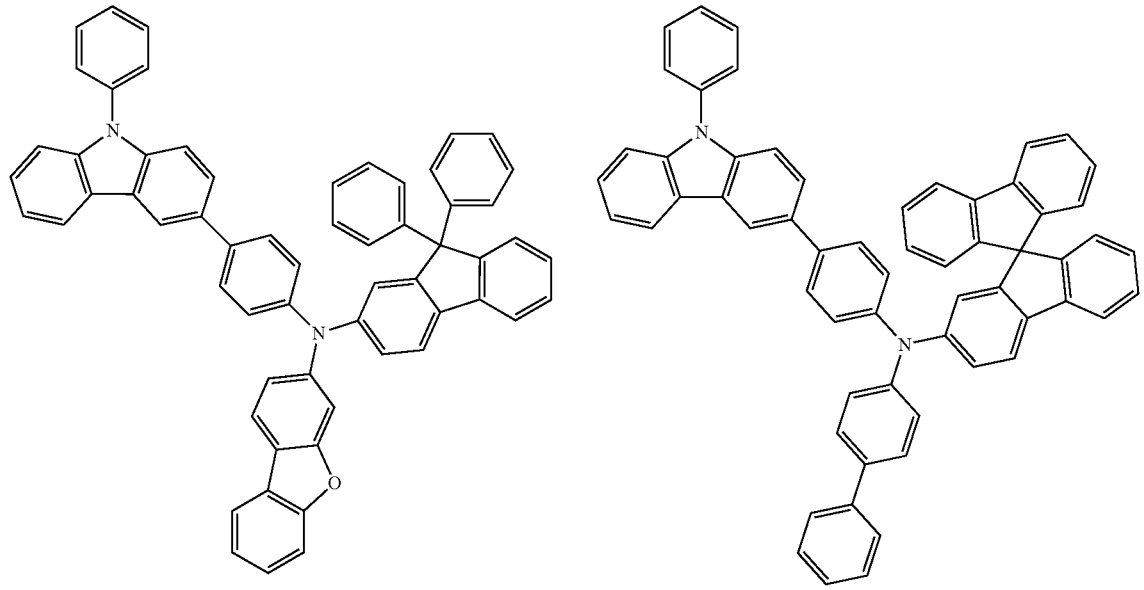
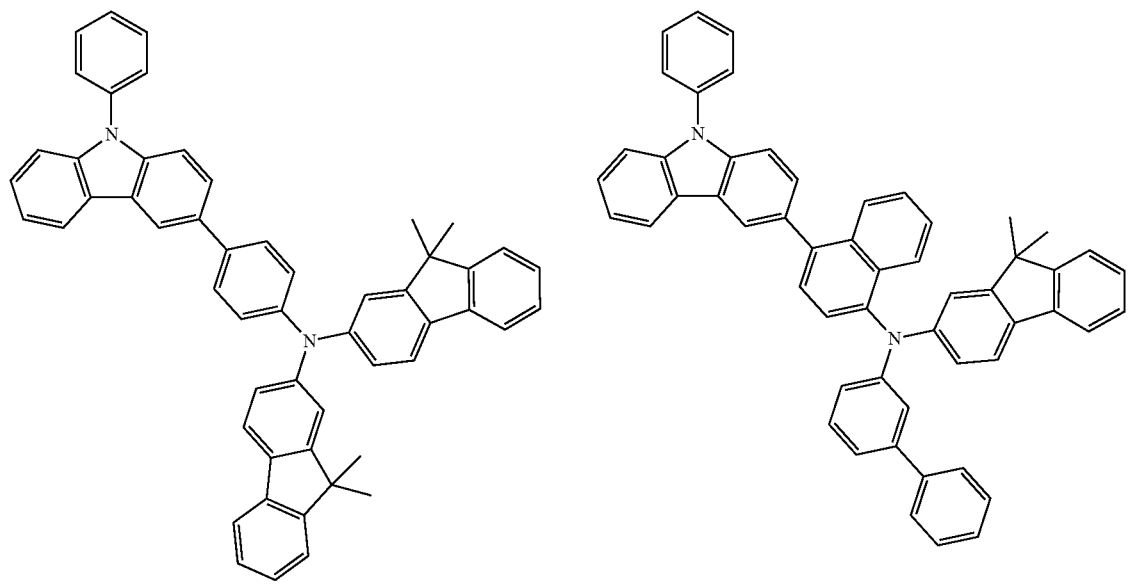

-continued
HT11
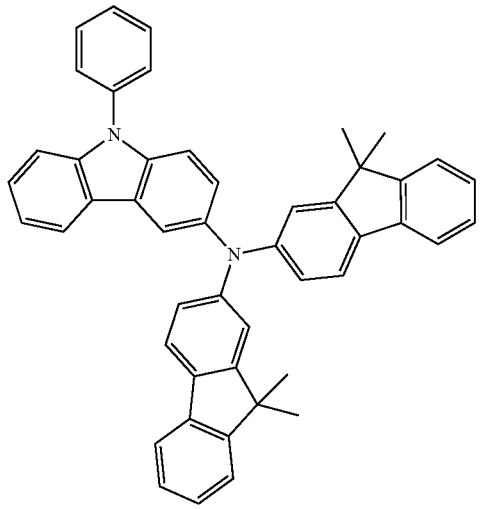
HT12
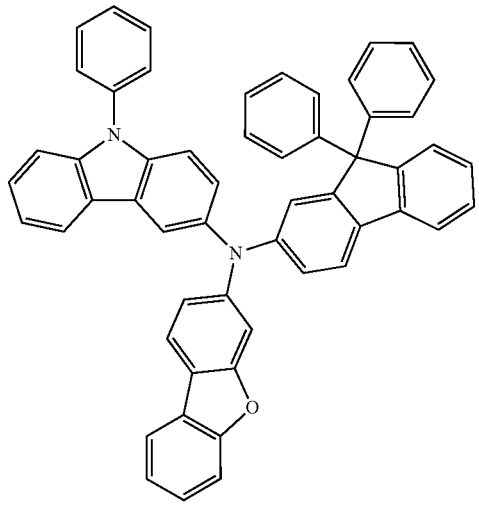
HT13
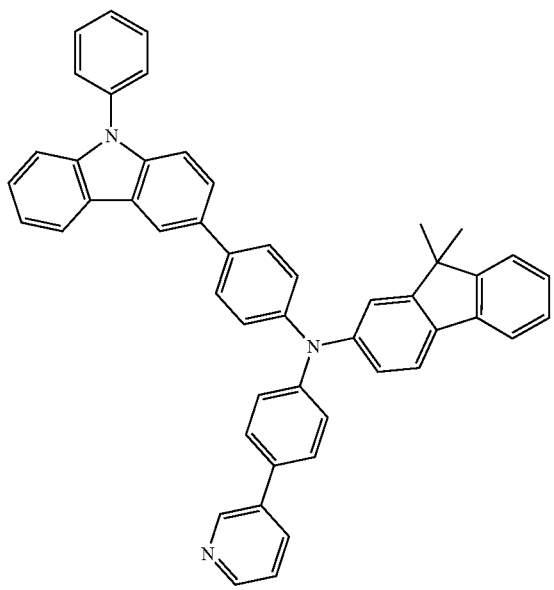
HT14
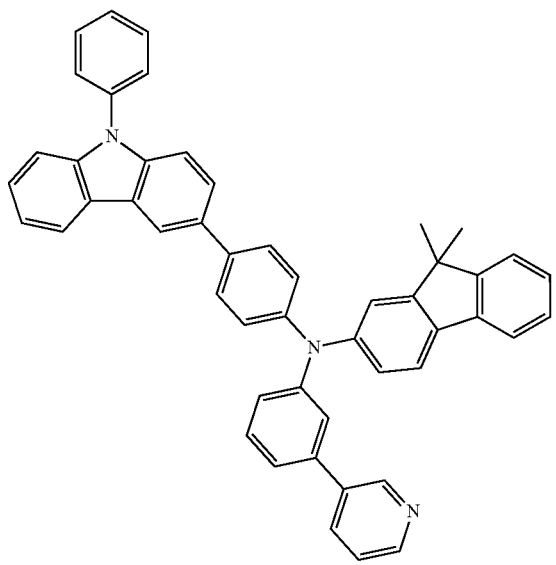
HT15
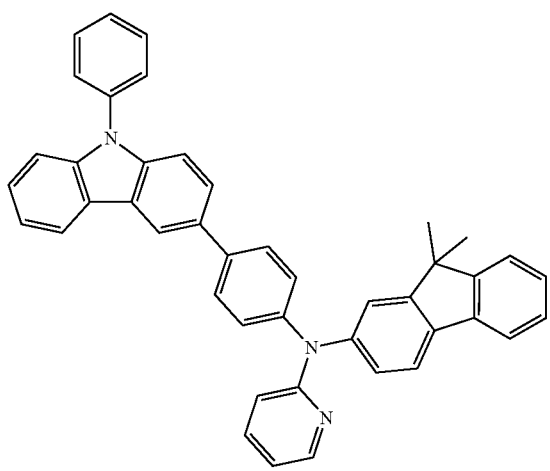
HT16
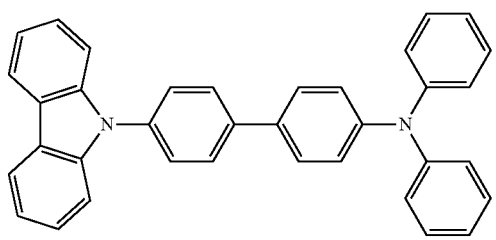

-continued
HT17
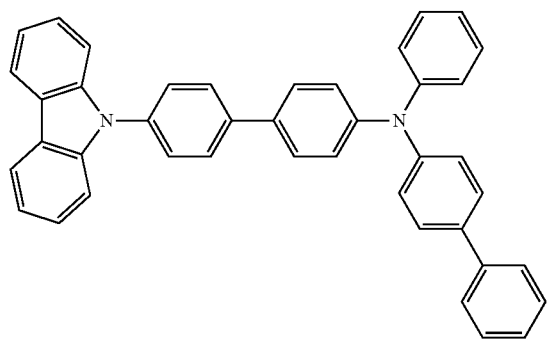
HT18
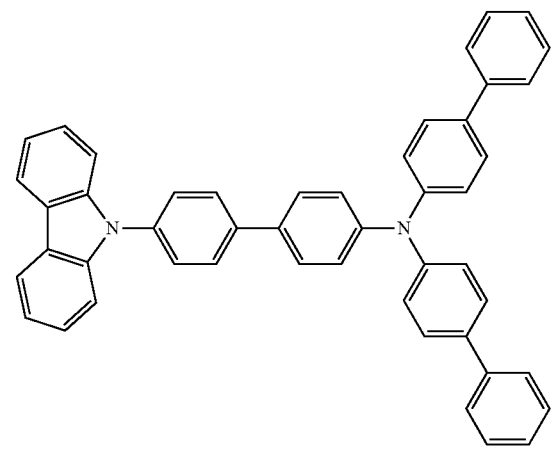
HT19
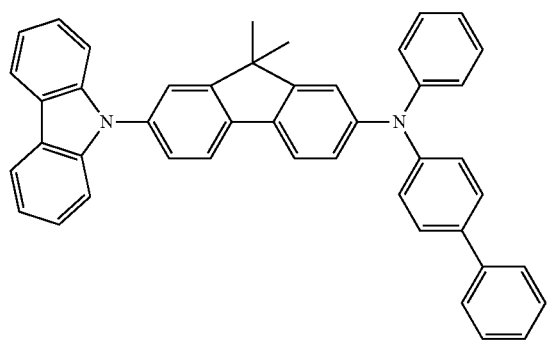
HT20
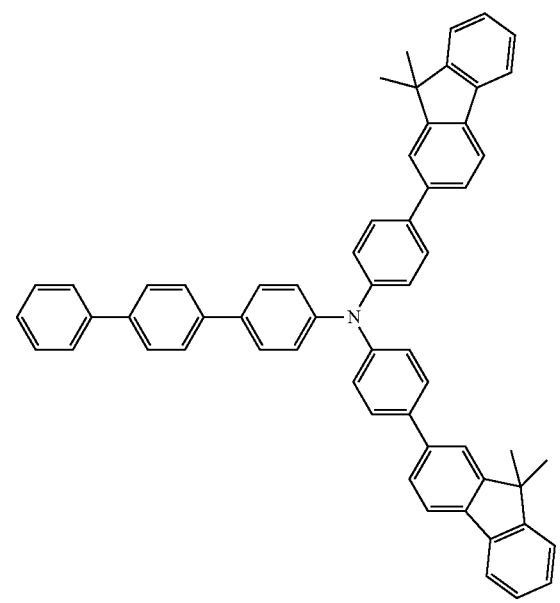

-continued
HT21
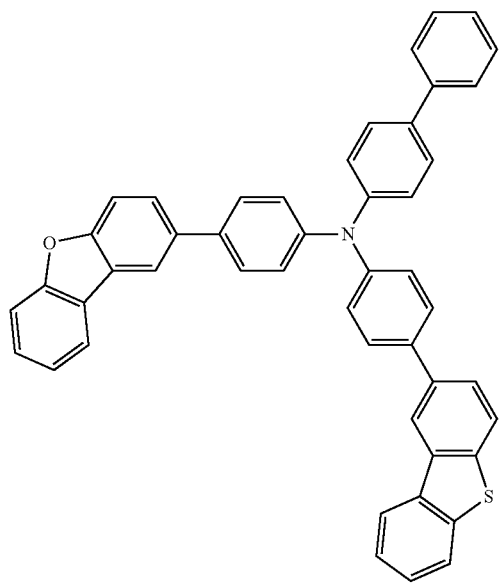
HT22
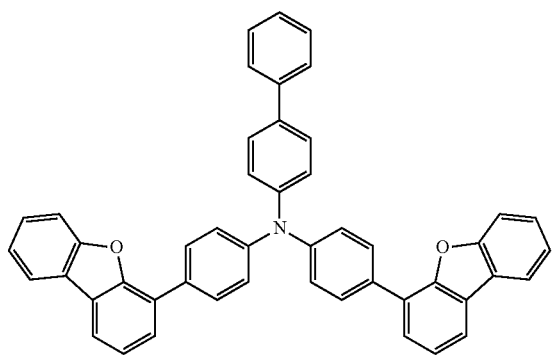
HT23
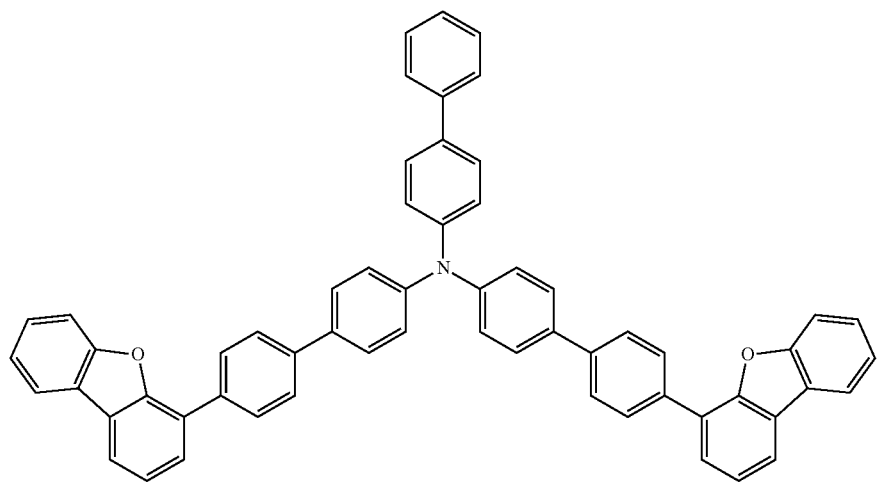
HT24
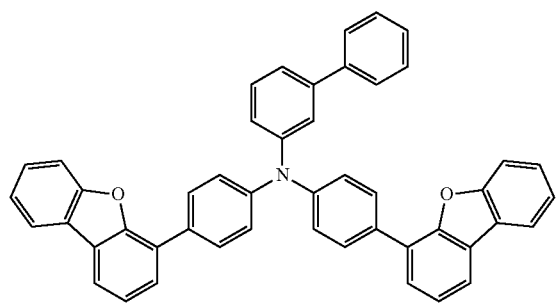
HT25
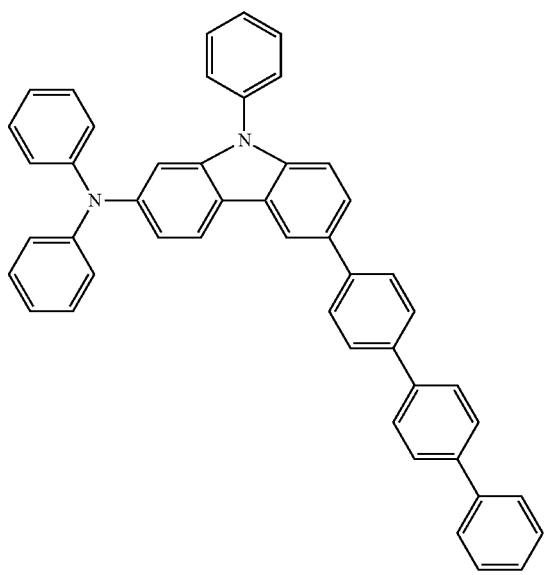

-continued
HT26
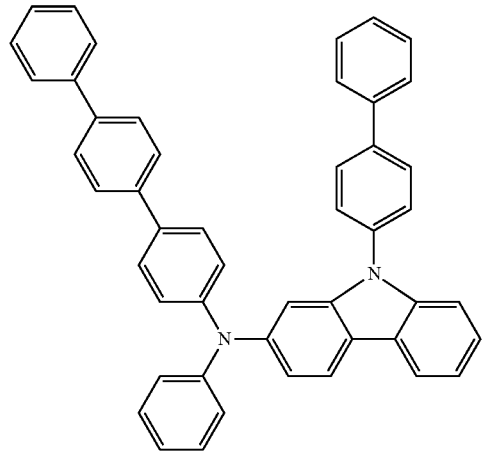
HT27
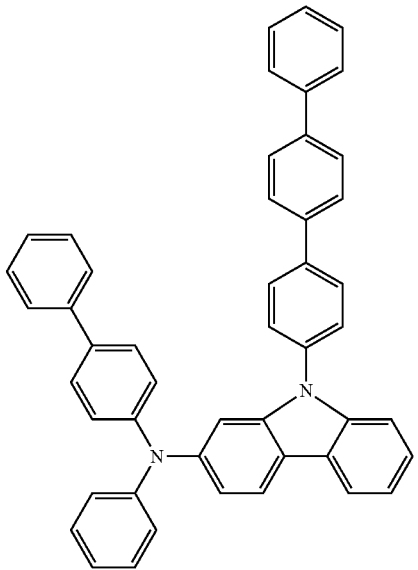
HT28
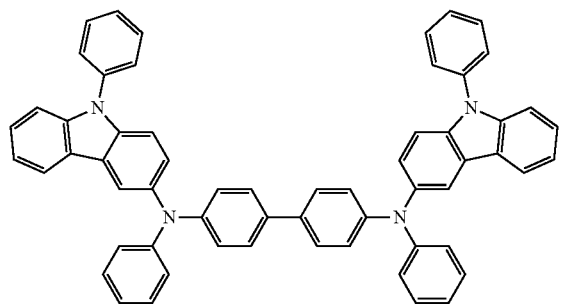
HT29
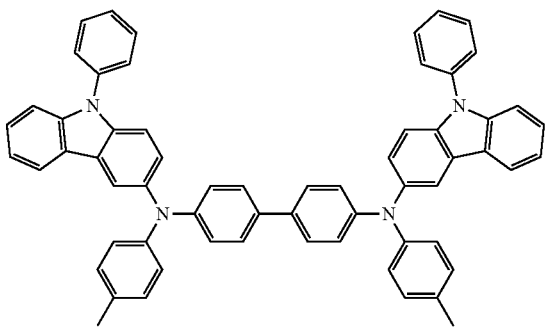
HT30
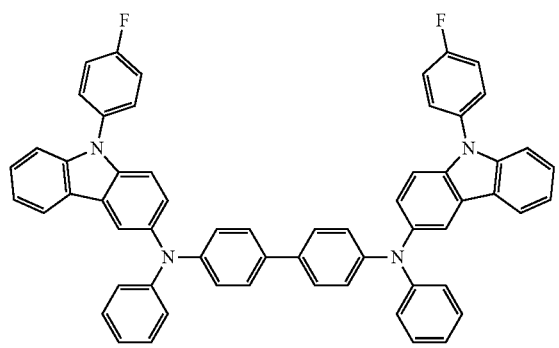
HT31
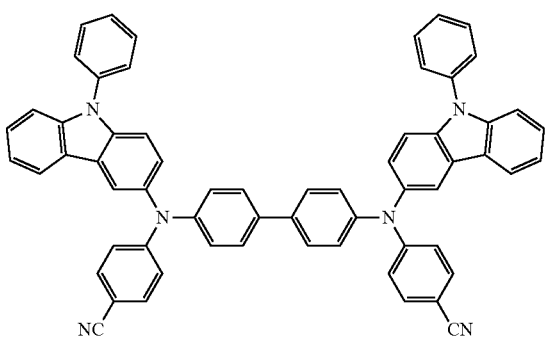

-continued
HT32
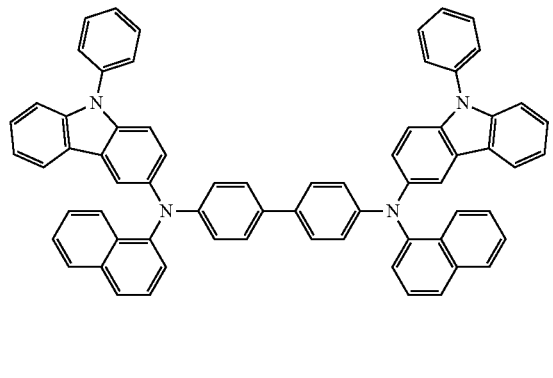
HT33
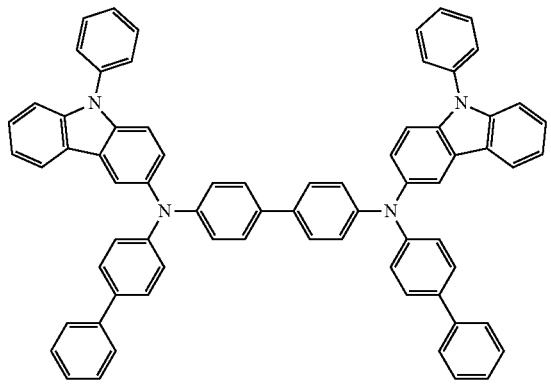
HT34
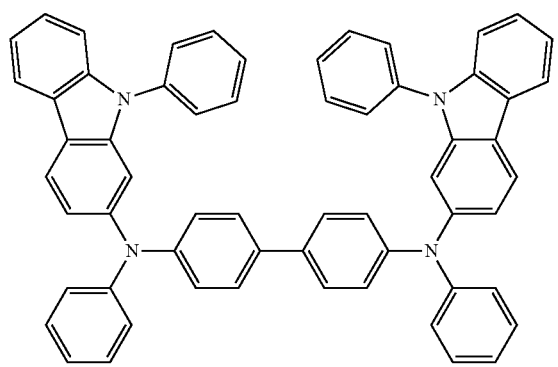
HT35
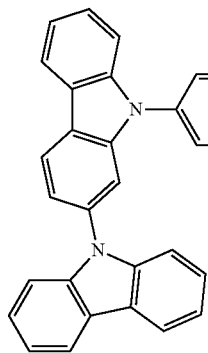
HT36
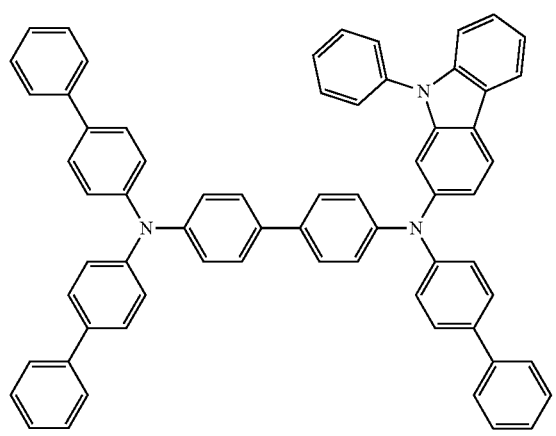
HT37
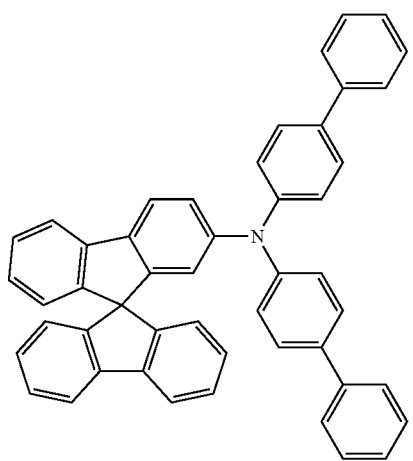

HT38

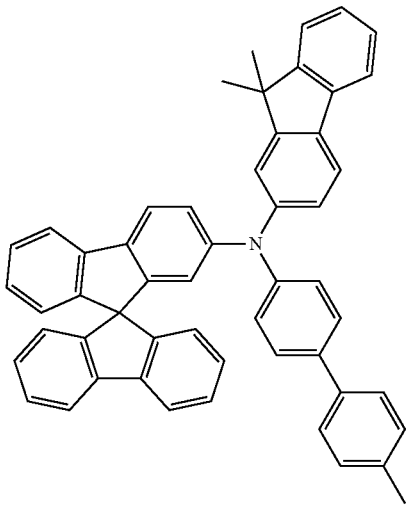

HT39

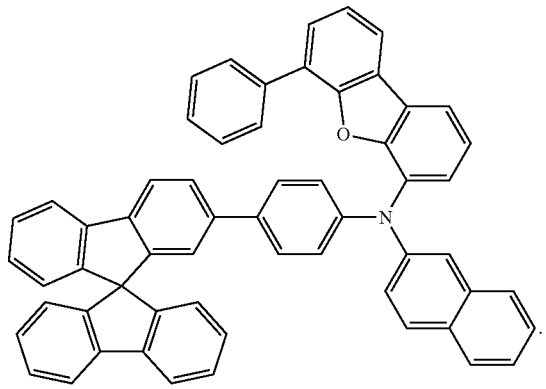

A thickness of the hole injection layer may be about 0.1 nm to about 20 nm. When the thickness of the hole injection layer is within this range, satisfactory hole injection characteristics may be obtained without a substantial increase in driving voltage.

In one embodiment, the hole injection layer may include the same material as a p-type charge-generating layer (which will be described later).

[Hole Transport Layer in Hole Transport Region]

The light-emitting device 1 may include a hole transport layer directly contacting the emission layer.

The hole transport layer may include a tenth material, and the tenth material may include at least one selected from organic hole transport compounds.

In one embodiment, the hole transport layer may further include a eleventh material different from the tenth material, and the eleventh material may include an alkali metal halide, an alkaline earth metal halide, a lanthanide metal halide, or any combination thereof.

In the hole transport layer, the tenth material may have a volume greater than or equal to that of the eleventh material. For example, in the hole transport layer, a volume ratio of the tenth material to the eleventh material may be about 99:1 to about 50:50.

A thickness of the hole transport layer may be about 0.1 nm to about 10 nm. When the thickness of the hole transport layer is within the range, satisfactory hole transport characteristics may be obtained without a substantial increase in driving voltage.

[Charge-Generation Material in Hole Transport Region]

The hole transport region may further include, in addition to these materials, a charge-generation material for improvement of conductive properties. The charge-generation material may be homogeneously or non-homogeneously dispersed in the hole transport region.

The charge-generation material may be, for example, a p-dopant.

In one embodiment, the p-dopant may have a LUMO energy level of −3.5 eV or less.

In one embodiment, the p-dopant may be selected from an organic p-dopant and an inorganic p-dopant. For example, the p-dopant may include at least one selected from: an organic p-dopant (such as a quinone derivative and/or a cyano group-containing compound); and an inorganic p-dopant (such as a metal oxide and/or an inorganic semiconductor compound), but embodiments of the present disclosure are not limited thereto.

For example, the p-dopant may include at least one selected from: a quinone derivative (such as tetracyanoquinodimethane (TCNQ) and/or 2,3,5,6-tetrafluoro-7,7,8,8-tetracyanoquinodimethane (F4-TCNQ));

1,4,5,8,9,11-hexaazatriphenylene-hexacarbonitrile (HAT-CN);

a compound represented by Formula 221;

a metal oxide (such as a tungsten oxide and/or a molybdenum oxide); and an inorganic semiconductor compound (such as a metal halide, for example, CuI, $BiI_3$, $BiCl_3$, $BiBr_3$, $BiF_3$, etc.), a metalloid (for example, Te, etc.), and a metalloid-containing compound (for example ZnTe, etc.), but embodiments of the present disclosure are not limited thereto:

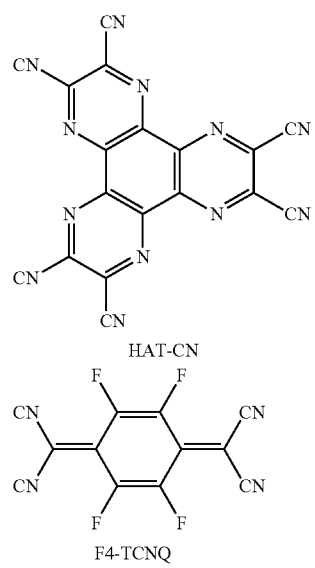

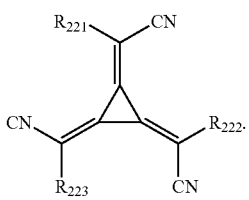

Formula 221

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with Br, and a $C_1$-$C_{20}$ alkyl group substituted with —I.

[Emission Layer]

The emission units each include an emission layer. For example, one emission unit may include one emission layer.

The emission layers may be to emit different colors of light from each other, or may be to emit the same color of light. For example, each of the plurality of the emission layers may be to emit blue light, but embodiments of the present disclosure are not limited thereto.

The emission layer may include at least one selected from an organic compound and a semiconductor compound, but compounds to be included in the emission layer are not limited thereto. When the emission layer includes an organic compound, the light-emitting device 1 may be referred to as an organic light-emitting device.

In some embodiments, the organic compound may include a host and a dopant.

In some embodiments, the semiconductor compound may be a quantum dot and, the light-emitting device 1 may be a quantum dot light-emitting device.

In some embodiments, the semiconductor compound may be an organic perovskite and/or an inorganic perovskite.

A thickness of the emission layer may be about 0.1 nm to about 100 nm. For example, a thickness of the emission layer may be about 15 nm to about 50 nm. In some embodiments, when the emission layer is to emit blue light, a thickness of the emission layer may be about 15 nm to about 20 nm; when the emission layer is to emit green light, a thickness of the emission layer may be about 20 nm to about 40 nm, and when the emission layer is to emit red light, a thickness of the emission layer may be about 40 nm to about 50 nm. When the thickness of the emission layer is within these ranges, the light-emitting device 1 may have excellent light-emission characteristics without a substantial increase in driving voltage.

The emission layer of the organic light-emitting device may include a host and a dopant. The dopant may include a phosphorescent dopant, a fluorescent dopant, a delayed fluorescence dopant, or any combination thereof.

An amount of a dopant in the emission layer may be, based on about 100 parts by weight of the host, about 0.01 parts by weight to about 15 parts by weight, but embodiments of the present disclosure are not limited thereto.

In one or more embodiments, the host may include a compound represented by Formula 301.

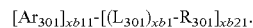

Formula 301

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is 2 or more, the two or more $Ar_{301}$(s) may be linked via a single bond.

In one or more embodiments, the compound represented by Formula 301 may be represented by Formula 301-1 or 301-2:

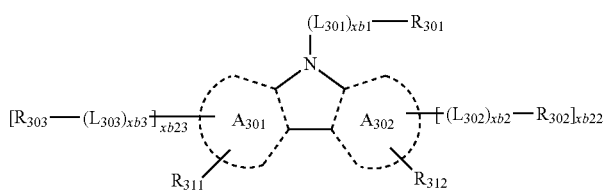

Formula 301-1

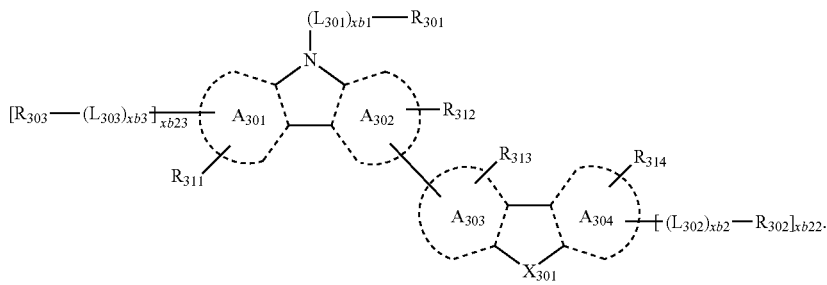

Formula 301-2

In Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ may each independently be the same as described above, $L_{302}$ to $L_{304}$ may each independently be the same as described in connection with $L_{301}$, xb2 to xb4 may each independently be the same as described in connection with xb1, and $R_{302}$ to $R_{304}$ may each independently be the same as described in connection with $R_{301}$.

For example, $L_{301}$ to $L_{304}$ in Formulae 301, 301-1, and 301-2 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be the same as described above.

In one embodiment, $R_{301}$ to $R_{304}$ in Formulae 301, 301-1, and 301-2 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and wherein $Q_{31}$ to $Q_{33}$ may each independently be the same as described above.

In one or more embodiments, the host may include an alkaline earth-metal complex. For example, the host may be selected from a Be complex (for example, Compound H55) and an Mg complex. In some embodiments, the host may include a Zn complex.

The host may include at least one selected from 9,10-di (2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and at least one selected from Compounds H1 to H55, but embodiments of the present disclosure are not limited thereto:

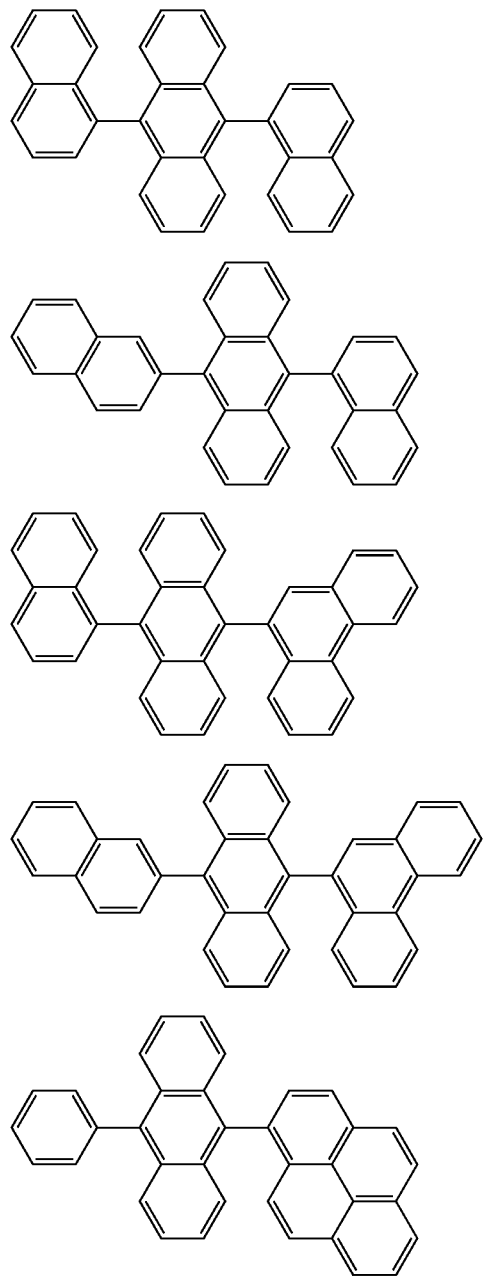

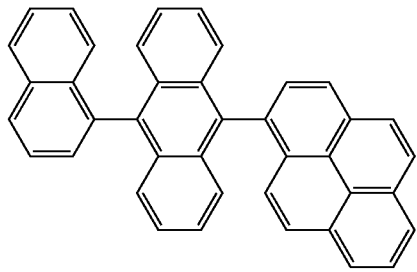

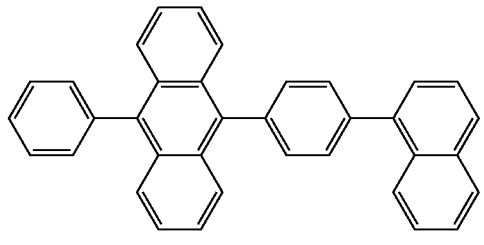

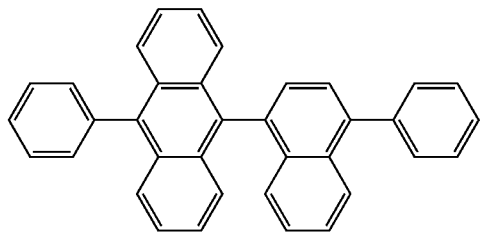

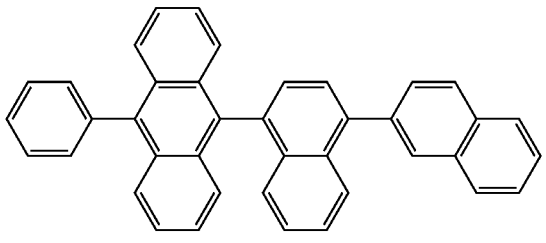

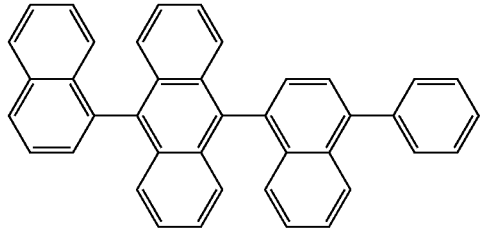

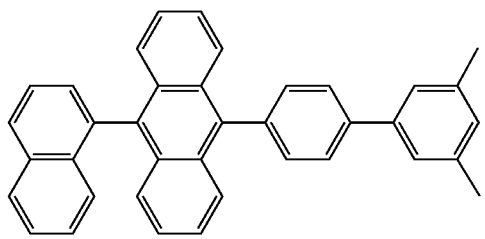

H12
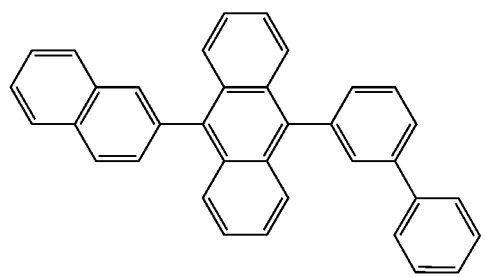
H13
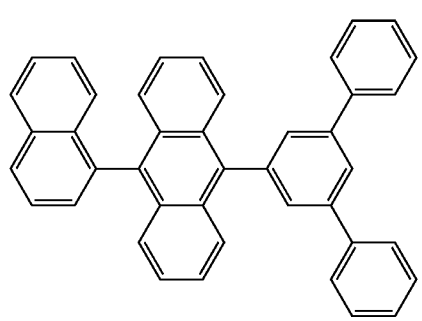
H14
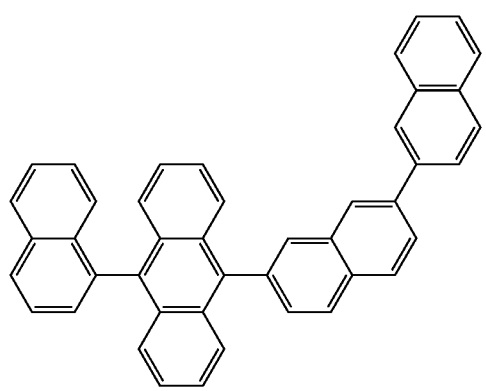
H15
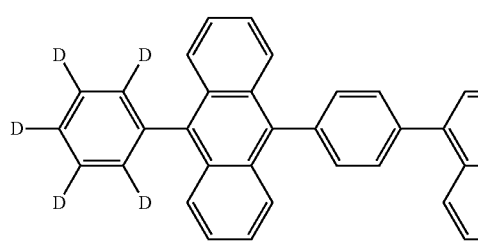
H16
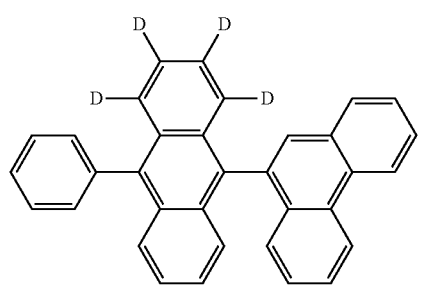
H17
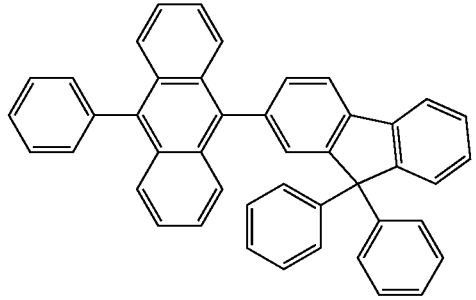
H18
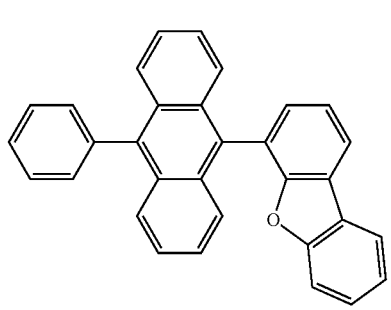
H19
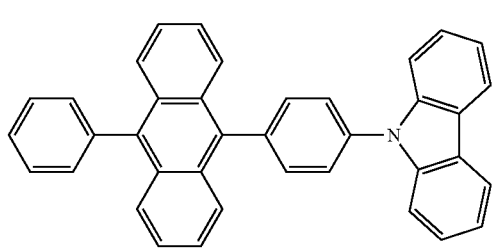
H20
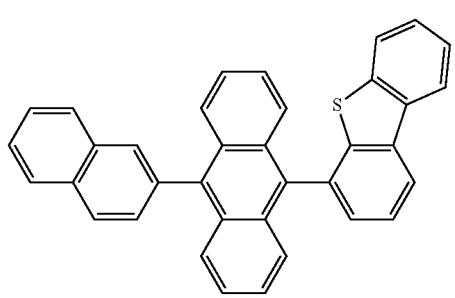
H21
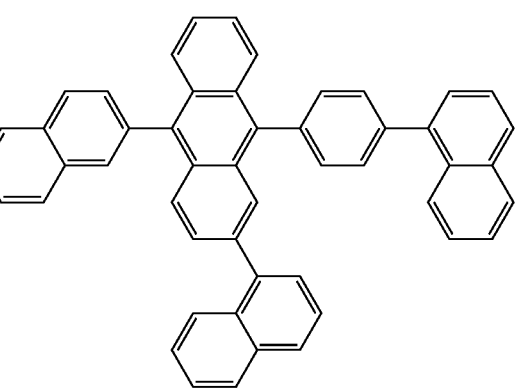

H22
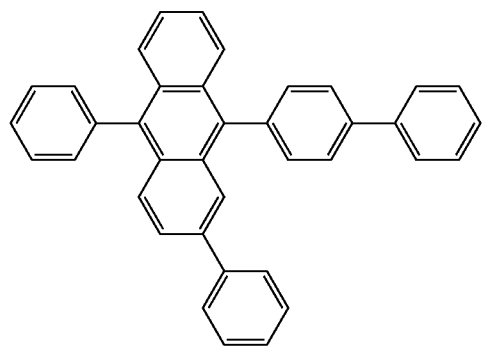
H23
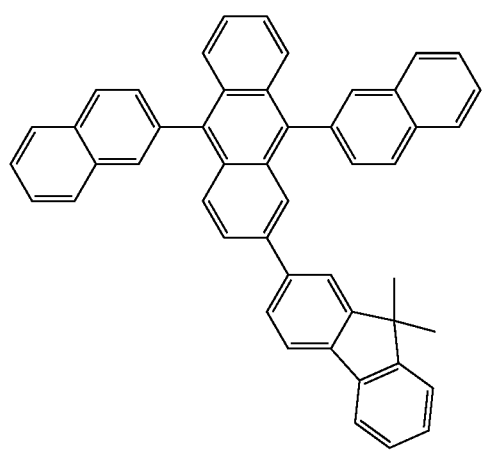
H24
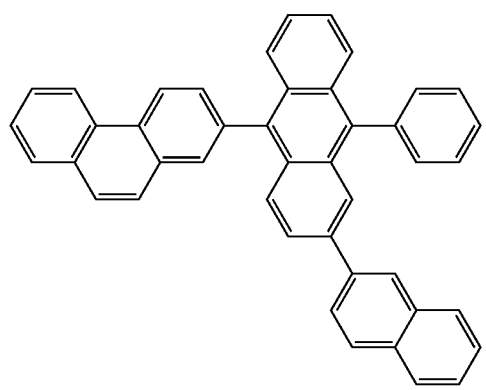
H25
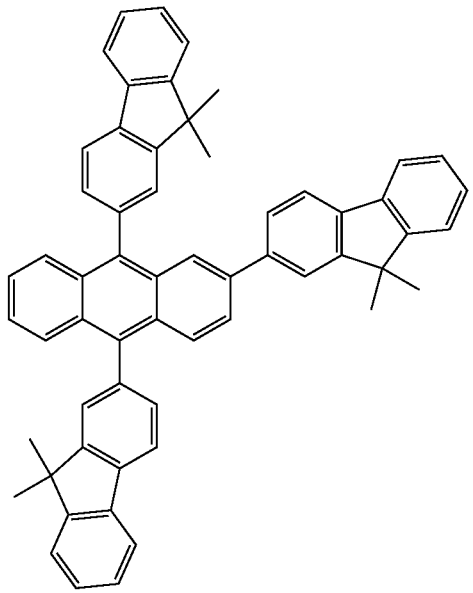
H26
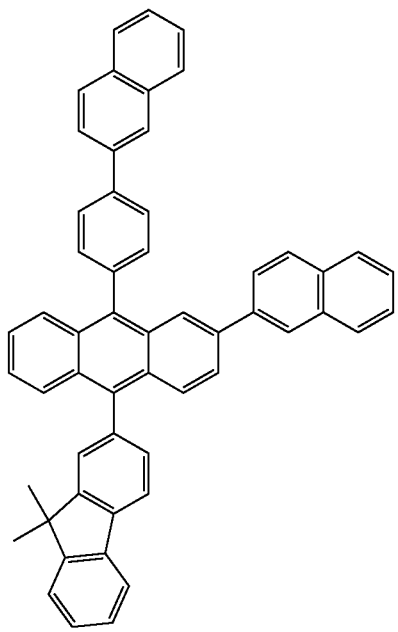

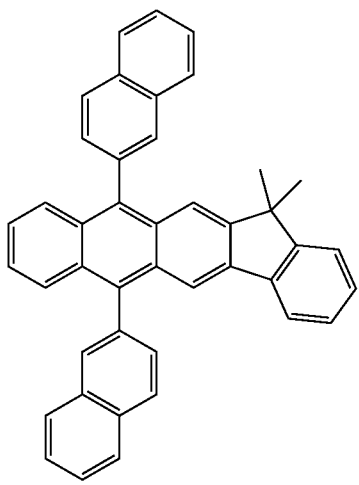
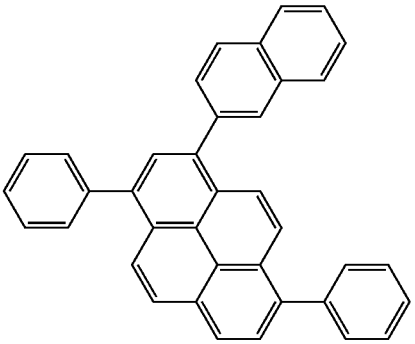

H35
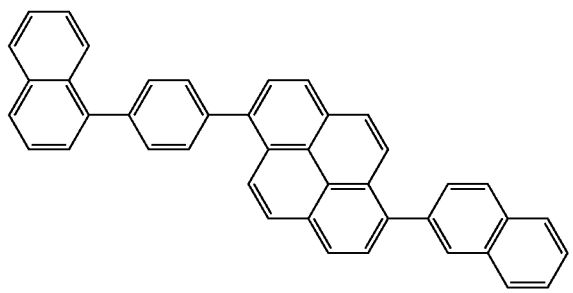
H36
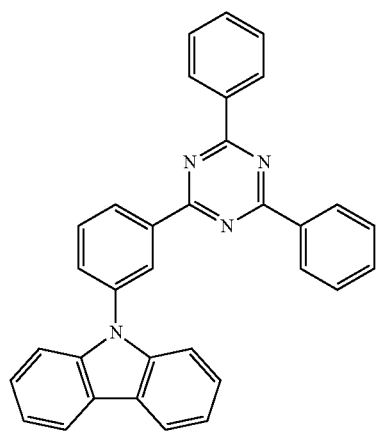
H37
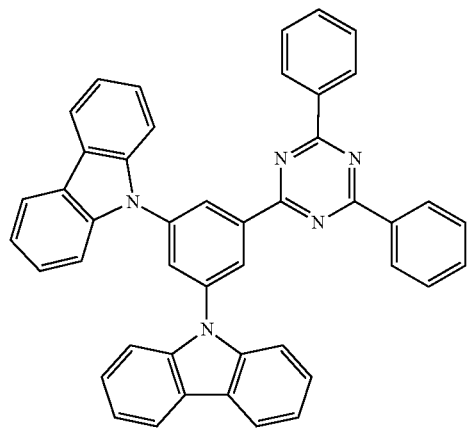
H38
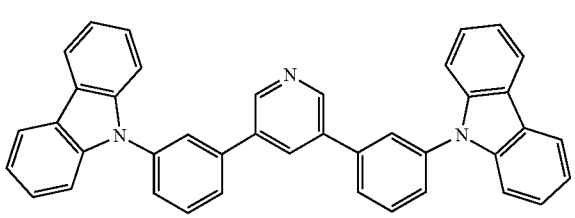
H39
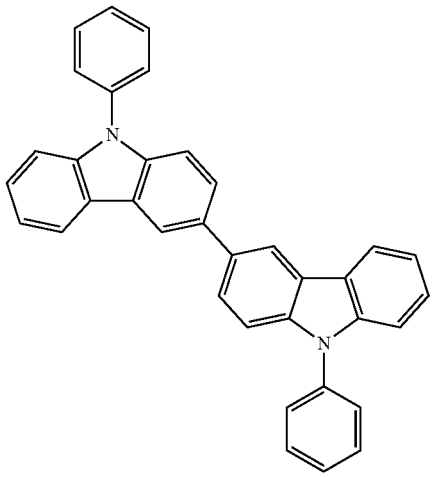
H40
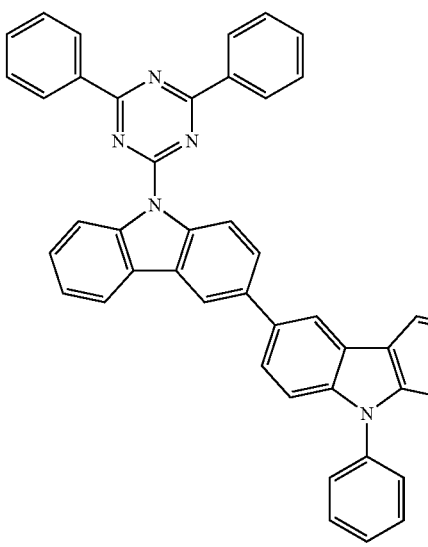
H41
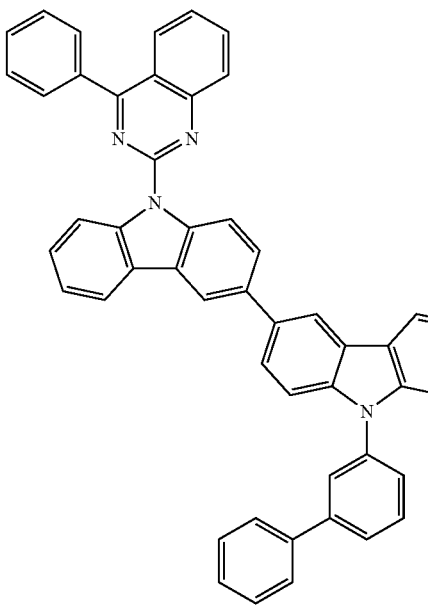

H42 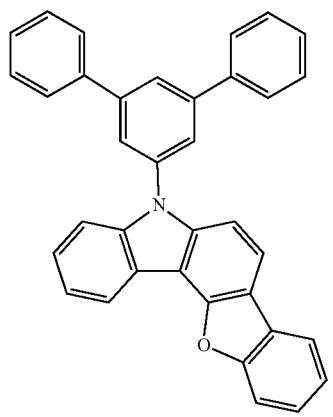
H43 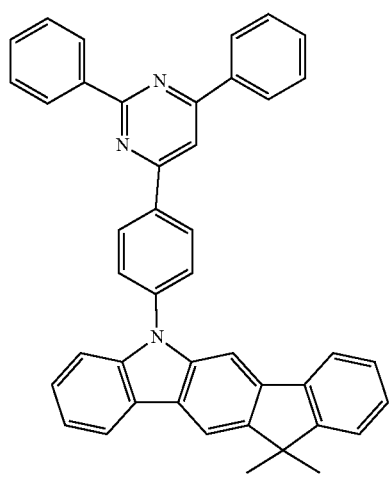
H44 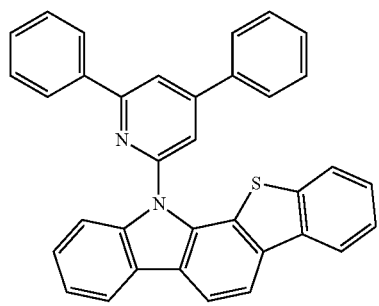
H45 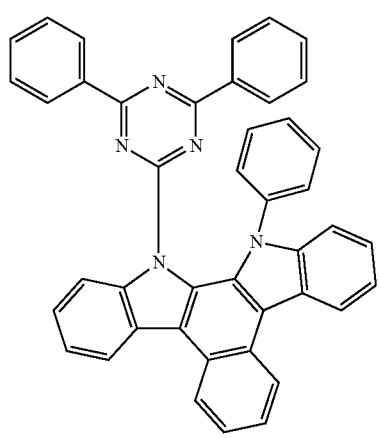
H46 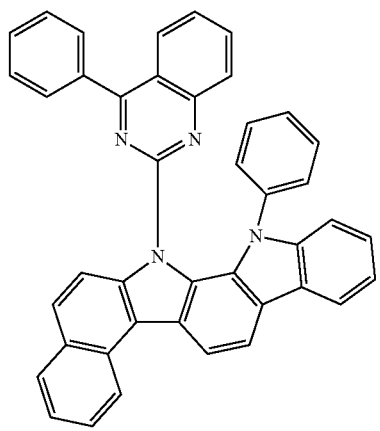
H47 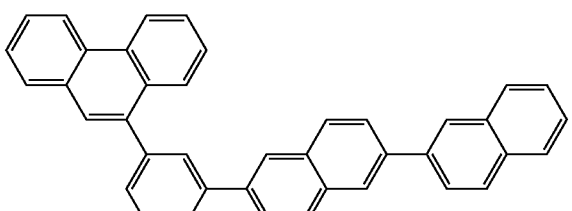
H48 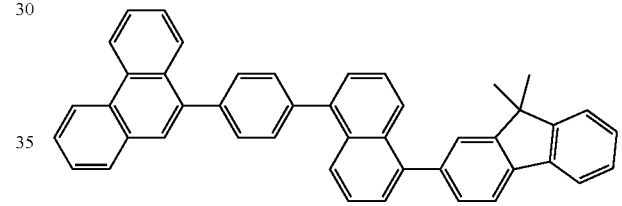
H49 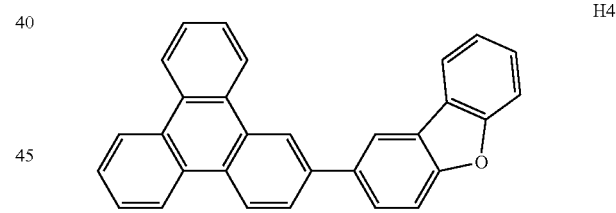
H50 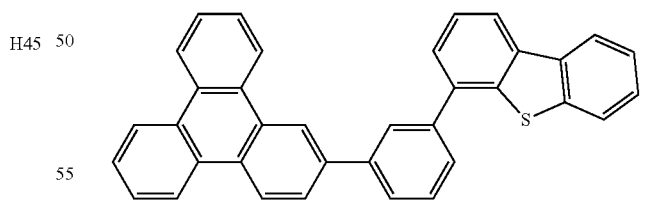
H51 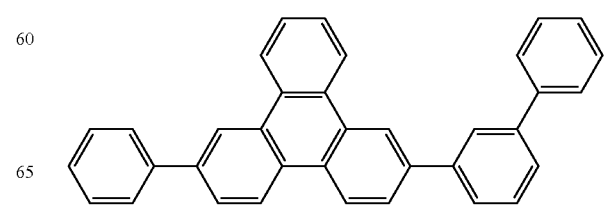

-continued

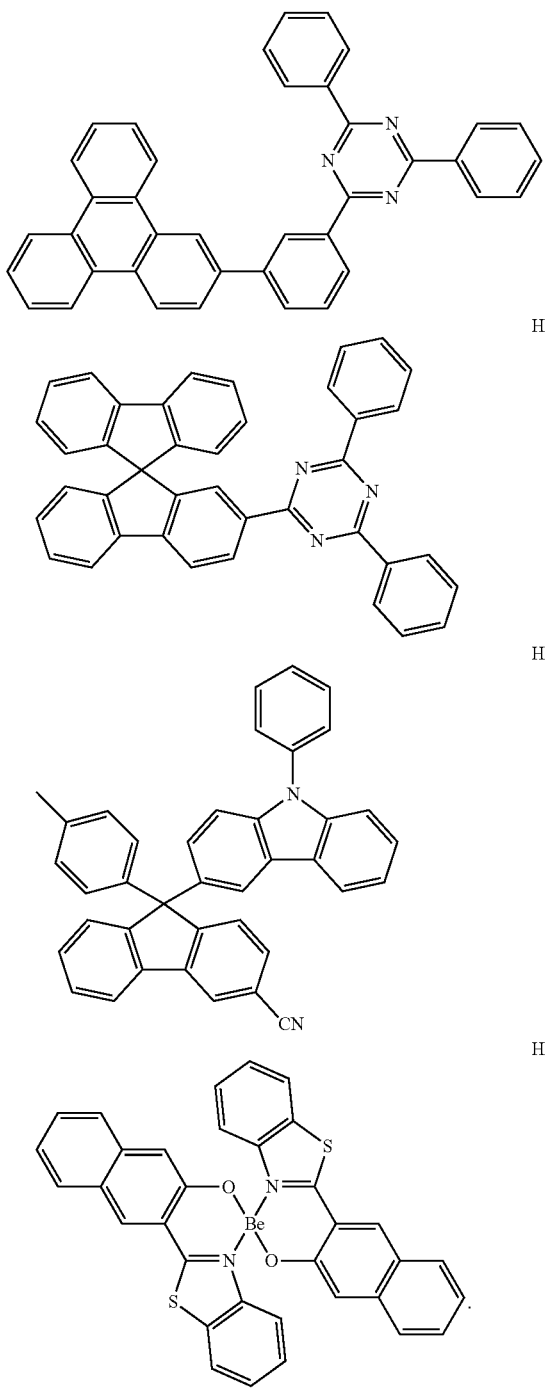

H52

H53

H54

H55

In one embodiment, the host may include at least one selected from a silicon-containing compound (for example, BCPDS used in the following examples, and/or the like) and a phosphine oxide-containing compound (for example, POPCPA used in the following examples, and/or the like).

The host may include only one compound or may include two or more compounds that are different from each other (for example, the host of the following examples includes BCPDS and POPCPA). In one or more embodiments, the host may instead have various other suitable modifications.

The phosphorescent dopant may include an organometallic complex represented by Formula 401:

$$M(L_{401})_{xc1}(L_{402})_{xc2}.$$  Formula 401

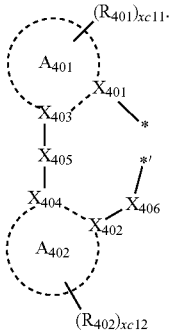

Formula 402

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be a ligand represented by Formula 402, and xc1 may be 1, 2, or 3, wherein when xc1 is 2 or more, the two or more $L_{401}$(s) may be identical to or different from each other, $L_{402}$ may be an organic ligand, and xc2 may be an integer from 0 to 4, wherein when xc2 is 2 or more, the two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O-', *—S-', *—C(=O)—', *—N($Q_{411}$)-', *—C($Q_{411}$)($Q_{412}$)-*', *—C($Q_{411}$)=C($Q_{412}$)-', *—C($Q_{411}$)=*', or *=C($Q_{411}$)=', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 may each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen and $X_{402}$ may be carbon, or ii) both of $X_{401}$ and $X_{402}$ may be nitrogen.

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantyl group, a norbornanyl group, and a norbornenyl group;

a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is 2 or more, the two $A_{401}$(s) in the two or more $L_{401}$(s) may optionally be linked to each other via $X_{407}$, which is a linking group, and/or the two $A_{402}$(s) may optionally be linked to each other via $X_{408}$, which is a linking group (see e.g., Compounds PD1 to PD4 and PD7). $X_{407}$ and $X_{408}$ may each independently be a single bond, *—C(=O)—*', *—N($Q_{413}$)-*', *—C($Q_{413}$)($Q_{414}$)-', or *—C($Q_{413}$)=C($Q_{414}$)-*' (where $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus (for example, phosphine or phosphite), but embodiments of the present disclosure are not limited thereto.

In one or more embodiments, the organometallic phosphorescent dopant may be selected from, for example, Compounds PD1 to PD25, but embodiments of the present disclosure are not limited thereto:

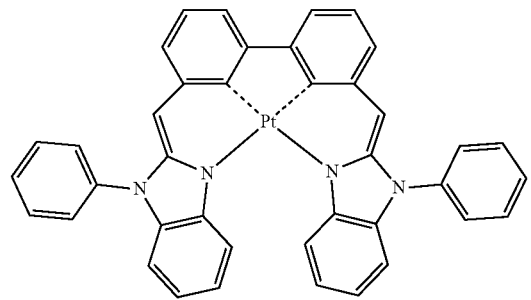

PD1

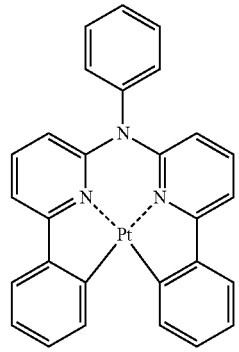

PD2

-continued
PD3
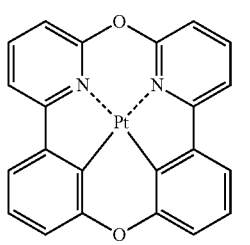
PD4
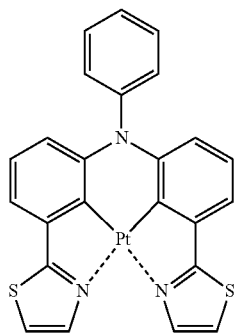
PD5
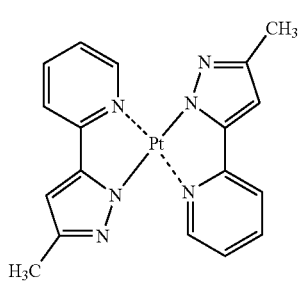
PD6
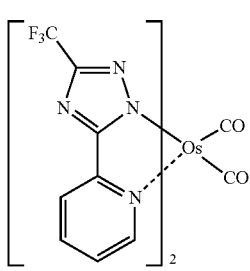
PD7
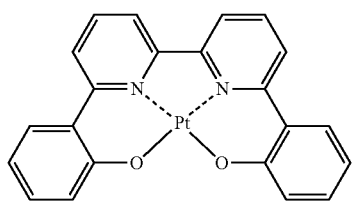
PD8
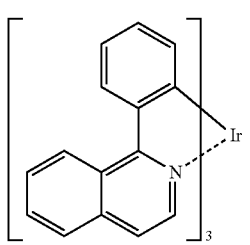
-continued
PD9
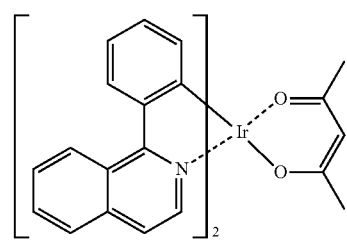
PD10
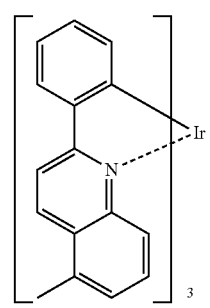
PD11
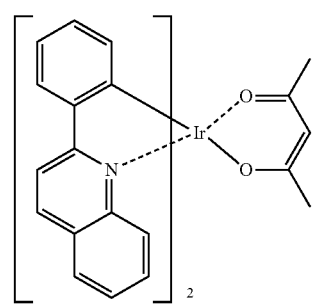
PD12
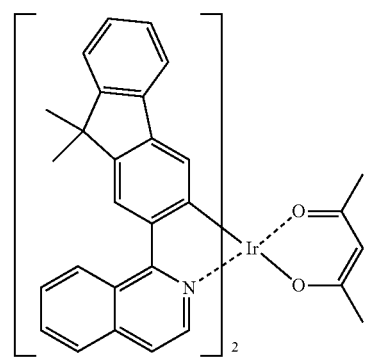
PD13
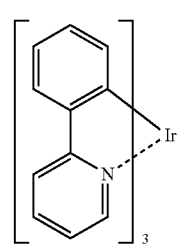

PD14
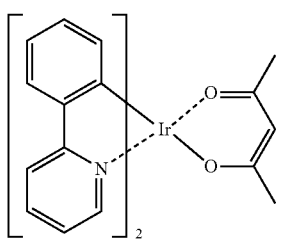
PD15
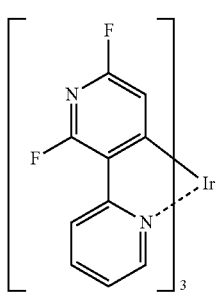
PD16
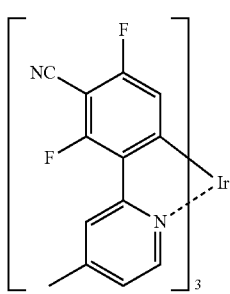
PD17
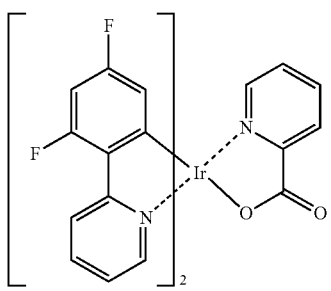
PD18
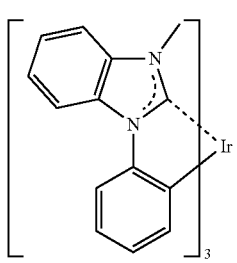
PD19
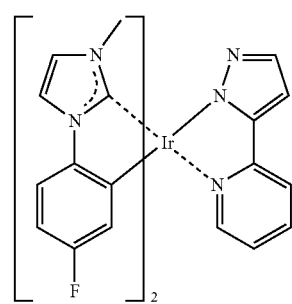
PD20
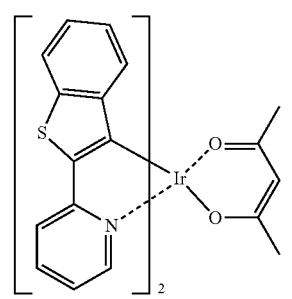
PD21
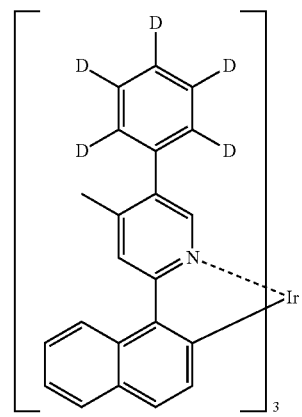
PD22
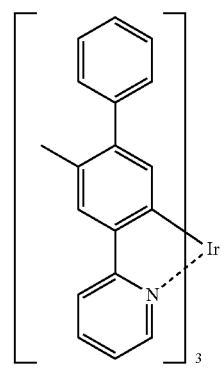

PD23

PD24

PD25

The fluorescent dopant may include an arylamine compound or a styrylamine compound.

The fluorescent dopant may include a compound represented by Formula 501:

$$Ar_{501}\left[(L_{503})_{xd3}-N\begin{matrix}(L_{501})_{xd1}-R_{501}\\(L_{502})_{xd2}-R_{502}\end{matrix}\right]_{xd4}$$
Formula 501

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD23:

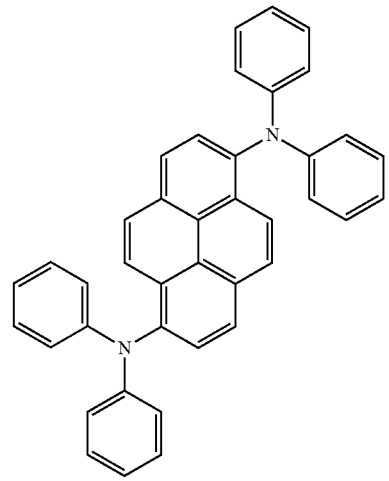

FD1

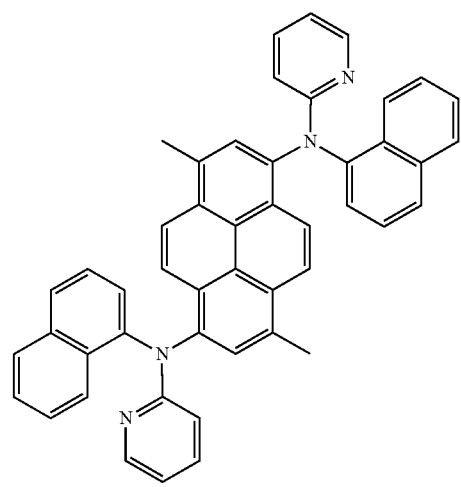

FD2

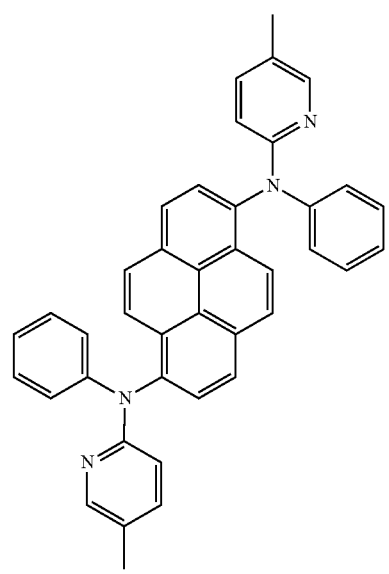

FD3

FD4
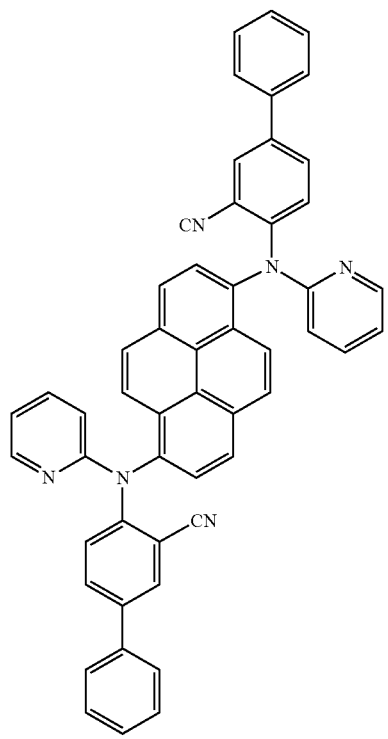
FD6
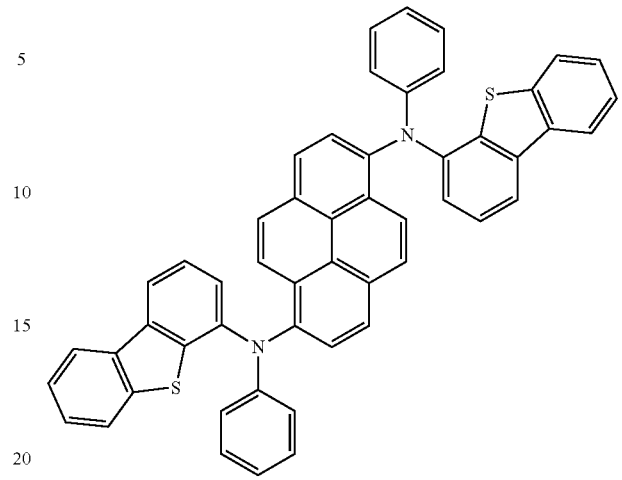
FD7
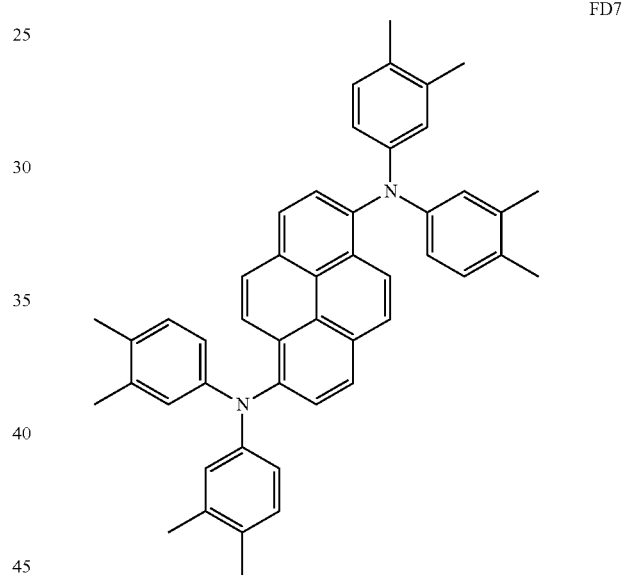
FD5
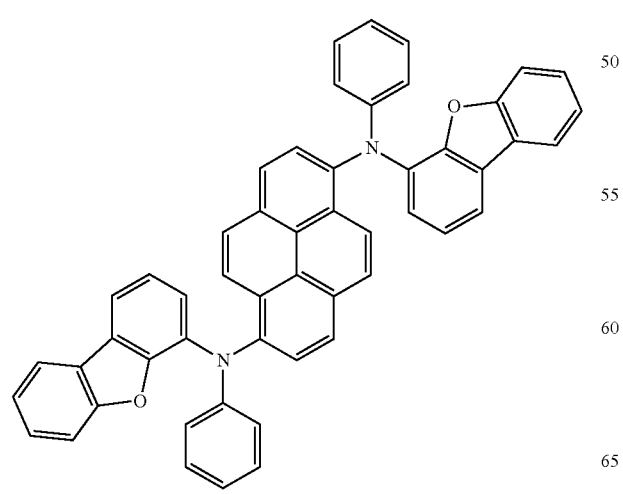
FD8
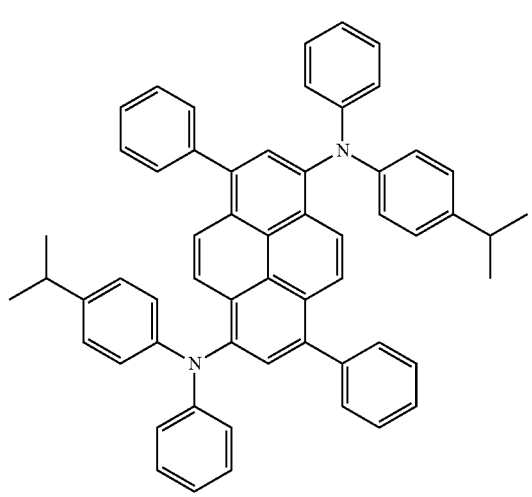

-continued
FD9
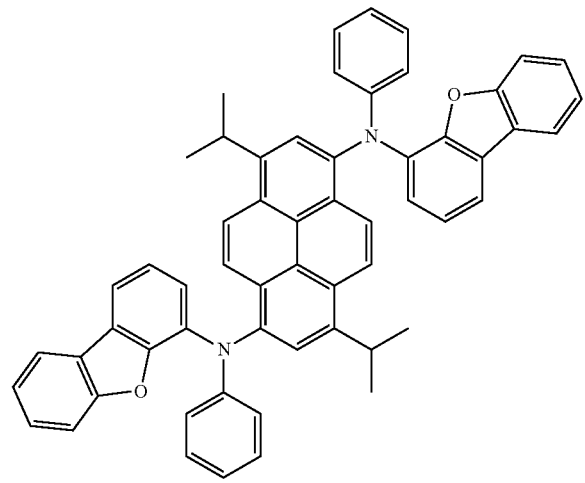
FD10
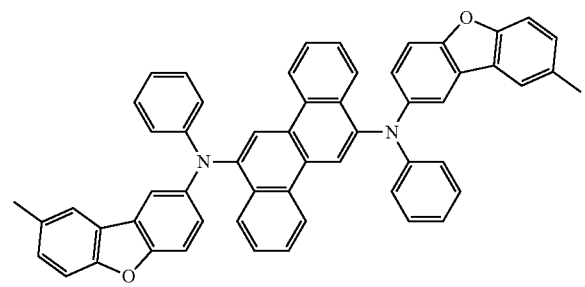
FD11
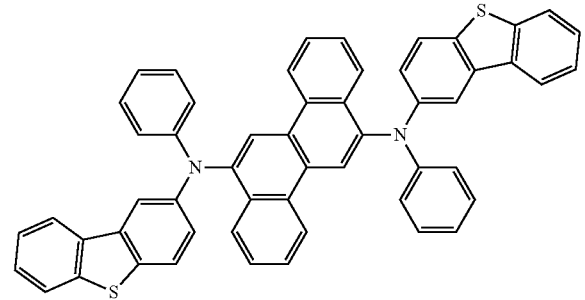
FD12
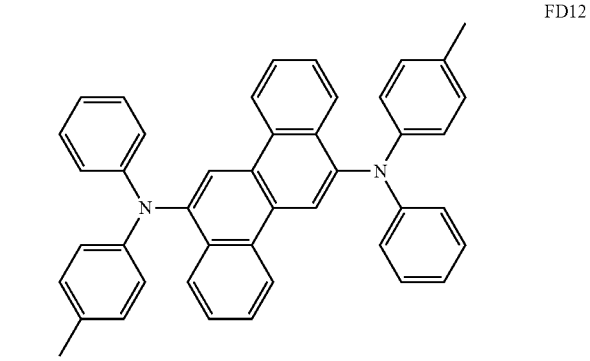
-continued
FD13
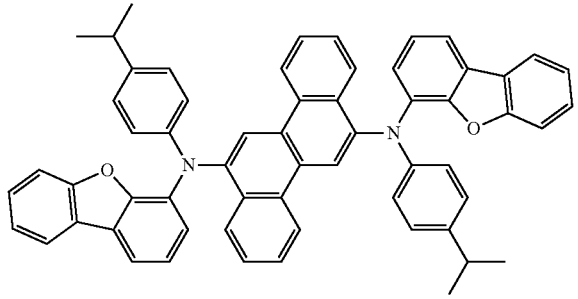
FD14
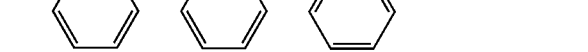
FD15
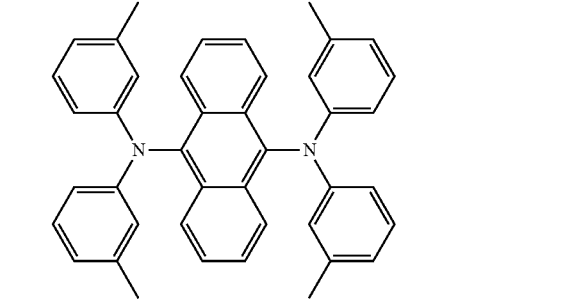
FD16
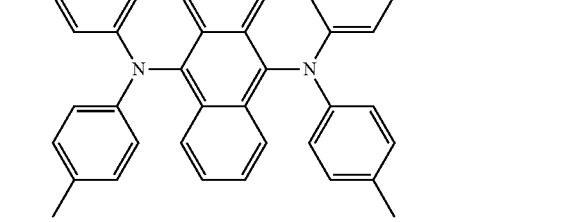
FD17
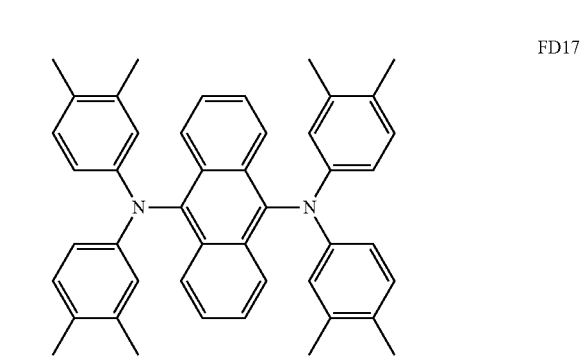

-continued
FD18
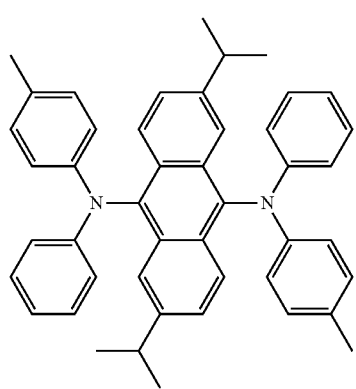
FD19
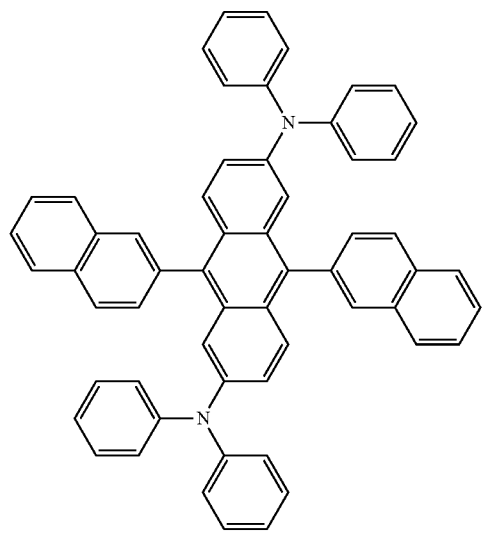
FD20
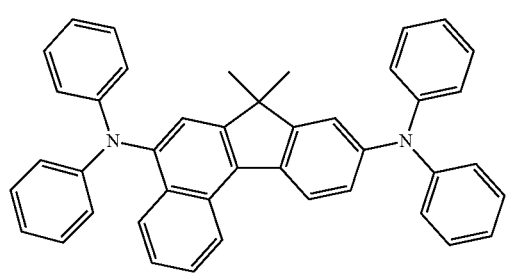
-continued
FD21
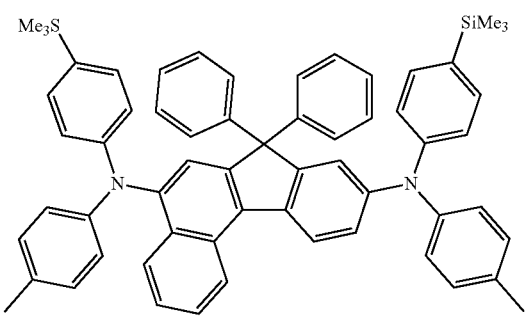
FD22
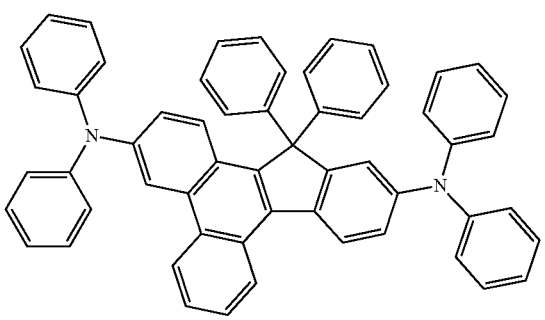
FD23
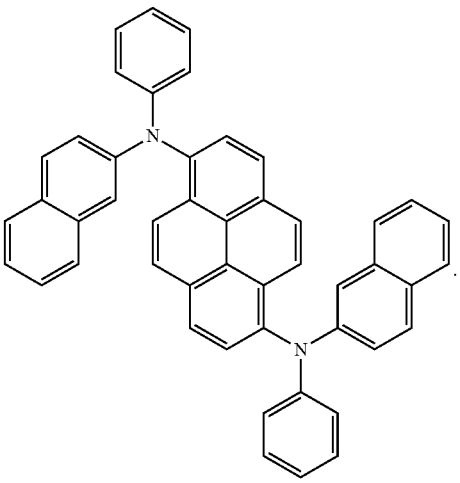
In one or more embodiments, the fluorescent dopant may be selected from the following compounds, but embodiments of the present disclosure are not limited thereto.
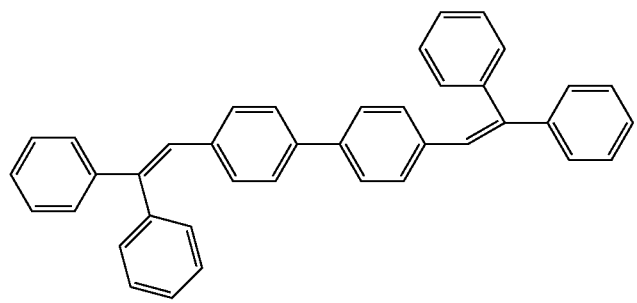
DPVBi

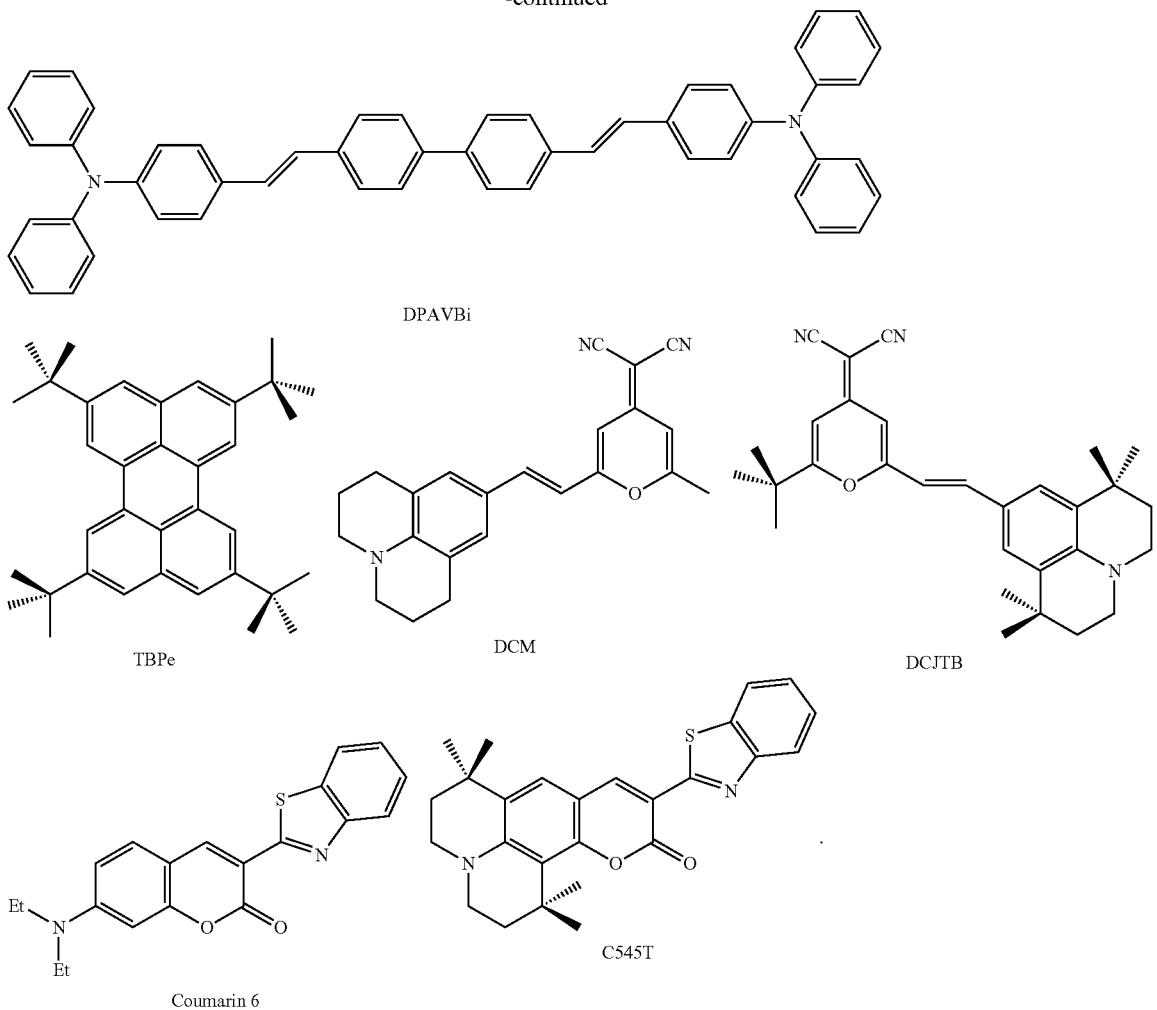

The delayed fluorescence dopant may include a compound represented by Formula 502:

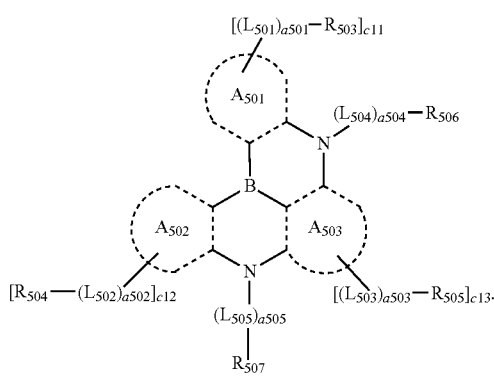

Formula 502

In Formula 502, $A_{501}$ to $A_{503}$ may each independently be a $C_5$-$C_{60}$ carbocyclic group or a $C_1$-$C_{60}$ heterocyclic group, $L_{501}$ to $L_{505}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a501 to a505 may each independently be an integer from 0 to 3, $R_{503}$ to $R_{507}$ may each independently be selected from a substituted or unsubstituted $C_3$-$C_{10}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and c11 to c13 may each independently be an integer from 0 to 6.

In one embodiment, $A_{501}$ to $A_{503}$ in Formula 502 may each independently be selected from a benzene group, a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, an indeno phenanthrene group, and a group represented by Formula 503:

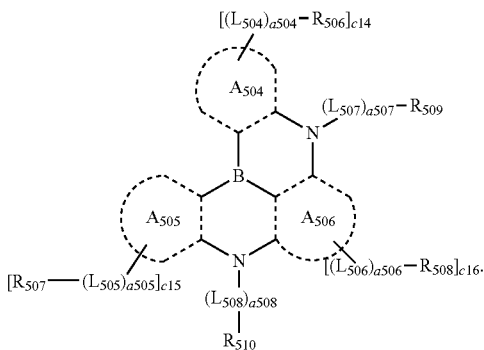

Formula 503

In Formula 503, $A_{504}$ to $A_{506}$ may each independently be the same as described in connection with $A_{501}$ in Formula 502, $L_{504}$ to $L_{508}$ may each independently be the same as described in connection with $L_{501}$ in Formula 502, a504 to a508 may each independently be the same as described in connection with a501 in Formula 502, $R_{506}$ to $R_{510}$ may each independently be the same as described in connection with $R_{503}$ in Formula 502, and c14 to c16 may each independently be the same as described in connection with c11 in Formula 502.

In one or more embodiments, $L_{501}$ to $L_{505}$ in Formula 502 may each independently be the same as described above.

In one or more embodiments, $R_{503}$ to $R_{507}$ in Formula 502 may each independently be selected from:

a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, wherein $Q_{31}$ to $Q_{33}$ may be selected from a $C_1$-$C_{10}$ alkyl group, a $C_1$-$C_{10}$ alkoxy group, a phenyl group, a biphenyl group, a terphenyl group, and a naphthyl group.

In one embodiment, c11 to c13 in Formula 502 may be 0 or 1, but embodiments of the present disclosure are not limited thereto.

For example, the delayed fluorescence dopant may be selected from Compounds FD31 to FD33:

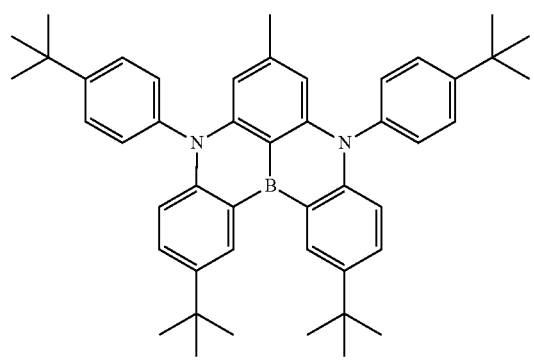

FD31

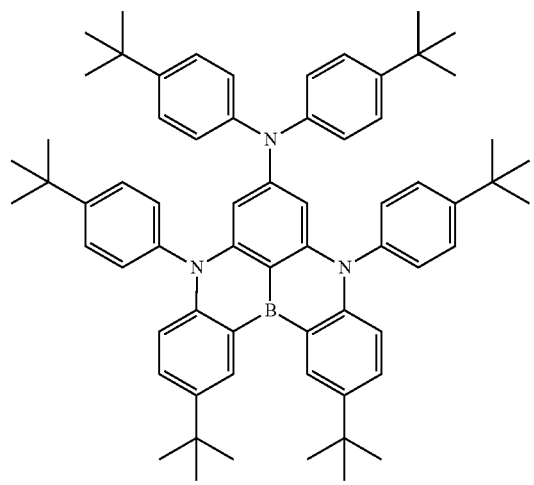

FD32

FD33

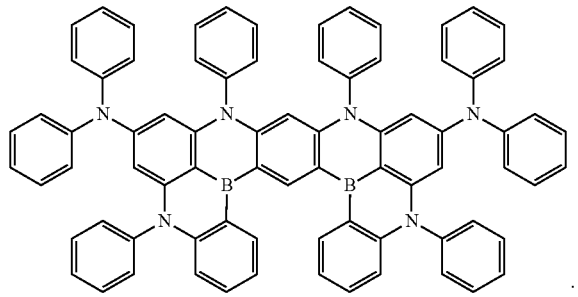

An emission layer of the quantum dot light-emitting device may include a quantum dot. For example, the quantum dot light-emitting device may include a quantum dot emission layer. The quantum dot emission layer may include a plurality of quantum dots (inorganic nanoparticles) arranged in a single layer or a plurality of layers.

In the present specification, the term "quantum dot" refers to a crystal of a semiconductor compound, and may include any material having an emission wavelengths that can be tuned according to the size of the crystal. The compounds constituting the quantum dot are not particularly limited as long as the quantum dot fulfills the above criteria.

In some embodiments, the quantum dot may include a semiconductor compound material selected from a III-VI group semiconductor compound, a II-VI group semiconductor compound; a III-V group semiconductor compound; a IV-VI group semiconductor compound; a IV group element or compound; or any mixture thereof.

For example, the III-VI group semiconductor compound may be selected from: a binary compound such as $In_2S_3$; a ternary compound selected from AgInS, $AgInS_2$, CuInS, $CuInS_2$, and any mixture thereof, but embodiments of the present disclosure are not limited thereto.

For example, the II-VI group semiconductor compound may be selected from a binary compound selected from CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof, but embodiments of the present disclosure are not limited thereto.

For example, the III-V group semiconductor compound may be selected from: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof, but embodiments of the present disclosure are not limited thereto.

For example, the IV-VI group semiconductor compound may be selected from: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof, but embodiments of the present disclosure are not limited thereto.

For example, the IV group element or compound may be selected from: a single element compound selected from Si, Ge, and any mixture thereof; and a binary compound selected from SiC, SiGe, and any mixture thereof, but embodiments of the present disclosure are not limited thereto.

The binary compound, the ternary compound, and/or the quaternary compound may each exist as particles at a substantially uniform concentration, or may exist in the same particle having a non-uniform concentration distribution (e.g., a concentration gradient).

The quantum dot may have a substantially uniform single structure (e.g., a solid core-only structure) or a core-shell structure including one core and one or more shells. For example, the core-shell structure may include different materials. For example, the materials constituting each of the core and the shell may include different semiconductor compounds.

The shell of the quantum dot may serve as a protective layer for maintaining semiconductor characteristics by preventing or reducing chemical degeneration of the core, and/or may serve as a charging layer for imparting electrophoretic characteristics to the quantum dot. The shell may be a single layer (e.g., a single shell) or a multilayer (e.g., multiple shells). The interface between the core and the shell may have a concentration gradient in which the concentration of atoms existing in the shell decreases toward the center.

Non-limiting examples of the shell of the quantum dot may include a metal or non-metal oxide, a semiconductor compound, or any combination thereof. For example, the metal or non-metal oxide may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), or a ternary compound (such as $MgAl_2O_4$, $CoFe_2O_4$, $NiFe_2O_4$, and/or $CoMn_2O_4$), but embodiments of the present disclosure are not limited thereto. In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but embodiments of the present disclosure are not limited thereto.

A diameter (size) of the quantum dot is not particularly limited, but may be, for example, about 1 nm to about 10 nm. When the size of the quantum dot is selected or adjusted, the energy band gap may also be adjusted to thereby yield light of various wavelengths from the quantum dot emission layer. Therefore, by using or including quantum dots of different sizes, a display that emits light of various wavelengths may be implemented.

For example, the size of various quantum dots may be selected to emit red, green, and blue light, so as to constitute a color display. In some embodiments, the sizes of the quantum dots may be selected so that different quantum dots emit light of different colors, which may be combined to emit white light.

Each quantum dot may be a spherical, pyramidal, multi-arm, or cubic nanoparticle, or a nanotube, nanowire, nanofiber, or nanoplate particle, but embodiments of the present disclosure are not limited thereto.

The full width at half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within this range, color purity and/or color reproduction may be improved. In addition, light emitted through such quantum dot may be omnidirectionally irradiated, thereby providing a wide viewing angle.

The quantum dot may be synthesized via a wet chemical process, an organometallic chemical vapor deposition process, a molecular beam epitaxy process, or any suitable or similar process.

In the wet chemical process, a precursor material is added to an organic solvent to grow a particle crystal. As the crystal grows, the organic solvent serves as a dispersant that naturally coordinates to the surface of the quantum dot crystal and controls the growth of the crystal. In this regard, the wet chemical process may be easily performed compared to a vapor deposition process (such as metal organic chemical vapor deposition (MOCVD) and/or molecular beam epitaxy (MBE)), and the growth of inorganic nanoparticles may be controlled by utilizing this low-cost process.

[Electron Transport Layer in Electron Transport Region]

The light-emitting device 1 may include an electron transport layer directly contacting the emission layer.

The electron transport layer may include a twelfth material, and the twelfth material may include at least one selected from organic electron transport compounds.

In one embodiment, the electron transport layer may further include a thirteenth material different from the twelfth material, and the thirteenth material may include an alkali metal halide, an alkaline earth metal halide, a lanthanide metal halide, or any combination thereof.

The term "organic electron transport compound" as used herein refers to a metal-free compound including at least one π electron-deficient nitrogen-containing ring.

The term "π electron-deficient nitrogen-containing ring" as used herein refers to a $C_1$-$C_{60}$ heterocyclic group having at least one *—N=*' moiety as a ring-forming moiety.

For example, the "π electron-deficient nitrogen-containing ring" may be: i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Non-limiting examples of the π electron-deficient nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring In some embodiments, the term "organic electron transport compound" as used herein may include a compound represented by Formula 601:

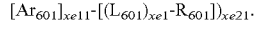
Formula 601

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of the xe11 $Ar_{601}$ (s) and the xe21 $R_{601}$(s) may include the π electron-deficient nitrogen-containing ring.

In one embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, the two or more $Ar_{601}$ (s) may be linked to each other via a single bond.

In one or more embodiments, $Ar_{601}$ in Formula 601 may be an anthracene group.

In one or more embodiments, a compound represented by Formula 601 may be represented by Formula 601-1:

Formula 601-1

$(L_{611})_{xe611}$—$R_{611}$ $X_{614}$ $X_{615}$ $R_{613}$—$(L_{613})_{xe613}$ $X_{616}$ $(L_{612})_{xe612}$—$R_{612}$.

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein $Q_{601}$ and $Q_{602}$ may each independently be the same as described above.

The electron transport region may include at least one compound selected from Compounds ET1 to ET36, but embodiments of the present disclosure are not limited thereto:

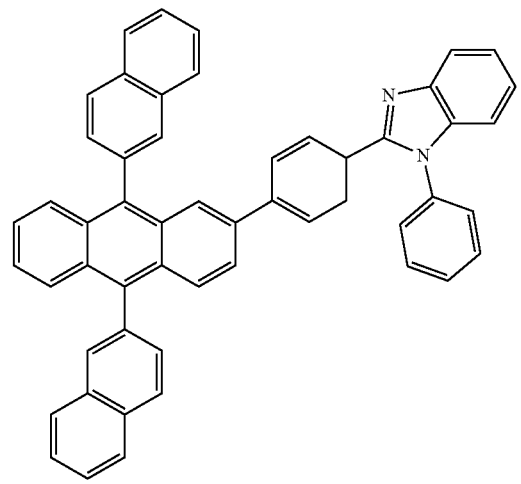

ET1

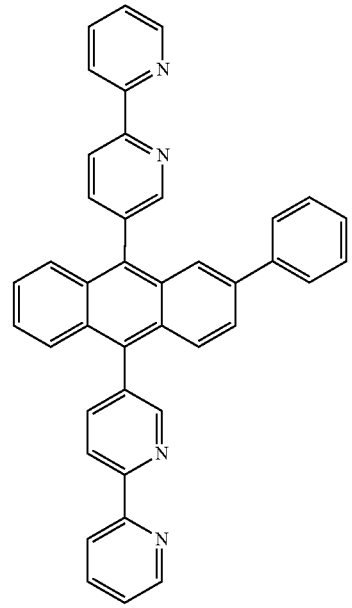

ET2

ET3
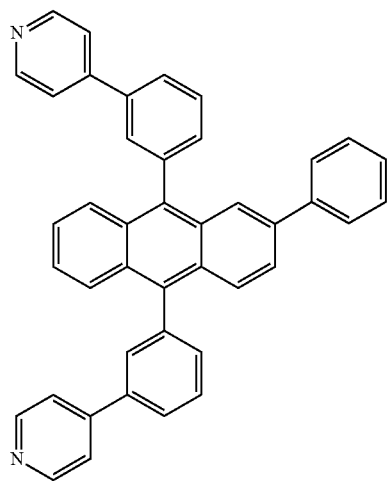
ET4
ET5
ET6
ET7
ET8
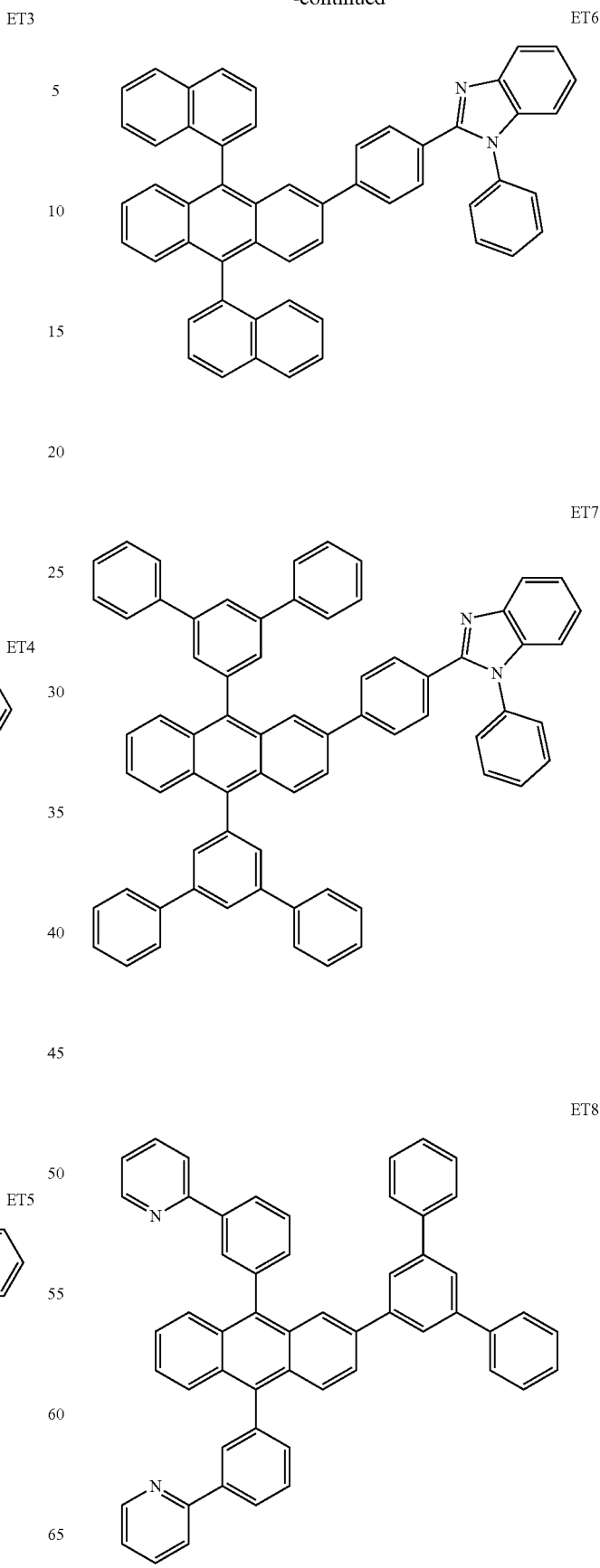

ET9
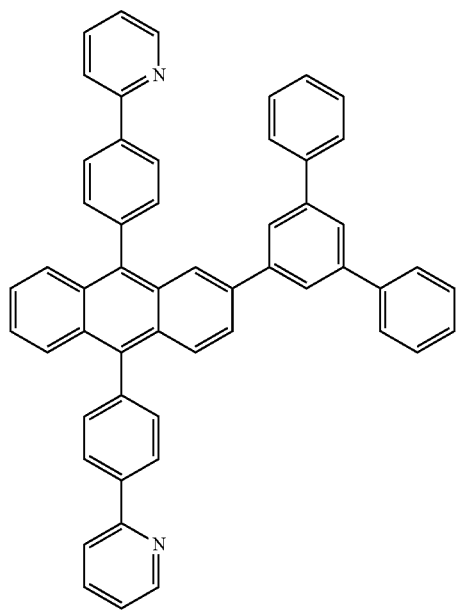
ET11
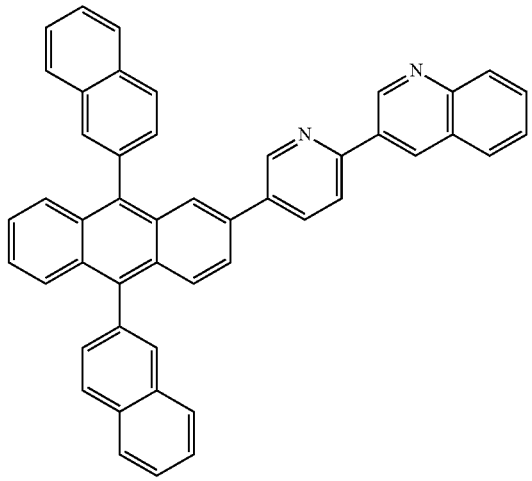
ET12
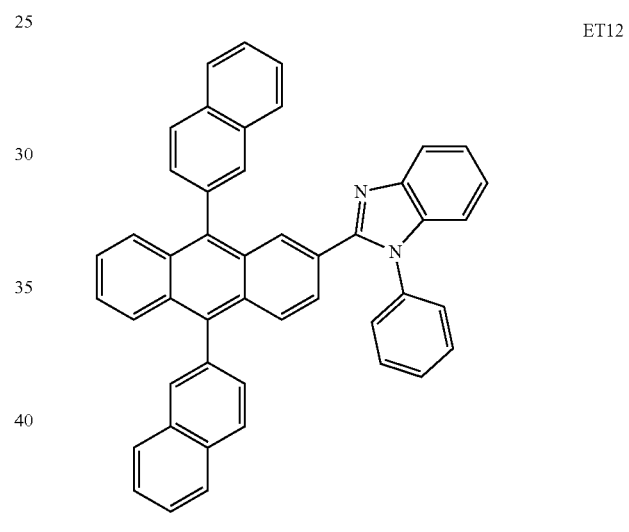
ET10
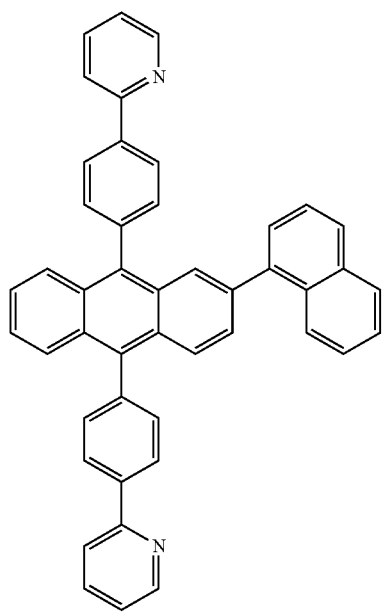
ET13
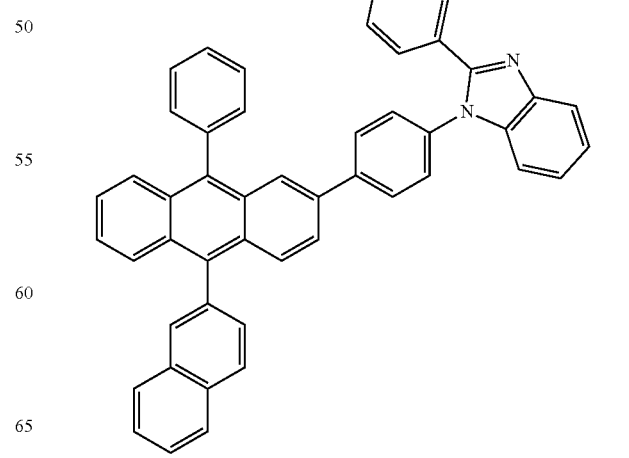

ET14
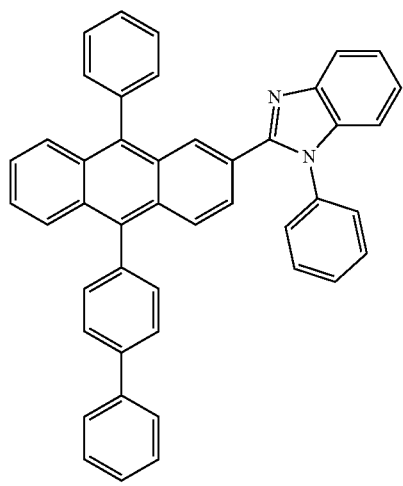
ET15
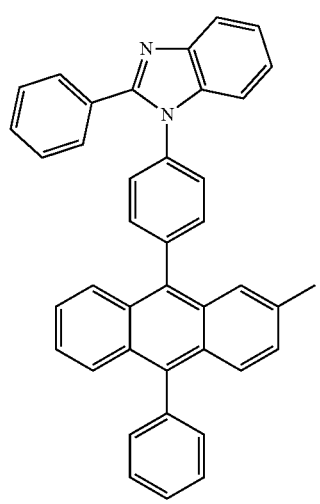
ET16
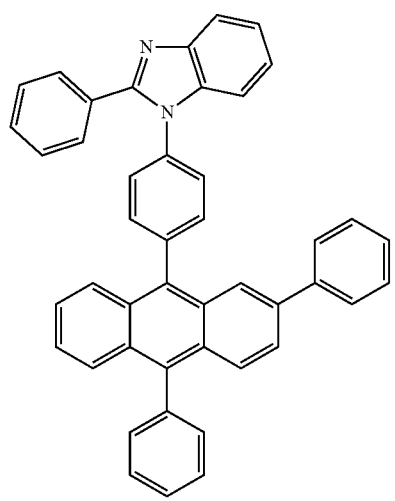
ET17
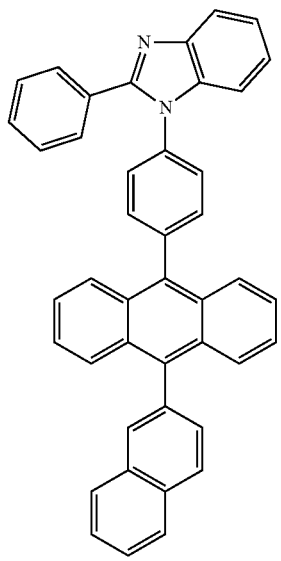
ET18
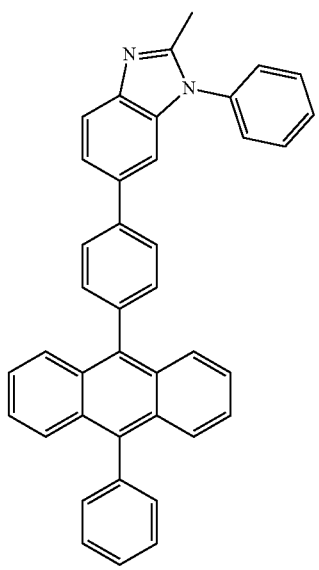
ET19
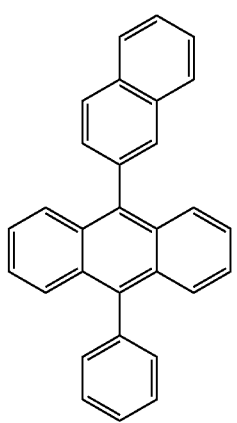

ET20
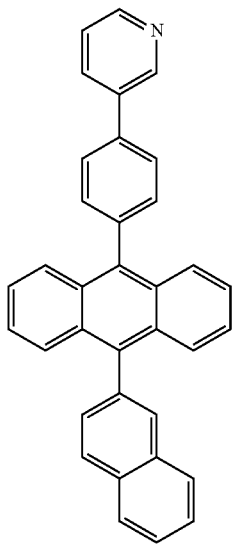
ET21
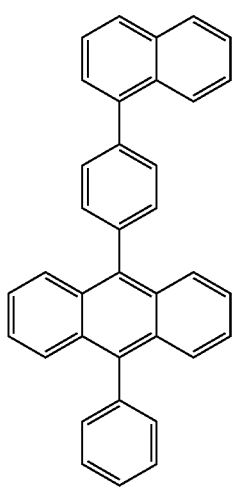
ET22
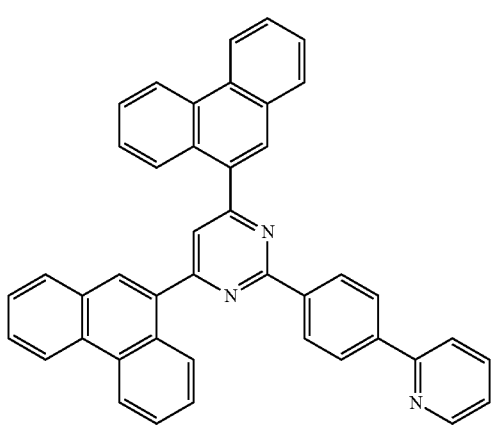
ET23
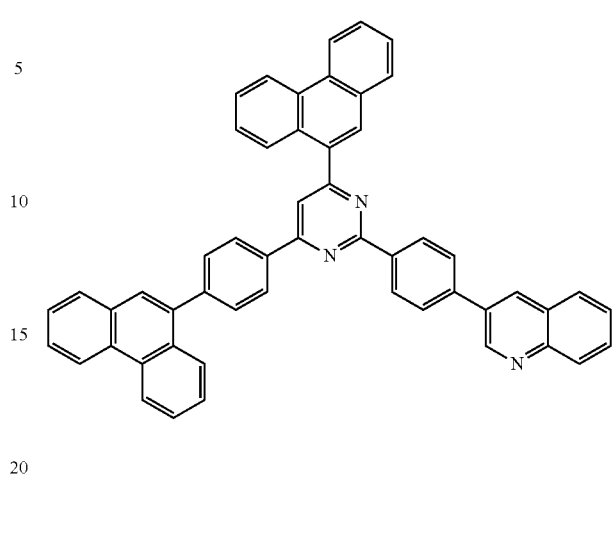
ET24
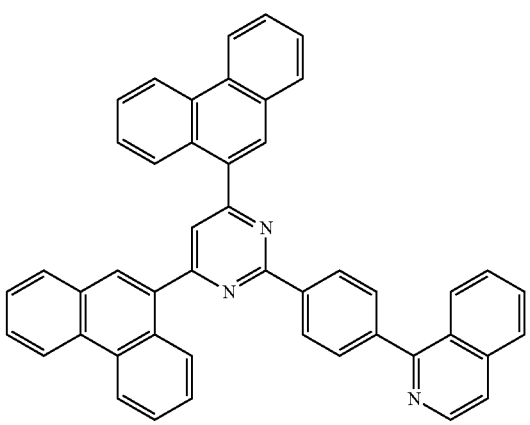
ET25
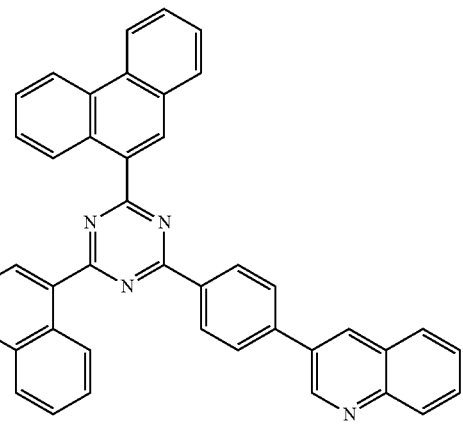

ET26
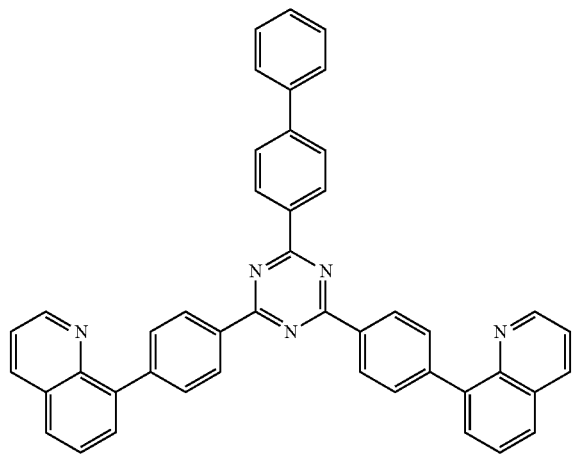
ET27
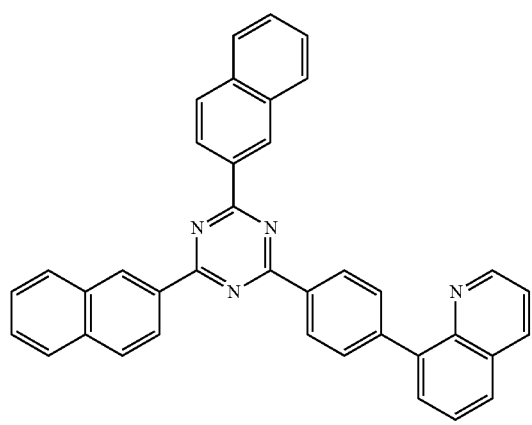
ET28
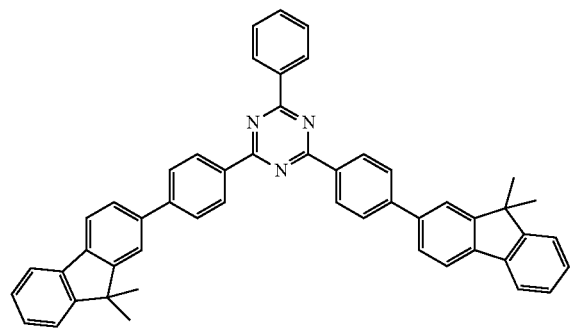
ET29
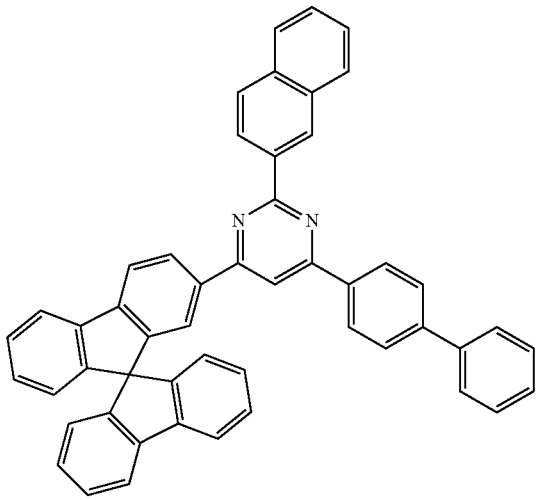
ET30
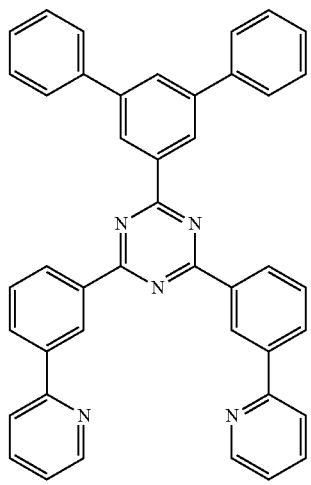
ET31
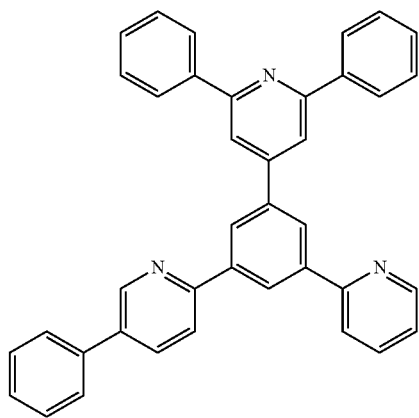

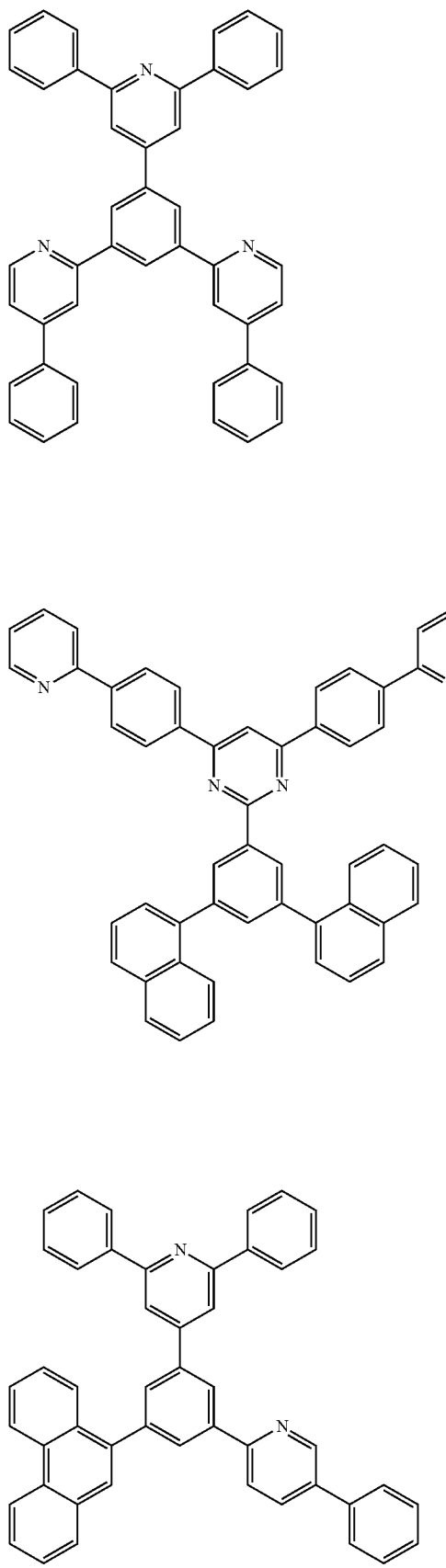
ET32
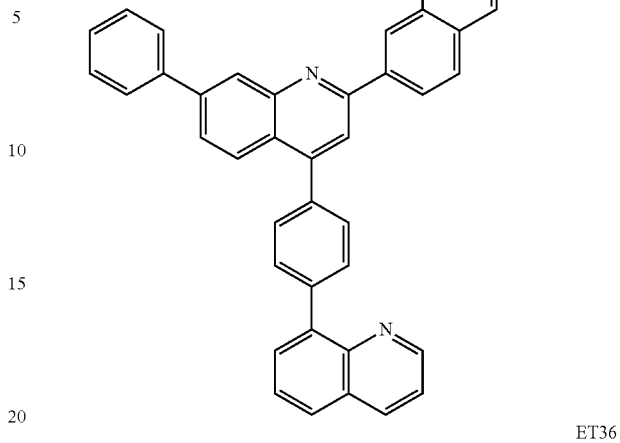
ET35
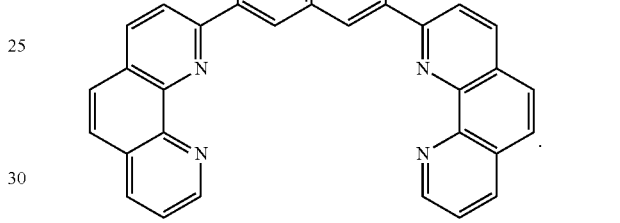
ET36
In one or more embodiments, the electron transport region may include at least one compound selected from 2,9-dimethyl-4,7-diphenyl-1,10-phenanthroline (BCP), 4,7-diphenyl-1,10-phenanthroline (Bphen), Alq₃, BAlq, 3-(biphenyl-4-yl)-5-(4-tert-butylphenyl)-4-phenyl-4H-1,2,4-triazole (TAZ), and NTAZ.
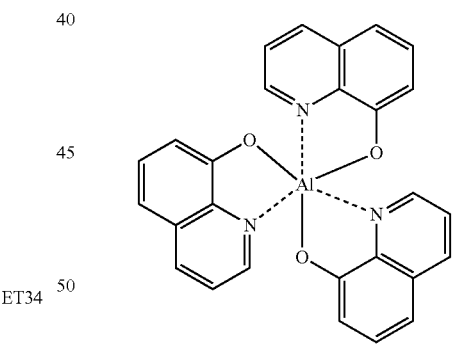
Alq₃
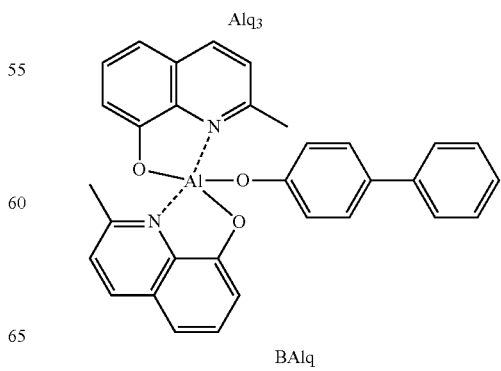
BAlq -continued

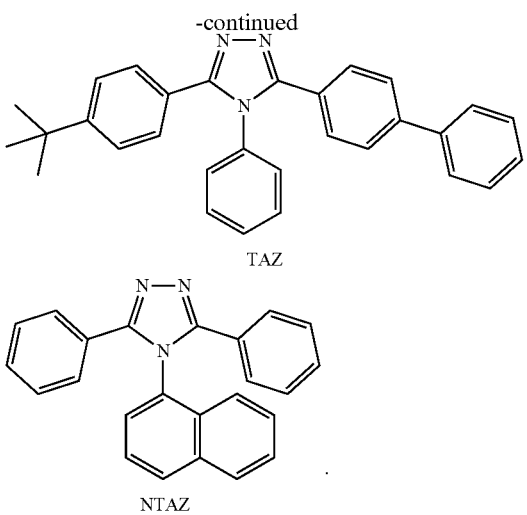

TAZ

NTAZ

In the electron transport layer, the twelfth material may have a volume greater than or equal to that of the thirteenth material. In detail, in the electron transport layer, a volume ratio of the twelfth material to the thirteenth material may be in a range of about 99:1 to about 50:50.

A thickness of the electron transport layer may be about 0.1 nm to about 10 nm. When the thickness of the electron transport layer is within the range above, satisfactory electron transport characteristics may be obtained without a substantial increase in driving voltage.

[Electron Injection Layer in Electron Transport Region]

The light-emitting device 1 may include an electron injection layer directly contacting the second electrode 190 or the m-1$^{th}$ charge-generating unit.

The electron injection layer may include an eighth material, and the eighth material may include an alkali metal halide, an alkaline earth metal halide, a lanthanide metal halide, or any combination thereof.

In one embodiment, the electron injection layer may consist of the eighth material. In some embodiments, for example, the electron injection layer may not include any material other than the eighth material.

In one embodiment, the electron injection layer may further include a ninth material different from the eighth material, and the ninth material may include an alkali metal, an alkaline earth metal, a lanthanide metal, or any combination thereof.

In some embodiments, the eighth material may be a compound having a wide band gap of about 7 eV or more. Accordingly, the eighth material may substantially not absorb light.

In some embodiments, the ninth material may be a compound having a low work function of about 2.6 eV or less.

In some embodiments, the eighth material may be represented by Formula X, and the ninth material may be represented by Formula Y:

$A_nB_m$  Formula X

C.  Formula Y

In Formulae X and Y,

A and C may each independently be an alkali metal, an alkaline earth metal, a lanthanide metal, or any combination thereof, B may be a halogen, n and m may each independently be an integer of 1 or more that makes the eighth material neutral, and A and C may be different from each other.

When A and C are different from each other, the ninth material may be selected to complement light absorption according to a band gap of the eighth material.

For example, in Formulae X and Y, A may include Li, Na, K, Rb, Cs, or any combination thereof, B may include F, Cl, Br, I, or any combination thereof, each of n and m may be 1, and C may include La, Ce, Pr, Nd, Pm, Sm, Eu, Gd, Tb, Dy, Ho, Er, Tm, Yb, Lu, or any combination thereof.

In some embodiments, the eighth material may include NaI, KI, RbI, CsI, NaCl, KCl, RbCl, CsCl, NaF, KF, RbF, CsF, or any combination thereof, and the ninth material may include La, Ce, Pr, Nd, Pm, Sm, Eu, Gd, Tb, Dy, Ho, Er, Tm, Yb, Lu, or any combination thereof.

In the electron injection layer, the eighth material may have a volume greater than or equal to that of the ninth material. For example, in the electron injection layer, the ninth material may have a volume greater than 0% and less than or equal to 50% with respect to the total volume of material. In some embodiments, in the electron injection layer, the ninth material may have a volume of 5% or more to 10% or less, but embodiments of the present disclosure are not limited thereto. When the volume of the ninth material is within the range above, the ninth material may sufficiently complement light absorption according to a band gap of the eighth material.

A thickness of the electron injection layer may be about 0.1 nm to about 5 nm. When the thickness of the electron injection layer is within the range above, satisfactory electron injection characteristics may be obtained without a substantial increase in driving voltage.

[Metal-Containing Material in Electron Transport Region]

The electron transport region may further include, in addition to the materials described above, a metal-containing material.

The metal-containing material may include at least one selected from an alkali metal complex and an alkaline earth-metal complex.

A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

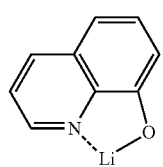

ET-D1

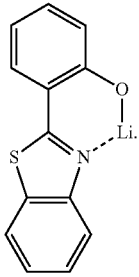

ET-D2

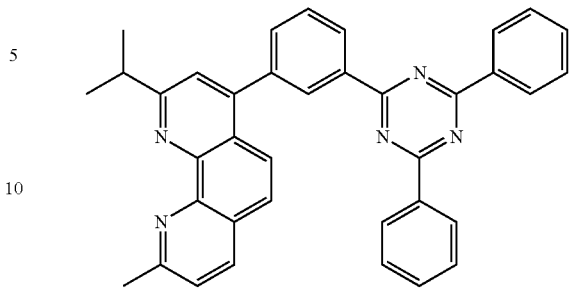

N2

[Charge-Generating Unit]

The light-emitting device 1 includes m−1 charge-generating unit(s) between adjacent ones of the emission units.

For example, an m−1$^{th}$ charge-generating unit is included between the m$^{th}$ emission unit and the m−1$^{th}$ emission unit. For example, when m is 2, a first electrode, a first emission unit, a first charge-generating unit, and a second emission unit are sequentially disposed. As another example, when m is 3, a first electrode, a first emission unit, a first charge-generating unit, a second emission unit, a second charge-generating unit, and a third emission unit are sequentially disposed.

In one embodiment, at least one of the charge-generating unit(s) includes: an n-type charge-generating layer; a p-type charge-generating layer; and an interlayer pIL between the n-type charge-generating layer and the p-type charge-generating layer.

Figure 2:
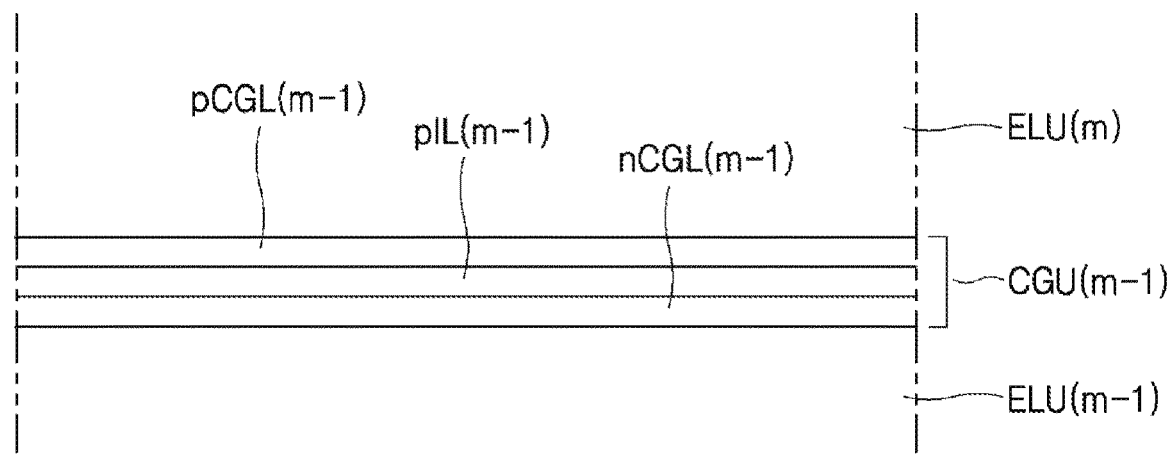
FIG. 2 is a cross-sectional view of a charge-generating unit in FIG. 1.

Referring to FIG. 2, an m−1$^{th}$ charge-generating unit CGU(m−1) between a m$^{th}$ emission unit ELU(m) and a m−1$^{th}$ emission unit ELU(m−1) includes: an m−1$^{th}$ n-type charge-generating layer nCGL(m−1); an m−1$^{th}$ p-type charge-generating layer pCGL(m−1); and an m−1$^{th}$ interlayer pIL(m−1) between the m−1$^{th}$ n-type charge-generating layer and the m−1$^{th}$ p-type charge-generating layer.

The n-type charge-generating layer may include a first material and a second material.

The first material may include at least one selected from organic electron transport compounds. An organic electron transport compound is the same as described above.

In one embodiment, the organic electron transport compound may be a phenanthroline-based compound or a phosphine oxide-based compound.

In one embodiment, the organic electron transport compound may be selected from Compound N1, Compound N2, and any similar phenanthroline-based compound:

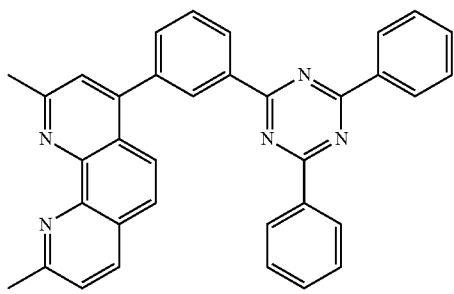

N1

The second material may include at least one selected from an alkali metal, an alkali metal alloy, an alkaline earth metal, an alkaline earth metal alloy, a lanthanide metal, and a lanthanide metal alloy.

The first material may include an organic electron transport compound, and a volume ratio of the first material to the second material may be about 99.9:0.1 to about 80:20. For example, a volume ratio of the first material to the second material may be about 99:1 to about 80:20.

In one embodiment, the bonding energy between the first material and the second material may be about 1.2 eV or more, for example, about 1.25 eV or more. For example, the bonding energy between the first material and the second material may be about 1.25 eV or more to about 5 eV or less.

The bonding energy may be calculated through simulation using, for example, Gaussian 09.

In the n-type charge-generating layer, the bonding energy between the first material and the second material is configured to be high, and thus charge flow in the light-emitting device 1 may be smooth, which may prevent or reduce a phenomenon that driving voltage increases with time.

In one embodiment, the second material may be an alkali metal or an alkali metal alloy, and the n-type charge-generating layer may further include bismuth (Bi).

In one or more embodiments, the second material may be an alloy of an alkali metal and bismuth (Bi).

For example, the second material may be lithium (Li), sodium (Na), an Bi—Li alloy, or a Bi—Na alloy.

When the n-type charge-generating layer includes an alkali metal, the alkali metal may be easily oxidized during processing and have an increased melting point, and thus a process temperature may increase. In this regard, when an alloy of an alkali metal and bismuth is used as a second material as described above, the n-type charge-generating layer may be stably configured, and the melting point may decrease, which is advantageous during processing.

In one or more embodiments, the second material may be terbium (Tb), holmium (Ho), or dysprosium (Dy).

A thickness of the n-type charge-generating layer may about 0.1 nm to about 20 nm.

In some embodiments, the n-type charge-generating layer may be in direct contact with the p-type interlayer.

In some embodiments, the n-type charge-generating layer may be in direct contact with an electron injection layer or an electron transport layer. For example, an n-type charge-generating layer included in an m−1$^{th}$ charge-generating unit may be in direct contact with an electron injection layer or an electron transport layer included in an m−1$^{th}$ emission unit.

The p-type interlayer pIL includes a third material and a fourth material.

The third material may include an organic hole transport compound, an inorganic insulation compound, or any combination thereof. An organic hole transport compound is the same as described above.

The fourth material may include at least one compound selected from an organic semiconductor compound, an inorganic semiconductor compound, and an inorganic insulation compound.

In one embodiment, in the p-type interlayer, the third material may include an organic hole transport compound, and a volume ratio of the third material to the fourth material may be about 99:1 to about 80:20, but embodiments of the present disclosure are not limited thereto.

In one or more embodiments, in the p-type interlayer, the third material may include an inorganic insulation compound, and a volume ratio of the third material to the fourth material may be about 99:1 to about 50:50, but embodiments of the present disclosure are not limited thereto.

A thickness of the p-type interlayer may be about 0.1 nm to about 20 nm, for example about 0.1 nm to about 10 nm.

The p-type interlayer may be in direct contact with the n-type charge-generating layer.

In one embodiment, the fourth material may be an organic semiconductor compound (such as NDP-9). In one or more embodiments, the fourth material may be an inorganic semiconductor compound (such as CuI, BiI$_3$, BiCl$_3$, BiBr$_3$, BiF$_3$, Bi$_2$Te$_3$, Te, and/or ZnTe). In one or more embodiments, the fourth material may include an organic semiconductor compound such as NDP-9 and an inorganic semiconductor compound such as CuI, BiI$_3$, Bi$_2$Te$_3$, Te, and/or ZnTe.

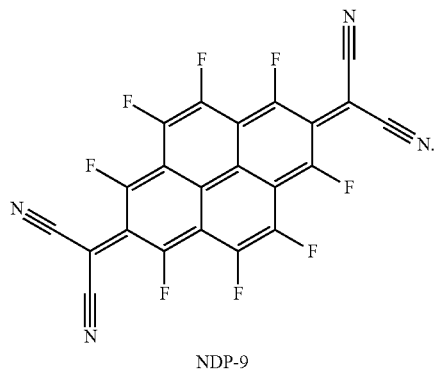

NDP-9

In one embodiment, the fourth material may not include an organic semiconductor compound. For example, the fourth material may include (e.g., consist of) at least one inorganic semiconductor compound.

When a voltage is applied to a light-emitting device, the second material included in the n-type charge-generating layer may be diffused to the p-type charge-generating layer. However, the light-emitting device 1 may prevent or reduce the second material from diffusing, due to the p-type interlayer between the n-type charge-generating layer and the p-type charge-generating layer. Accordingly, degradation of interfaces between each layer may be prevented or reduced, and an increase in driving voltage may be prevented or reduced, and thus the light-emitting device 1 may provide improved lifespan and/or improved luminance.

The p-type charge-generating layer includes a third material and a fifth material.

The third material may include an organic hole transport compound, an inorganic insulation compound, or any combination thereof, as described above. The organic hole transport compound may be the same as described above.

In one embodiment, the third material included in the p-type interlayer and the third material layer included in the p-type charge-generating layer may be identical to each other (e.g., the same material). In one or more embodiments, the third material included in the p-type interlayer and the third material included in the p-type charge-generating layer may be different from each other.

The fifth material may include at least one selected from inorganic semiconductor compounds.

The third material may have a volume greater than or equal to that of the fifth material.

In one embodiment, in the p-type charge-generating interlayer, the third material may include an organic hole transport compound, and a volume ratio of the third material to the fifth material may be about 99:1 to about 80:20, but embodiments of the present disclosure are not limited thereto.

In one or more embodiments, the third material may include an inorganic insulation compound, and a volume ratio of the third material to the fifth material may be about 99:1 to about 50:50, but embodiments of the present disclosure are not limited thereto.

A thickness of the p-type charge-generating layer may be about 0.1 nm to about 20 nm.

The p-type charge-generating layer may be in direct contact with the p-type interlayer.

In some embodiments, the p-type charge-generating layer may be in direct contact with a hole injection layer or a hole transport layer. For example, a p-type charge-generating layer included in an m−1$^{th}$ charge-generating unit may be in direct contact with a hole injection layer or a hole transport layer included in an m$^{th}$ emission unit.

In one embodiment, the charge-generating unit includes a p-type charge-generating unit including (e.g., consisting of) the p-type interlayer and the p-type charge-generating layer, the p-type charge-generating unit may be doped only with an inorganic dopant, and the inorganic dopant may include at least two different inorganic semiconductor compounds. For example, a fourth material included in the p-type interlayer may be an inorganic semiconductor compound, a fifth material included in the p-type charge-generating layer may be an inorganic semiconductor compound, and the fourth material and the fifth material may be different from each other.

In some embodiments, in the charge-generating unit, each of the n-type charge-generating layer, the p-type interlayer, and the p-type charge-generating layer may be doped with an inorganic dopant. For example, the n-type charge-generating layer may be doped with a second material including at least one selected from an alkali metal, an alkali metal alloy, an alkaline earth metal, an alkaline earth metal alloy, a lanthanide metal, and a lanthanide metal alloy, the p-type interlayer may be doped with a fourth material including an inorganic semiconductor compound, and the p-type charge-generating layer may be doped with a fifth material including an inorganic semiconductor compound. In some embodiments, the fourth material and the fifth material may be different from each other.

[Second Electrode 190]

The second electrode 190 is located on the m$^{th}$ emission unit. The second electrode 190 may be a cathode, which is an electron injection electrode, and a material for forming the second electrode 190 may be selected from a metal, an alloy, an electrically conductive compound, and a combination thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), silver-magnesium (Ag—Mg), ytterbium (Yb), silver-ytterbium (Ag—Yb), ITO, and IZO, but embodiments of the present disclosure are not limited thereto. The second electrode 190 may be a transmissive electrode, a semi-transmissive electrode, or a reflective electrode.

The second electrode 190 may have a single-layered structure or a multi-layered structure including two or more layers.

A thickness of the second electrode 190 may be about 5 nm to about 20 nm. When the thickness of the second electrode 190 is within the range, light absorption in the second electrode 190 may be minimized or reduced, and satisfactory electron injection characteristics may be obtained without a substantial increase in driving voltage.

[Apparatus]

The light-emitting device may be included in any suitable apparatus.

Another aspect of the present disclosure provides an apparatus including the light-emitting device.

For example, the apparatus may be a light-emitting apparatus, an authentication apparatus, or an electronic apparatus, but embodiments of the present disclosure are not limited thereto.

[Light-Emitting Apparatus]

Figure 3:
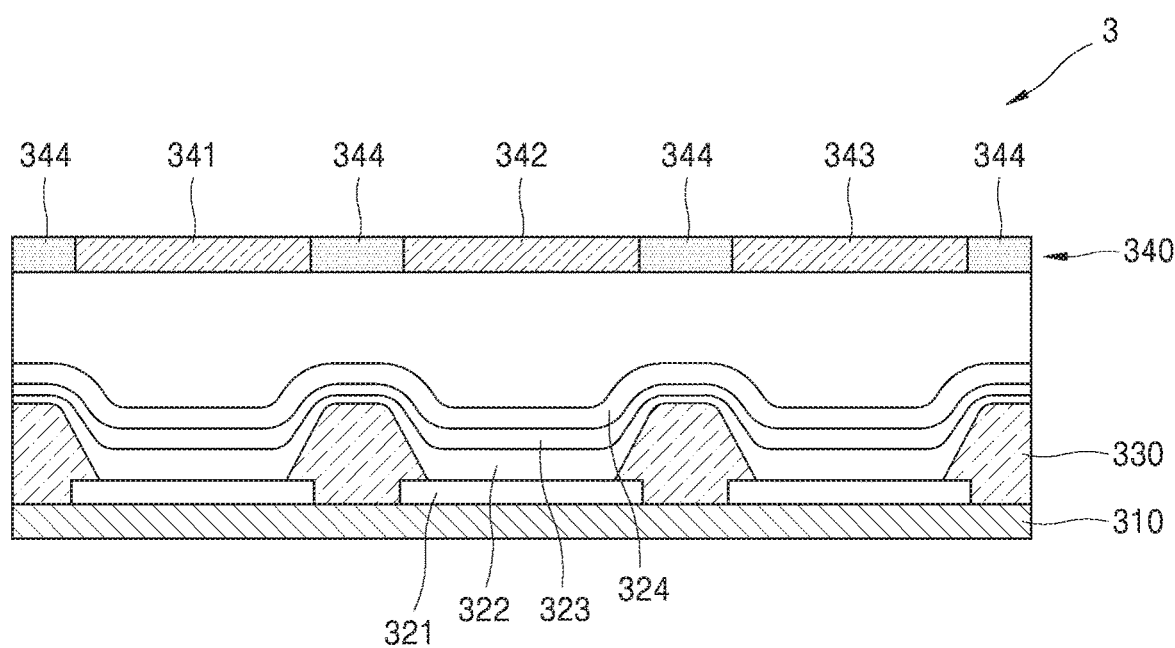
FIG. 3 is a schematic cross-sectional view of a light-emitting apparatus according to an embodiment.

Referring to FIG. 3, a light-emitting apparatus 3 according to an embodiment will be described in more detail.

In the light-emitting apparatus 3, a color filter 340 may be positioned to intersect at least one traveling direction of light emitted from the light-emitting device 1.

The light-emitting device 1 may include a first electrode 321, a first emission unit 322, a first charge-generating unit, a second emission unit 323, and a second electrode 324. For example, the first emission unit 322 and the second emission unit 323 may each emit blue light, but embodiments of the present disclosure are not limited thereto.

A first substrate 310 of the light-emitting apparatus 3 may include a plurality of subpixel areas, and the color filter 340 may include a plurality of color filter areas 341, 342, and 343 respectively corresponding to the plurality of subpixel areas. A pixel-defining film 330 may be formed between the plurality of subpixel areas to define each of the subpixel areas. The color filter 340 may include light blocking patterns 344 between the plurality of color filter areas 341, 342, and 343.

The plurality of color filter areas 341, 342, and 343 may include a first color filter area to emit first color light, a second color filter area to emit second color light, and a third color filter area to emit third color light, and the first color light, the second color light, and the third color light may have different maximum emission wavelengths from one another. For example, the first color light may be red light, the second color light may be green light, and the third color light may be blue light, but embodiments of the present disclosure are not limited thereto.

In some embodiments, the plurality of color filter areas 341, 342, and 343 may each include a quantum dot, but embodiments of the present disclosure are not limited thereto. In some embodiments, the first color filter area may include a red quantum dot, the second color filter area may include a green quantum dot, and the third color filter area may not include a quantum dot.

The quantum dots may each independently be the same as described above.

The first color filter area, the second color filter area, and the third color filter area may each include a scatter, but embodiments of the present disclosure are not limited thereto.

In one embodiment, the light-emitting device 1 may be to emit first light, the first color filter area may absorb the first light to emit a first first-color light, the second color filter area may absorb the first light to emit a second first-color light, and the third color filter area may absorb the first light to emit a third first-color light. In this regard, the first first-color light, the second first-color light, and the third first-color light may have different maximum emission wavelengths from one another. For example, the first light may be blue light, the first first-color light may be red light, the second first-color light may be green light, and the third first-color light may be blue light, but embodiments of the present disclosure are not limited thereto.

The light-emitting apparatus may further include a thin-film transistor in addition to the light-emitting device 1 as described above. The thin-film transistor may include a source electrode, a drain electrode, and an activation layer, wherein the source electrode or the drain electrode may be electrically connected to any one of the first electrode 110 and the second electrode 190 of the light-emitting device 1.

The thin-film transistor may further include a gate electrode, a gate insulation layer, and/or the like.

The activation layer may include crystalline silicon, amorphous silicon, an organic semiconductor, an oxide semiconductor, and/or the like, but embodiments of the present disclosure are not limited thereto.

The light-emitting apparatus 3 may further include a sealing portion for sealing a light-emitting device. The sealing portion may be located between the color filter and the organic light-emitting device 1. The sealing portion may allow an image from the light-emitting device 1 to be implemented, and may block or reduce outside air and moisture from penetrating into the light-emitting device 1. The sealing portion may be a sealing substrate including a transparent glass and/or a plastic substrate. The sealing portion may be a thin-film encapsulation layer including a plurality of organic layers and/or a plurality of inorganic layers. When the sealing portion is a thin-film encapsulation layer, the entire flat display apparatus may be flexible.

The light-emitting apparatus 3 may be used as various displays, light sources, and/or the like.

[Authentication Apparatus]

The authentication apparatus may be, for example, a biometric authentication apparatus for authenticating an individual using biometric information of a biometric body (for example, a fingertip, a pupil, and/or the like).

The authentication apparatus may further include, in addition to the light-emitting device, a biometric information collector.

[Electronic Apparatus]

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and/or the like, but embodiments of the present disclosure are not limited thereto.

[Preparation Method]

According to an aspect, a method of preparing a light-emitting device including a first electrode, a second electrode facing the first electrode, m emission units between the first electrode and the second electrode, and m−1 charge-generating unit(s) between adjacent ones of the emission units (wherein m is a natural number of 2 or more, the emission units each include an emission layer, and at least one of the charge-generating unit(s) includes an n-type charge-generating layer and a p-type charge-generating layer) includes:

forming the n-type charge-generating layer including a first material and a second material, the first material including an organic electron transport compound and the second material including at least one selected from an alkali metal, an alkali metal alloy, an alkaline earth metal, an alkaline earth metal alloy, a lanthanide metal, and a lanthanide metal alloy.

In one embodiment, the forming of the n-type charge-generating layer includes forming the n-type charge-generating layer from a material for the n-type charge-generating layer including the first material and the second material or the first material and a precursor of the second material, and the material for the n-type charge-generating layer may include at least one selected from a Bi—Li alloy, a Bi—Na alloy, Tb, Ho, and Dy.

In one embodiment, the precursor of the second material may be the same as the second material, or may be different from the second material while including the second material.

In one or more embodiments, in the forming of the n-type charge-generating layer, the n-type charge-generating layer may be formed from a material for the n-type charge-generating layer including the first material and a Bi—Li alloy or a Bi—Na alloy, wherein the formed n-type charge-generating layer may include the first material and Li or Na.

In one or more embodiments, in the forming of the n-type charge-generating layer, the n-type charge-generating layer may be formed from a material for the n-type charge-generating layer including the first material and a Bi—Li alloy or a Bi—Na alloy, wherein the formed n-type charge-generating layer may include a Bi—Li alloy or a Bi—Na alloy.

When the n-type charge-generating layer is configured to include an alkali metal, the alkali metal may be easily oxidized during processing and have an increased melting point, and thus a process temperature may be increased. In this regard, when an alloy of an alkali metal and bismuth is used as a second material or a precursor of a second material as described above, the n-type charge-generating layer may be stably configured, and the melting point may decrease, which is advantageous during processing.

The layers included in the emission unit and the layers included in the charge-generating unit may each be formed in a set or predetermined region using one or more suitable methods selected from vacuum deposition, spin coating, casting, Langmuir-Blodgett (LB) deposition, ink-jet printing, laser-printing, and laser-induced thermal imaging.

When the layers included in the emission unit and the layers included in the charge-generating unit are formed by vacuum deposition, the deposition may be performed at a deposition temperature of about 100 Å to about 500 Å, a vacuum degree of about $10^{-8}$ torr to about $10^{-3}$ torr, and a deposition speed of about 0.01 Å/sec to about 100 Å/sec, depending on the material to be included and the structure of the layer to be formed.

When the layers included in the emission unit and the layers included in the charge-generating unit are formed by spin coating, the spin coating may be performed at a coating speed of about 2,000 rpm to about 5,000 rpm and at a heat treatment temperature of about 80° C. to 200° C. depending on the material to be included and the structure of the layer to be formed.

General Definition of Substituents

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and non-limiting examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein Ani is a $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms, at least one carbon-carbon double bond in the ring thereof, and no aromaticity, and non-limiting examples thereof include a cyclopentenyl group, a cyclohexenyl group, and a cycloheptenyl group. The term "$C_3$-cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be condensed with each other.

The term "$C_6$-$C_{60}$ aryloxy group" as used herein refers to —$OA_{102}$ (wherein $A_{102}$ is a $C_6$-$C_{60}$ aryl group), and the term "$C_6$-$C_{60}$ arylthio group" as used herein refers to —$SA_{103}$ (wherein $A_{103}$ is a $C_6$-$C_{60}$ aryl group).

The term "$C_1$-$C_{60}$ heteroaryloxy group" as used herein refers to —$OA_{104}$ (wherein $A_{104}$ is a $C_1$-$C_{60}$ heteroaryl group), and the term "$C_1$-$C_{60}$ heteroarylthio group" as used herein refers to —$SA_{105}$ (wherein $A_{105}$ is a $C_1$-$C_{60}$ heteroaryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and non-aromaticity in its entire molecular structure. A non-limiting example of the monovalent non-aromatic condensed polycyclic group is a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed with each other, at least one heteroatom selected from N, O, Si, P, and S as a ring-forming atom, and non-aromaticity in its entire molecular structure. A non-limiting example of the monovalent non-aromatic condensed heteropolycyclic group is a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having substantially the same structure as the $C_5$-$C_{60}$ carbocyclic group, except that at least one heteroatom selected from N, O, Si, P, and S is used as a ring-forming atom in addition to carbon (the number of carbon atoms may be 1 to 60).

At least one substituent selected from the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium (-D), —F, —Br, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, and the term "OMe" as used herein refers to a methoxy group.

The term "biphenyl group" as used herein may refer to "a phenyl group substituted with a phenyl group". In other words, a "biphenyl group" may be a substituted phenyl group having a $C_6$-$C_{60}$ aryl group as a substituent.

The term "terphenyl group" as used herein may refer to "a phenyl group substituted with a biphenyl group". In other words, a "terphenyl group" is a phenyl group having, as a substituent, a $C_6$-$C_{60}$ aryl group substituted with a $C_6$-$C_{60}$ aryl group.

* and *' used herein, unless defined otherwise, each refer to a binding site to a neighboring atom in a corresponding formula.

Hereinafter, a light-emitting device according to embodiments will be described in more detail with reference to Examples.

EXAMPLES

Evaluation Example 1: Measurement of Bonding Energy

Bonding energies between the inorganic materials described in Table 1 and Compound N1 were calculated by molecular simulation, and the results are shown in Table 1.

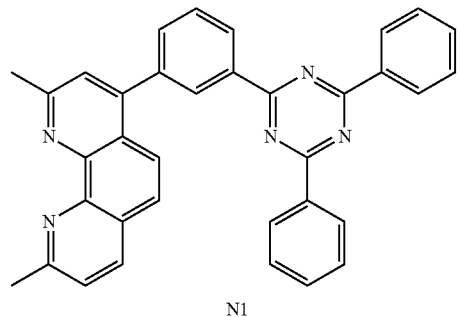

N1

TABLE 1

| Inorganic material | Bonding energy (eV) |
|---|---|
| Bi—Li | 2.24 |
| Li | 2.24 |
| Na | 1.27 |
| K | 1.24 |
| Tb | 2.55 |
| Dy | 1.28 |
| Ho | 1.75 |
| Yb | 0.42 |
| Sm | 0.44 |
| Eu | 0.75 |
| La | 1.24 |
| Ce | 1.22 |

Example 1

A 15 Ω/cm$^2$ (1,200 Å) ITO/Ag/ITO glass substrate (a product of Corning Inc.) was cut to a size of 50 mm×50 mm×0.7 mm, sonicated with isopropyl alcohol and pure water for 5 minutes each, and then cleaned by exposure to ultraviolet rays and ozone for 30 minutes. The resultant glass substrate was loaded onto a vacuum deposition apparatus.

HT3 was deposited on the ITO/Ag/ITO anode of the glass substrate to a thickness of 1.7 nm, HT3 and CuI were co-deposited at a volume ratio of 97:3 thereon to form a hole injection layer having a thickness of 10 nm, HT3 was deposited on the hole injection layer to form a first hole transport layer having a thickness of 24 nm, TCTA was deposited on the first hole transport layer to form a second hole transport layer having a thickness of 5 nm, H18 and FD23 were co-deposited at a volume ratio of 98:2 on the second hole transport layer to form an emission layer having a thickness of 17 nm, T2T was deposited on the emission layer to form a first electron transport layer having a thickness of 5 nm, and TPM-TAZ and LiQ were co-deposited at a volume ratio of 1:1 on the first electron transport layer to form a second electron transport layer having a thickness of 25 nm, thereby completing the formation of a first emission unit.

Compound N1 and Bi—Li were co-deposited at a volume ratio of 98:2 on the first emission unit to form an n-type charge-generating layer having a thickness of 10 nm, HT3 and NDP-9 were co-deposited at a volume ratio of 90:10 on the n-type charge-generating layer to form a p-type interlayer having a thickness of 10 nm, and HT3 and CuI were co-deposited at a volume ratio of 90:10 on the p-type interlayer to form a p-type charge-generating layer having a thickness of 10 nm, thereby completing the formation of a first charge-generating unit.

HT3 was deposited on the first charge-generating unit to form a first hole transport layer having a thickness of 54 nm, TCTA was deposited on the first hole transport layer to form a second hole transport layer having a thickness of 5 nm, H18 and FD23 were co-deposited at a volume ratio of 98:2 on the second hole transport layer to form an emission layer having a thickness of 17 nm, T2T was deposited on the emission layer to form a first electron transport layer having a thickness of 5 nm, and TPM-TAZ and LiQ were co-deposited at a volume ratio of 1:1 on the first electron transport layer to form a second electron transport layer having a thickness of 25 nm, thereby completing the formation of a second emission unit.

Compound N1 and Bi—Li were co-deposited at a volume ratio of 98:2 on the second emission unit to form an n-type charge-generating layer having a thickness of 10 nm, HT3 and NDP-9 were co-deposited at a volume ratio of 90:10 on the n-type charge-generating layer to form a p-type interlayer having a thickness of 10 nm, and HT3 and CuI were co-deposited at a volume ratio of 90:10 on the p-type interlayer to form a p-type charge-generating layer having a thickness of 10 nm, thereby completing the formation of a second charge-generating unit.

HT3 was deposited on the second charge-generating unit to form a first hole transport layer having a thickness of 44.5 nm, TCTA was deposited on the first hole transport layer to form a second hole transport layer having a thickness of 5 nm, H18 and FD23 were co-deposited at a volume ratio of 98:2 on the second hole transport layer to form an emission layer having a thickness of 17 nm, T2T was deposited on the emission layer to form a first electron transport layer having a thickness of 5 nm, TPM-TAZ and LiQ were co-deposited at a volume ratio of 1:1 on the first electron transport layer to form a second electron transport layer having a thickness of 35 nm, and KI and Yb were co-deposited at a volume ratio of 95:5 on the second electron transport layer to form an electron injection layer having a thickness of 1.1 nm, thereby completing the formation of a third emission unit.

Ag and Mg were co-deposited at a volume ratio of 9:1 on the third emission unit to form a cathode having a thickness of 14 nm, thereby completing the manufacture of a tandem light-emitting device.

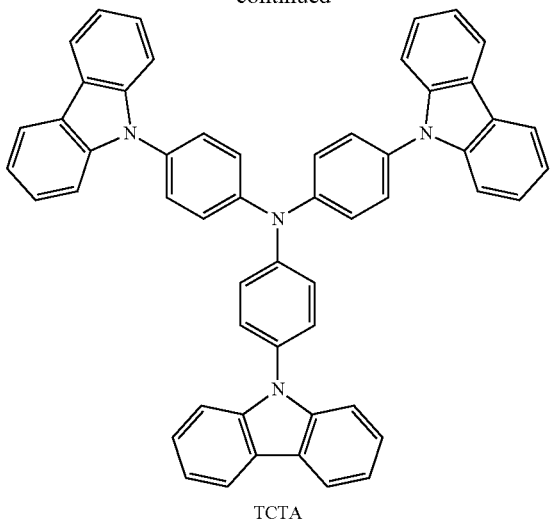

TCTA

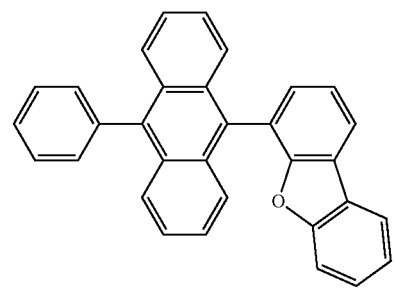

H18

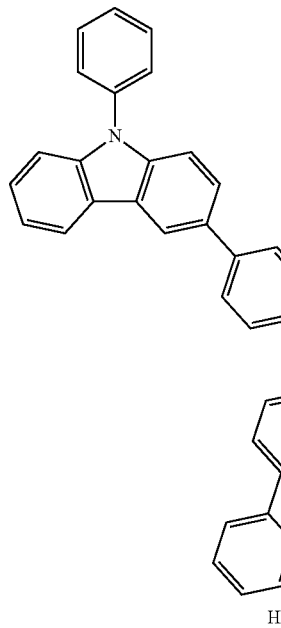

HT3

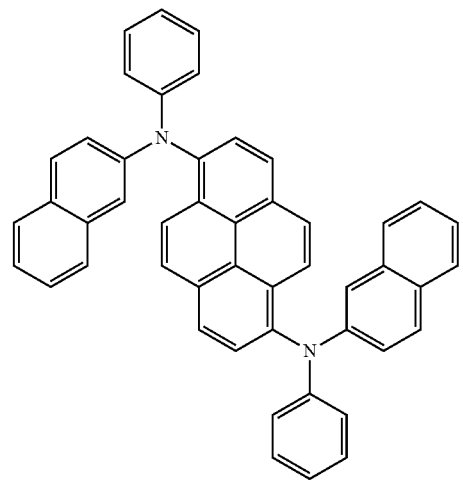

FD23

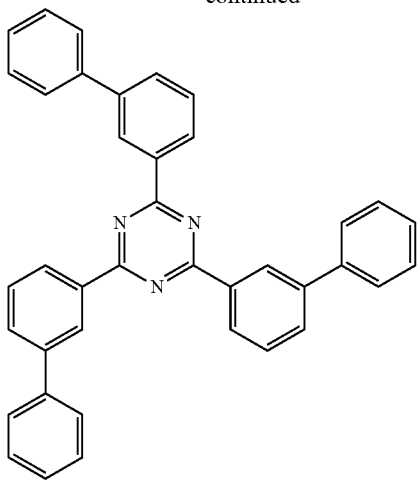

T2T

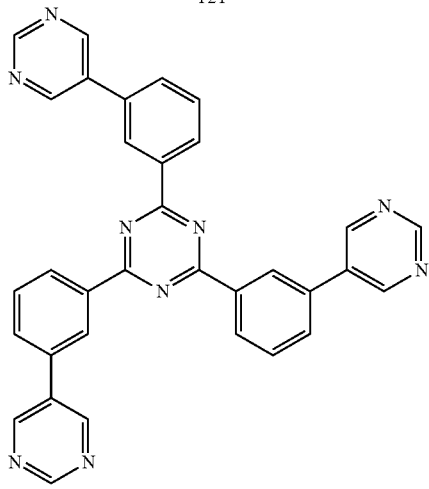

TPM-TAZ

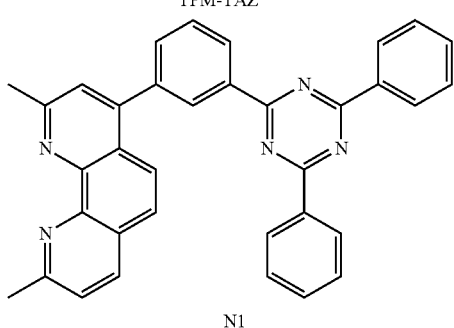

N1

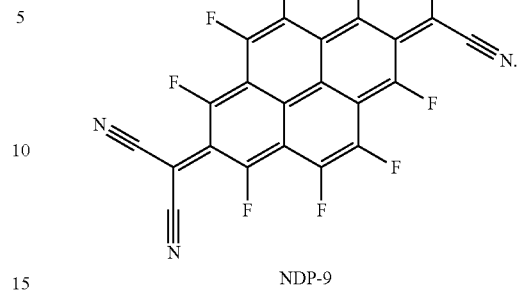

NDP-9

Example 2

A light-emitting device was manufactured using substantially the same method as Example 1, except that BiI$_3$ was used instead of NDP-9 to form a p-type interlayer.

Example 3

A light-emitting device was manufactured using substantially the same method as Example 1, except that Bi$_2$Te$_3$ was used instead of NDP-9 to form a p-type interlayer.

Comparative Example 1

A light-emitting device was manufactured using substantially the same method as Example 1, except that Yb was used instead of Li to form a p-type charge-generating layer.

Evaluation Example 2

The driving voltage, change in driving voltage, current density, lifespan, and CIE color coordinate of the light-emitting devices manufactured according to Examples 1 to 3 and Comparative Example 1 were measured using a Keithley SMU 236 and a luminance meter PR650, and the results are shown in Table 2. The lifespan (T97) is the period of time taken for the luminance (@ 400 nit) to be reduced to 97% of the initial luminance (set to 100%) after a light-emitting device was driven. The change in the driving voltage is a difference between the initial driving voltage and the driving voltage measured after 1000 hours of driving the light-emitting device.

TABLE 2

| | Charge-generating unit | | | Driving voltage (V) | Increase rate (V) of driving voltage | Current efficiency (cd/A) | Double-speed lifespan (T$_{97}$) (hr) | Color coordinate (y) |
|---|---|---|---|---|---|---|---|---|
| | pCGL | pIL | nCGL | | | | | |
| Example 1 | HT3 + CuI | HT3 + NDP-9 | Li | 10.2 | 0.3 | 29.1 | 640 | 0.125 |
| Example 2 | HT3 + CuI | HT3 + BiI$_3$ | Li | 10.0 | 0.2 | 32.2 | 950 | 0.128 |
| Example 3 | HT3 + CuI | HT3 + Bi$_2$Te$_3$ | Li | 10.1 | 0.3 | 31.0 | 900 | 0.127 |

TABLE 2-continued

| | Charge-generating unit | | | Driving voltage (V) | Increase rate (V) of driving voltage | Current efficiency (cd/A) | Double-speed lifespan ($T_{97}$) (hr) | Color coordinate (y) |
|---|---|---|---|---|---|---|---|---|
| | pCGL | pIL | nCGL | | | | | |
| Comparative Example 1 | HT3 + CuI | HT3 + NDP-9 | Yb | 10.5 | 0.7 | 28.3 | 620 | 0.129 |

Referring to Table 2, each of the light-emitting devices manufactured according to Examples 1 to 3 has a lower driving voltage and a lower driving voltage increase rate, compared to the light-emitting device manufactured according to Comparative Example 1, and may have significantly improved lifespan.

The light-emitting device has an optimized or improved hole and electron balance, such that its driving voltage is low, and its efficiency and lifespan characteristics may be excellent.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as being available for other similar features or aspects in other embodiments.

While one or more embodiments have been described with reference to the drawings, it will be understood by those of ordinary skill in the art that various changes in form and details may be made therein without departing from the spirit and scope of the disclosure as defined by the following claims and equivalents thereof.

What is claimed is:

1. A light-emitting device comprising:
a first electrode;
a second electrode facing the first electrode;
m emission units between the first electrode and the second electrode; and
m−1 charge-generating units between adjacent ones of the emission units,
wherein m is a natural number of 2 or more;
the emission units each comprise an emission layer;
at least one of the charge-generating unit(s) comprises an n-type charge-generating layer and a p-type charge-generating layer;
the n-type charge-generating layer comprises a first material and a second material;
the first material comprises an organic electron transport compound; and
the second material comprises an alloy of an alkali metal and bismuth.

2. The light-emitting device of claim 1, wherein the first material has a volume greater than or equal to that of the second material.

3. The light-emitting device of claim 1, wherein the first material comprises an organic electron transport compound, and a volume ratio of the first material to the second material is about 99.9:0.1 to about 80:20.

4. The light-emitting device of claim 1, wherein a bonding energy between the first material and the second material is 1.2 eV or more.

5. The light-emitting device of claim 1, wherein the first material comprises a phenanthroline-containing compound.

6. A light-emitting device comprising:
a first electrode;
a second electrode facing the first electrode;
m emission units between the first electrode and the second electrode; and
m−1 charge-generating units between adjacent ones of the emission units,
wherein m is a natural number of 2 or more;
the emission units each comprise an emission layer;
at least one of the charge-generating unit(s) comprises an n-type charge-generating layer, a p-type charge-generating layer, and a p-type interlayer between the n-type charge-generating layer and the p-type charge-generating layer,
wherein the n-type charge-generating layer comprises a first material and a second material;
the first material comprises an organic electron transport compound; and
the second material comprises at least one selected from an alkali metal, an alkali metal alloy, an alkaline earth metal, an alkaline earth metal alloy, a lanthanide metal, and a lanthanide metal alloy, and
wherein the p-type interlayer comprises a third material and a fourth material,
the third material comprises an organic hole transport compound, an inorganic insulation compound, or any combination thereof; and
the fourth material comprise at least one compound selected from an organic semiconductor compound, an inorganic semiconductor compound, and an inorganic insulation compound.

7. The light-emitting device of claim 6, wherein the second material is terbium (Tb), holmium (Ho), or dysprosium (Dy).

8. The light-emitting device of claim 1, wherein the p-type charge-generating layer comprises a third material and a fifth material, the third material comprises an organic hole transport compound, an inorganic insulation compound, or any combination thereof, and the fifth material comprises at least one compound selected from inorganic semiconductor compounds.

9. The light-emitting device of claim 1, wherein:
the first electrode is an anode;
the second electrode is a cathode; and
an $m^{th}$ emission unit is between the first electrode and the second electrode;
an $m-1^{th}$ emission unit is between the first electrode and the $m^{th}$ emission unit; and
an $m-1^{th}$ charge-generating unit is between the $m^{th}$ emission unit and the $m-1^{th}$ emission unit,
wherein the $m^{th}$ emission unit comprises an $m^{th}$ emission layer;
the $m-1^{th}$ emission unit comprises an $m-1^{th}$ emission layer;
an $m-1^{th}$ hole transport region is further located between the first electrode and the $m-1^{th}$ emission layer;
an $m-1^{th}$ electron transport region is further located between the $m-1^{th}$ emission layer and the $m-1^{th}$ charge-generating unit;
an $m^{th}$ hole transport region is further located between the $m-1^{th}$ charge-generating unit and the $m^{th}$ emission layer;
an $m^{th}$ electron transport region is further located between the $m^{th}$ emission layer and the second electrode;
the $m-1^{th}$ hole transport region comprises an $m-1^{th}$ hole injection layer, an $m-1$th hole transport layer, an $m-1^{th}$ electron blocking layer, or any combination thereof;
the $m-1^{th}$ electron transport region comprises an $m-1^{th}$ hole blocking layer, an $m-1^{th}$ electron transport layer, an $m-1^{th}$ electron injection layer, or any combination thereof;
the $m^{th}$ hole transport region comprises an $m^{th}$ hole injection layer, an $m^{th}$ hole transport layer, an $m^{th}$ electron blocking layer, or any combination thereof; and
the $m^{th}$ electron transport region comprises an $m^{th}$ hole blocking layer, an $m^{th}$ electron transport layer, an $m^{th}$ electron injection layer, or any combination thereof.

10. The light-emitting device of claim 9, wherein the $m^{th}$ hole transport layer is in direct contact with the $m^{th}$ emission layer;
the $m^{th}$ hole transport layer comprises a tenth material; and
the tenth material comprises at least one selected from organic hole transport compounds, or
the $m-1^{th}$ hole transport layer is in direct contact with the $m-1^{th}$ emission layer;
the $m-1^{th}$ hole transport layer comprises a tenth material; and
the tenth material comprises at least one selected from organic hole transport compounds.

11. The light-emitting device of claim 9, wherein the $m^{th}$ electron transport layer is in direct contact with the $m^{th}$ emission layer;
the $m^{th}$ electron transport layer further comprises a twelfth material; and
the twelfth material comprises at least one selected from organic electron transport compounds, or
the $m-1^{th}$ electron transport layer is in direct contact with the $m-1^{th}$ emission layer;
the $m-1^{th}$ electron transport layer further comprises a twelfth material; and
the twelfth material comprises at least one selected from organic electron transport compounds.

12. A method of manufacturing the light-emitting device of claim 1, the method comprising:
forming the n-type charge-generating layer comprising the first material and the second material.

13. The method of claim 12, wherein the forming of the n-type charge-generating layer comprises forming the n-type charge-generating layer from a material for the n-type charge-generating layer comprising the first material and the second material or the first material and a precursor of the second material,
wherein the material for the n-type charge-generating layer comprises at least one selected from a Bi—Li alloy and a Bi—Na alloy.

14. An apparatus comprising:
a thin-film transistor comprising a source electrode, a drain electrode, and an activation layer; and the light-emitting device of claim 1,
wherein the first electrode of the light-emitting device is electrically connected to one of the source electrode or the drain electrode of the thin-film transistor.

15. The apparatus of claim 14, further comprising a color filter,
wherein the color filter is positioned to intersect a path of light emission from the light-emitting device.

16. The light-emitting device of claim 6, wherein the second material is an alkali metal or an alkali metal alloy, and
the n-type charge-generating layer further comprises bismuth (Bi).

17. The light-emitting device of claim 6, wherein the fourth material comprises an inorganic semiconductor compound.

18. The light-emitting device of claim 6, wherein the fourth material comprises at least one compound selected from CuI, $BiI_3$, $BiCl_3$, $BiBr_3$, $BiF_3$, $Bi_2Te_3$, Te, or ZnTe.

19. A light-emitting device comprising:
a first electrode;
a second electrode facing the first electrode;
m emission units between the first electrode and the second electrode; and
m−1 charge-generating units between adjacent ones of the emission units,
wherein m is a natural number of 2 or more;
the emission units each comprise an emission layer;
at least one of the emission unit(s) comprises a hole injection layer and/or an electron injection layer,
at least one of the charge-generating unit(s) comprises an n-type charge-generating layer and a p-type charge-generating layer;
the n-type charge-generating layer comprises a first material and a second material;
the first material comprises an organic electron transport compound;
the second material comprises at least one selected from an alkali metal, an alkali metal alloy, an alkaline earth metal, an alkaline earth metal alloy, a lanthanide metal, and a lanthanide metal alloy,
the hole injection layer comprises a sixth material and a seventh material;
the sixth material and the seventh material are different from each other;
the sixth material comprises a lanthanide metal halide, a transition metal halide, a post-transition metal halide, tellurium, lanthanide metal telluride, a transition metal telluride, a post-transition metal telluride, a lanthanide metal selenide, a transition metal selenide, a post-transition metal selenide, or any combination thereof; and the seventh material comprises an organic hole transport compound, an alkali metal halide, an alkaline earth metal halide, a lanthanide metal halide, or any combination thereof; and the electron injection layer comprises an eighth material; and the eighth material comprises an alkali metal halide, an alkaline earth metal halide, a lanthanide metal halide, or any combination thereof.

20. The light-emitting device of claim 19, wherein the electron injection layer further comprises a ninth material;

the eighth material and the ninth material are different from each other; and the ninth material comprises an alkali metal, an alkaline earth metal, a lanthanide metal, or any combination thereof.

* * * * *